United States Patent
Lee et al.

(10) Patent No.: US 12,085,626 B2
(45) Date of Patent: Sep. 10, 2024

(54) BATTERY CELL DIAGNOSING APPARATUS AND METHOD

(71) Applicant: LG Energy Solution, Ltd., Seoul (KR)

(72) Inventors: Sun-Jong Lee, Daejeon (KR); Cheol-Taek Kim, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 0 days.

(21) Appl. No.: 18/371,156

(22) Filed: Sep. 21, 2023

(65) Prior Publication Data

US 2024/0027540 A1 Jan. 25, 2024

Related U.S. Application Data

(63) Continuation of application No. 18/200,158, filed on May 22, 2023.

(30) Foreign Application Priority Data

May 26, 2022 (KR) .................. 10-2022-0065020
May 26, 2022 (KR) .................. 10-2022-0065021
May 26, 2022 (KR) .................. 10-2022-0065022

(51) Int. Cl.
*G01R 31/396* (2019.01)
*G01R 31/371* (2019.01)
*G01R 31/3842* (2019.01)

(52) U.S. Cl.
CPC ......... *G01R 31/396* (2019.01); *G01R 31/371* (2019.01); *G01R 31/3842* (2019.01)

(58) Field of Classification Search
CPC ............................. G01R 31/00; G01R 31/396
USPC ......................................... 324/426, 433–435
See application file for complete search history.

(56) References Cited

U.S. PATENT DOCUMENTS

| | | | |
|---|---|---|---|
| 2009/0155674 A1 | 6/2009 | Ikeuchi et al. | |
| 2014/0184235 A1 | 7/2014 | Ikeuchi et al. | |
| 2016/0028254 A1 | 1/2016 | Honoki et al. | |
| 2016/0266210 A1* | 9/2016 | Kang ................ | G01R 31/396 |
| 2016/0294019 A1* | 10/2016 | Yamauchi ............ | H01M 10/48 |
| 2017/0003352 A1 | 1/2017 | Barre et al. | |
| 2018/0083461 A1 | 3/2018 | Ravi et al. | |

(Continued)

FOREIGN PATENT DOCUMENTS

| | | |
|---|---|---|
| EP | 4075564 A1 | 10/2022 |
| JP | 2017509103 A | 3/2017 |

(Continued)

OTHER PUBLICATIONS

International Search Report for Application No. PCT/KR2023/006935 dated Sep. 15, 2023, pp. 1-4.

*Primary Examiner* — Vincent Q Nguyen
(74) *Attorney, Agent, or Firm* — Lerner David LLP

(57) ABSTRACT

Disclosed is a battery cell diagnosing apparatus, which includes a current measuring unit configured to measure a current of a battery cell; a voltage sensing unit configured to sense a cell voltage of the battery cell; and a first control unit configured to transmit first information of the battery cell including data obtained from the current measuring unit and the voltage sensing unit to an external device, receive second information including diagnostic information of the battery cell obtained based on the first information from the external device, and diagnose an abnormal state of the battery cell based on the first information and the second information.

19 Claims, 36 Drawing Sheets

(56) References Cited

U.S. PATENT DOCUMENTS

| | | | |
|---|---|---|---|
| 2018/0226695 A1* | 8/2018 | Miyaki | H01M 4/505 |
| 2020/0099216 A1 | 3/2020 | Chen et al. | |
| 2020/0384884 A1 | 12/2020 | Namiki | |
| 2020/0412146 A1* | 12/2020 | Takechi | H02J 7/005 |
| 2021/0138929 A1 | 5/2021 | Kazuno et al. | |
| 2022/0209308 A1 | 6/2022 | Jeon et al. | |
| 2022/0268853 A1 | 8/2022 | Lee | |
| 2023/0153915 A1 | 5/2023 | Iida et al. | |

FOREIGN PATENT DOCUMENTS

| | | | |
|---|---|---|---|
| JP | 2017073370 A | 4/2017 | |
| JP | 6208213 B2 | 10/2017 | |
| JP | 2018073777 A | 5/2018 | |
| JP | 2020085653 A | 6/2020 | |
| JP | 2020190525 A | 11/2020 | |
| JP | 2020205253 A | 12/2020 | |
| JP | 2021078227 A | 5/2021 | |
| JP | 2021092464 A | 6/2021 | |
| JP | 2022021895 A | 2/2022 | |
| JP | 2022069436 A | 5/2022 | |
| KR | 20090066202 A | 6/2009 | |
| KR | 100911315 B1 | 8/2009 | |
| KR | 20190040303 A | 4/2019 | |
| KR | 20190141759 A | 12/2019 | |
| KR | 102246451 B1 | 4/2021 | |
| KR | 20210051450 A | 5/2021 | |
| KR | 20210095051 A | 7/2021 | |
| KR | 20220051858 A | 4/2022 | |
| KR | 20220057861 A | 5/2022 | |

* cited by examiner

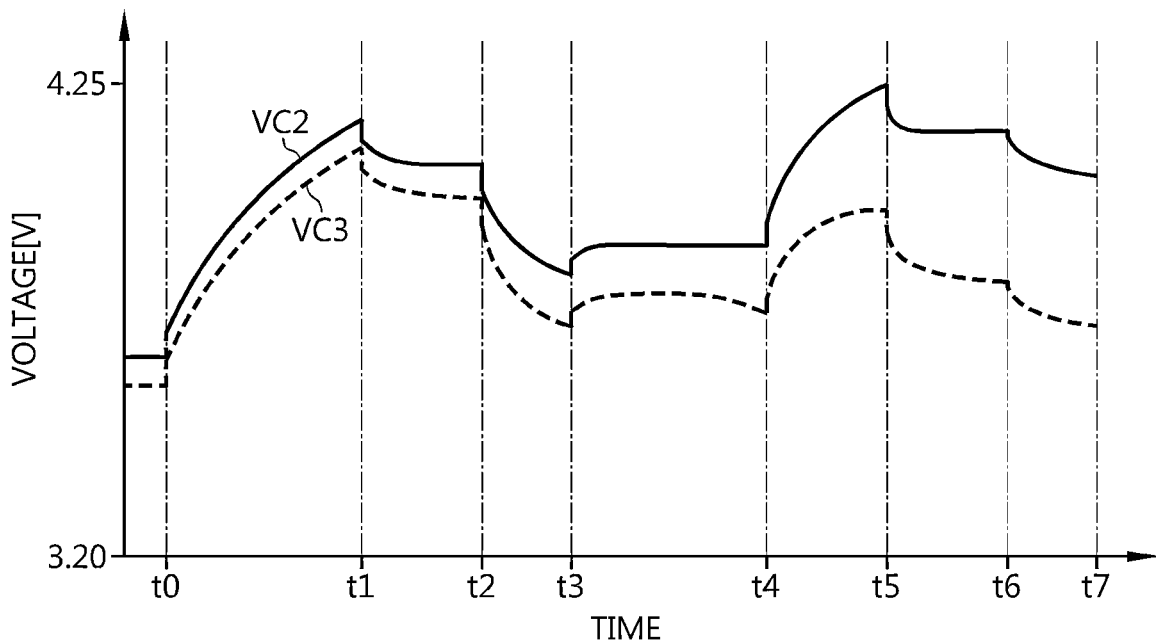
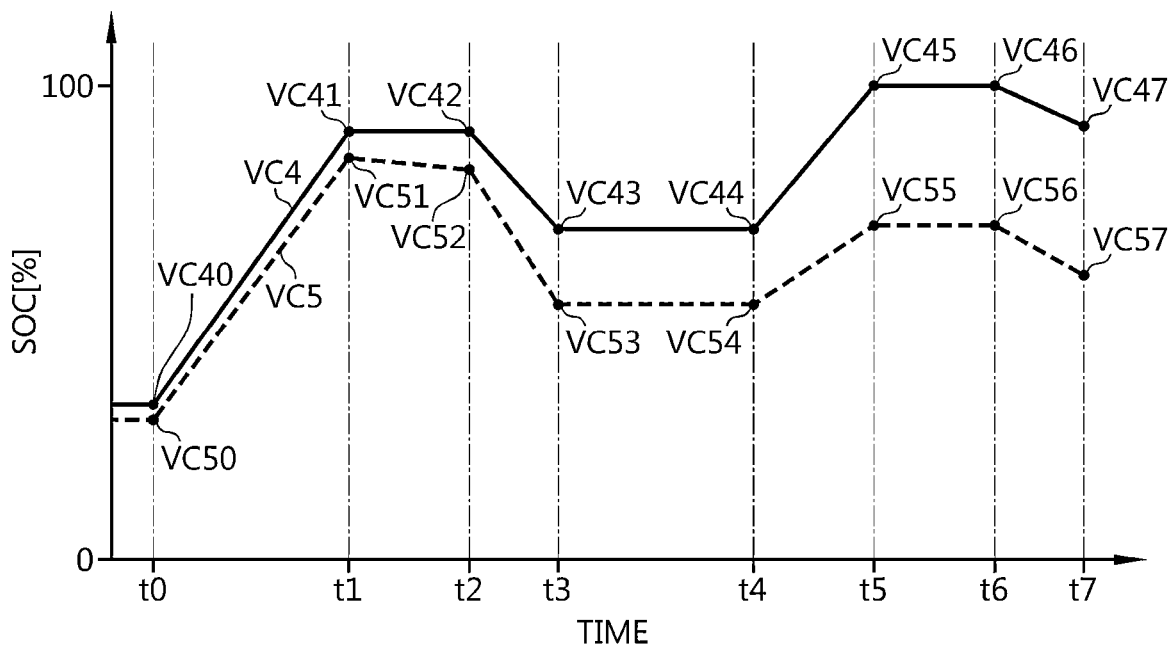

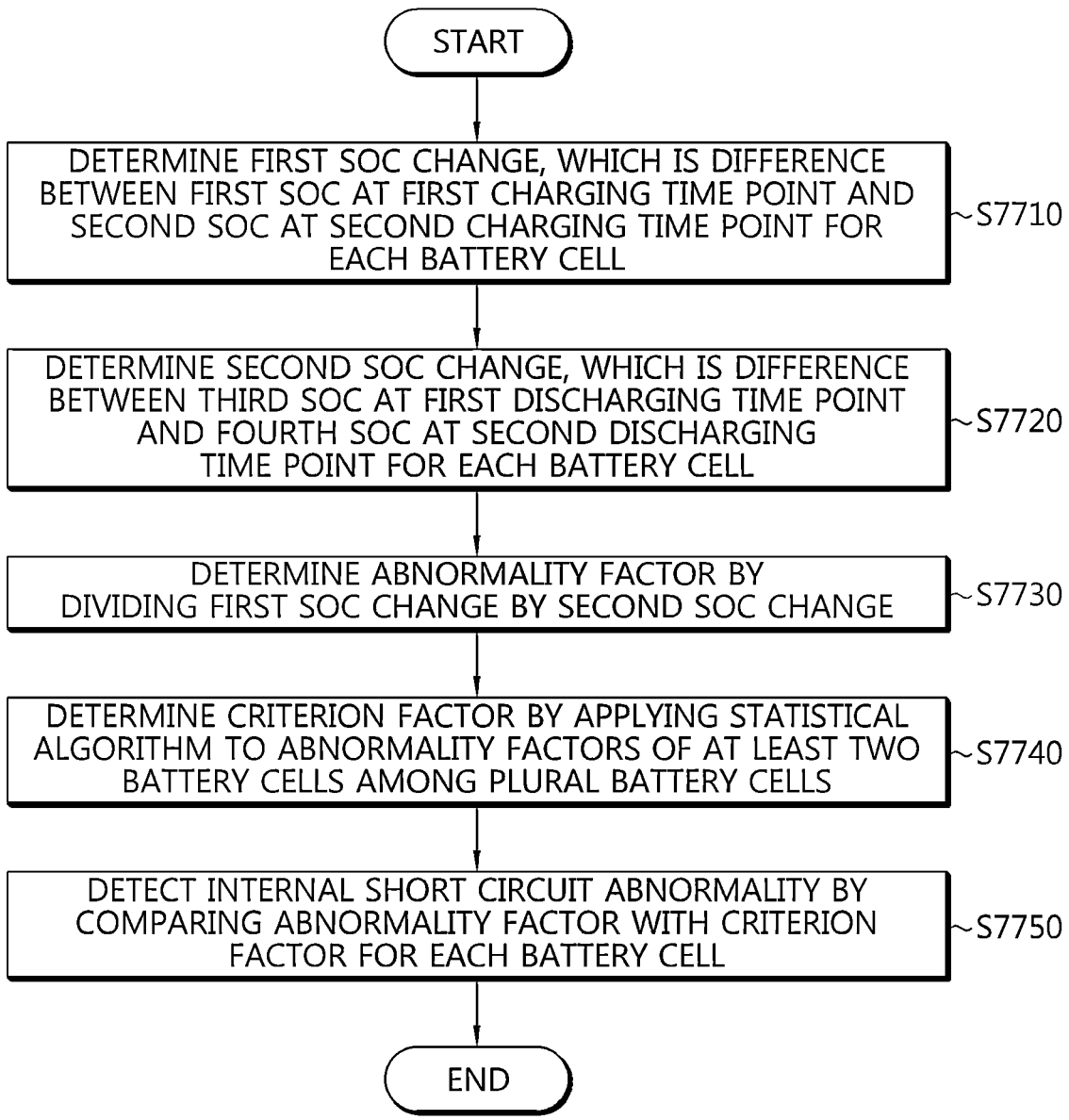

BATTERY CELL DIAGNOSING APPARATUS AND METHOD

CROSS-REFERENCE TO RELATED APPLICATIONS

The present application is a continuation of U.S. patent application Ser. No. 18/200,158 filed May 22, 2023, which is claims priority to Korean Patent Application Nos. 10-2022-0065020, 10-2022-0065021 and 10-2022-0065022 filed on May 26, 2022 in the Republic of Korea, the disclosures of which are incorporated herein by reference.

TECHNICAL FIELD

The present disclosure relates to a battery cell diagnosing apparatus and method, and more particularly, to a battery cell diagnosing apparatus and method for diagnosing a state of a battery cell.

BACKGROUND ART

Recently, there is dramatically growing demand for portable electronic products such as laptop computers, video cameras and mobile phones, and with the intense development of electric vehicles, accumulators for energy storage, robots and satellites, many studies are being made on high performance batteries that can be recharged repeatedly.

Currently, commercially available batteries include nickel-cadmium batteries, nickel-hydrogen batteries, nickel-zinc batteries, lithium batteries and the like, and among them, lithium batteries have little or no memory effect, and thus they are gaining more attention than nickel-based batteries for their advantages of free charging and discharging, a very low self-discharge rate and high energy density.

Recently, as applications requiring high voltage (e.g., an electric vehicle, an energy storage system) have become widespread, in some cases, a battery used in the electric vehicle or the energy storage system (ESS) ignites during use.

Accordingly, the need for a diagnostic technology for accurately detecting abnormalities of a plurality of battery cells connected in a battery pack is increasing.

DISCLOSURE

Technical Problem

The present disclosure is designed to solve the problems of the related art, and therefore the present disclosure is directed to providing an apparatus and method for efficiently diagnosing an abnormal state of a battery cell by linking an on-board diagnostic device and an off-board diagnostic device.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

A battery cell diagnosing apparatus according to an embodiment of the present disclosure comprises a current measuring unit configured to measure a current of a battery cell; a voltage sensing unit configured to sense a cell voltage of the battery cell; and a first control unit configured to transmit first information of the battery cell including data obtained from the current measuring unit and the voltage sensing unit to an external device, receive second information including diagnostic information of the battery cell obtained based on the first information from the external device, and diagnose an abnormal state of the battery cell based on the first information and the second information.

The diagnostic information of the battery cell may include at least one information among lithium precipitation diagnosis of the battery cell, abnormality of a parallel connection of the battery cell, and an internal short circuit of the battery cell.

The first control unit may be configured to display information about an abnormal state of the battery cell based on the diagnostic information of the battery cell included in the second information on a display unit.

The first control unit may be configured to: detect at least one of a voltage abnormality of the battery cell and a behavior abnormality of the battery cell based on the first information, and diagnose an abnormal state of the battery cell based on at least one of the voltage abnormality, the behavior abnormality, and the second information.

The first control unit may be configured to generate third information representing whether the battery cell is in the abnormal state based on at least one of the voltage abnormality, the behavior abnormality, and the second information.

The first control unit may be configured to display the third information on a display unit.

The first control unit may be configured to transmit the third information to a second control unit of a device equipped with the battery cell.

The first control unit may be configured to: generate time series data representing a history of the cell voltage included in the first information over time, determine a first average cell voltage and a second average cell voltage of each battery cell based on the time series data, the first average cell voltage being a short-term movement average, the second average cell voltage being a long-term movement average, and detect a voltage abnormality of the battery cell based on a difference between the first average cell voltage and the second average cell voltage.

The battery cell diagnosing apparatus may be configured to diagnose a plurality of battery cells.

The first control unit may be configured to: for each of the plurality of battery cells, determine a long-term and short-term average difference corresponding to the difference between the first average cell voltage and the second average cell voltage, determine an average value of the long-term and short-term average differences of the plurality of battery cells, for each of the plurality of battery cells, determine a cell diagnosis deviation corresponding to a deviation of the average value of the long-term and short-term average differences and the long-term and short-term average difference, and detect a battery cell that satisfies a condition in which the cell diagnosis deviation exceeds a diagnosis threshold as a voltage abnormal cell.

In another aspect of the present disclosure, the battery cell diagnosing apparatus may be configured to diagnose a plurality of battery cells.

The first control unit may be configured to: for each of the plurality of battery cells, determine a long-term and short-term average difference corresponding to the difference between the first average cell voltage and the second average cell voltage, determine an average value of the long-term and short-term average differences of the plurality of battery cells, for each of the plurality of battery cells, determine a cell diagnosis deviation corresponding to a deviation of the average value of the long-term and short-term average differences and the long-term and short-term average difference, determine a statistically variable threshold that depends on a standard deviation of the cell diagnosis deviations of the plurality of battery cells, filter the time series data based on the statistically variable threshold to generate filtered time series data; and detect a voltage abnormality of the battery cell based on the time or number of data of the filtered time series data exceeding a diagnosis threshold.

The first control unit may be configured to: for each of the plurality of battery cells, determine a long-term and short-term average difference corresponding to the difference between the first average cell voltage and the second average cell voltage, determine a normalization value corresponding to an average value of the long-term and short-term average differences of the plurality of battery cells, for each of the plurality of battery cells, normalize the long-term and short-term average difference according to the normalization value, determine a statistically variable threshold that depends on a standard deviation of the normalized cell diagnosis deviations of the plurality of battery cells, for each of the plurality of battery cells, filter the normalized long-term and short-term average difference of each battery cell based on the statistically variable threshold to generate filtered time series data; and detect a voltage abnormality of the battery cell based on the time or number of data of the filtered time series data exceeding a diagnosis threshold.

The first control unit may be configured to: determine a plurality of sub voltage curves by applying a moving window of a first time length to a time series of the cell voltage included in the first information, determine a long-term average voltage value of each sub voltage curve using a first average filter of the first time length, determine a short-term average voltage value of each sub voltage curve using a second average filter of a second time length shorter than the first time length, determine a voltage deviation corresponding to a difference between the long-term average voltage value and the short-term average voltage value of each sub voltage curve, and compare each of the plurality of voltage deviations determined for the plurality of sub voltage curves with at least one of a first threshold deviation and a second threshold deviation in order to detect the behavior abnormality of the battery cell.

The first control unit may be configured to detect the behavior abnormality corresponding to two voltage deviations that respectively satisfy a first condition, a second condition and a third condition among the plurality of voltage deviations.

The first condition may be satisfied when a first voltage deviation of the two voltage deviations is equal to or greater than the first threshold deviation.

The second condition may be satisfied when a second voltage deviation of the two voltage deviations is equal to or less than the second threshold deviation.

The third condition may be satisfied when a time interval between the two voltage deviations is equal to or less than a threshold time.

The second information may represent whether an accumulated capacity difference change amount is greater than or equal to a threshold value, and the accumulated capacity difference change amount is the sum of capacity difference change amounts.

Each of the capacity difference change amounts may be a difference between a capacity difference of a $k^{th}$ charging and discharging cycle of the battery cell and a capacity difference of a $k-1^{th}$ charging and discharging cycle of the battery cell, and the k may be a natural number greater than or equal to 2.

The capacity difference of each charging and discharging cycle may correspond to a difference between a charging capacity of the battery cell during a charging process of the charging and discharging cycle and a discharging capacity of the battery cell during a discharging process of the charging and discharging cycle.

Each of the charging capacity and the discharging capacity may be derivable from data obtained from the current measuring unit and included in the first information.

The second information may represent a capacity difference change amount between successive charging and discharging cycles of the battery cell.

A capacity difference for each charging and discharging cycle of the battery cell may be a difference between (i) a charging capacity of the battery cell during a charging process of the charging and discharging cycle of the battery cell and (ii) a discharging capacity of the battery cell during the discharging process of the charging and discharging cycle of the battery cell.

The second information may represent whether a parallel connection of a plurality of unit cells included in the battery cell is abnormal based on a result of monitoring a change over time of an estimated capacity value by the external device.

The estimated capacity value may represent a full charging capacity of the battery cell based on charging and discharging data.

The charging and discharging data may include a voltage time series representing the change over time of the voltage of the battery cell and a current time series representing the change over time of the charging and discharging current of the battery cell.

The second information may represent whether the battery cell has an internal short circuit based on a first SOC change and a criterion factor of the battery cell.

The criterion factor may be determined by applying a statistical algorithm to the first SOC change of at least two battery cells among a plurality of battery cells.

The first SOC change may be a difference between a first SOC at a first charging time point of each battery cell and a second SOC at a second charging time point.

The first SOC may be estimated by applying a SOC estimation algorithm to a state parameter of the battery cell at the first charging time point.

The second SOC may be estimated by applying the SOC estimation algorithm to the state parameter of the battery cell at the second charging time point.

The state parameter may be obtained based on the first information.

In another aspect of the present disclosure, there is also provided a battery cell diagnosing system, comprising the battery cell diagnosing apparatus according to an aspect of the present disclosure.

The external device may be configured to derive the second information based on at least a part of the first information.

In still another aspect of the present disclosure, there is also provided a battery cell diagnosing method, comprising: by a control unit, obtaining data including at least one of a charging current and a discharging current of a battery cell, and a cell voltage of the battery cell; by the control unit, transmitting first information of the battery cell including the obtained data to an external device; by the control unit, receiving second information including diagnostic information of the battery cell obtained based on the first information from the external device; and by the control unit, diagnosing an abnormal state of the battery cell based on the first information and the second information.

In still another aspect of the present disclosure, the battery cell diagnosing method may further comprise: by the control unit, detecting at least one of a voltage abnormality and a behavior abnormality of the battery cell based on the first information of the battery cell, and by the control unit, diagnosing an abnormal state of the battery cell based on at least one of the voltage abnormality of the battery cell, the behavior abnormality of the battery cell, and the second information.

Advantageous Effects

According to at least one of the embodiments of the present disclosure, an abnormal state of a battery cell can be efficiently diagnosed by linking an on-board device and an off-board device.

According to at least one of the embodiments of the present disclosure, software resources and time required for diagnosing an abnormality of each battery cell can be saved by linking the on-board device and the off-board device, and the possibility of a false diagnosis caused as the number of abnormal battery cells increases among a plurality of battery cells may decrease.

According to at least one of the embodiments of the present disclosure, both a long-term trend and a short-term trend of the cell voltage of each battery cell may be considered, so that an abnormal change of the corresponding battery cell may be precisely detected.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

FIG. 17 is another exemplary graph for comparing SOC changes of a battery cell according to the presence or absence of an internal short circuit abnormality referred to in various embodiments of the present disclosure.

FIG. 18 is still another exemplary graph for comparing SOC changes of a battery cell according to the presence or absence of an internal short circuit abnormality referred to in various embodiments of the present disclosure.

FIG. 37 is another flowchart exemplarily showing a battery management method according to an embodiment of the present disclosure.

BEST MODE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Figure 1:
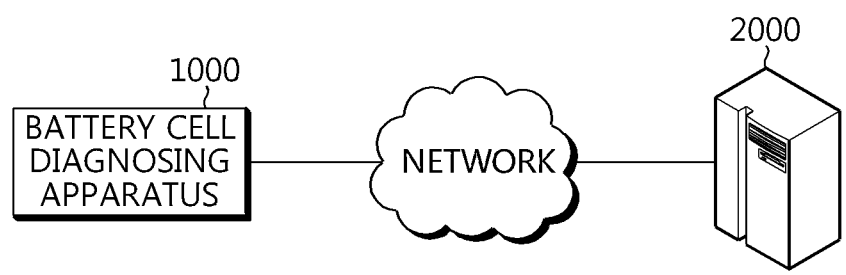
FIG. 1 is an exemplary diagram showing a system including a battery cell diagnosing apparatus according to an embodiment of the present disclosure.

FIG. 1 is an exemplary diagram showing a battery cell diagnosing system 1 including a battery cell diagnosing apparatus 1000.

Referring to FIG. 1, the battery cell diagnosing system 1 may be configured to include a battery cell diagnosing apparatus 1000 and an external device 2000. However, this is only a preferred embodiment for achieving the present disclosure, and some components may be added or deleted as needed. It should be noted that the components of the battery cell diagnosing system 1 shown in FIG. 1 represents functionally distinct functional elements, and a plurality of components may be implemented to be integrated with each other in an actual physical environment.

In the battery cell diagnosing system 1, the battery cell diagnosing apparatus 1000 is a computing device that diagnoses an abnormal state of a battery cell and provides a diagnosed result to a user. The battery cell diagnosing apparatus 1000 may refer to an on-board computing device included in the BMS (Battery Management System). For example, the battery cell diagnosing apparatus 1000 may be a computing device included in a BMS provided in a user's electric vehicle. This is an example, and the present disclosure is not limited thereto but may include all kinds of devices equipped with computing functions and communication functions.

The battery cell diagnosing apparatus 1000 may obtain data including at least one of a charging current and a discharging current of the battery cell, and a cell voltage that is a voltage across both ends of the battery cell. For example, the battery cell diagnosing apparatus 1000 may obtain data on at least one of a charging current and a discharging current of a battery cell provided in an electric vehicle, and a cell voltage that is a voltage across both ends of the battery cell.

According to an embodiment of the present disclosure, the battery cell diagnosing apparatus 1000 may generate first information of the battery cell. The first information may include data related to at least one of the charging current and the discharging current of the battery cell, and the cell voltage that is a voltage across both ends of the battery cell.

The battery cell diagnosing apparatus 1000 may transmit the first information to the external device 2000. The external device 2000 may receive the first information and derive second information about the battery cell based on at least a part of the received first information. The external device 2000 may transmit the second information to the battery cell diagnosing apparatus 1000. The battery cell diagnosing apparatus 1000 may diagnose an abnormal state of the battery cell based on the first information and the second information.

In the battery cell diagnosing system 1, the external device 2000 may mean an off-board computing device that provides the second information generated using the first information to the battery cell diagnosing apparatus 1000. To this end, the external device 2000 may receive information about voltage, current, or temperature of the battery cell from various electric vehicles, and store at least one algorithm capable of diagnosing the battery cell based on the received information. In addition, the external device 2000 may store the information about the voltage, current, or temperature of the battery cell received from various electric vehicles as big data, and store at least one artificial intelligence model capable of diagnosing the battery cell based on the big data. The computing device may be a notebook, a desktop, a laptop, etc., but is not limited thereto and may include any type of device equipped with a computing function and a communication function. However, if the second information is provided to a plurality of apparatuses 1000 for diagnosing a battery cell, the external device 2000 may be preferably implemented as a server computing device.

The components of the battery cell diagnosing system 1 may communicate through a network. Here, the network may be implemented as all types of wired/wireless networks such as local area network (LAN), wide area network (WAN), mobile radio communication network, Wibro (Wireless Broadband Internet), etc.

So far, the battery cell diagnosing system 1 according to an embodiment of the present disclosure has been described with reference to FIG. 1. Hereinafter, the battery cell diagnosing apparatus 1000 according to an embodiment of the present disclosure will be described in detail with reference to FIG. 2.

Figure 2:
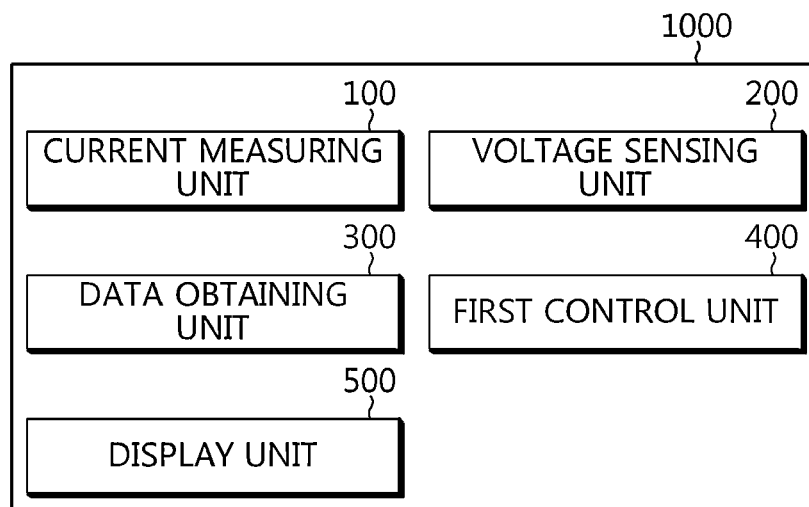
FIG. 2 is a block diagram schematically showing the functional configuration of the battery cell diagnosing apparatus according to an embodiment of the present disclosure.

FIG. 2 is a block diagram schematically showing the functional configuration of the battery cell diagnosing apparatus 1000 according to an embodiment of the present disclosure. Referring to FIG. 2, the battery cell diagnosing apparatus 1000 may include a current measuring unit 100, a voltage sensing unit 200, a data obtaining unit 300, a first control unit 400 and a display unit 500.

The current measuring unit 100 may measure a current of the battery cell. Here, the current may be at least one of a charging current and a discharging current of the battery cell.

Preferably, the current measuring unit 100 may measure the charging current while the battery cell is being charged. In addition, the current measuring unit 100 may measure the discharging current while the battery cell is being discharged.

The voltage sensing unit 200 may be configured to sense a cell voltage of the battery cell. For example, the voltage sensing unit 200 may sense a voltage signal representing a cell voltage that is a voltage across both ends of a battery cell. This will be described later in detail with reference to FIG. 3.

The data obtaining unit 300 may periodically obtain data from the current measuring unit 100 and the voltage sensing unit 200.

In an embodiment, the first control unit 400 may generate first information of the battery cell based on the data obtained by the data obtaining unit 300. For example, the first information may include current information about at least one of the charging current and the discharging current of the battery cell and voltage information about the cell voltage of the battery cell.

In another embodiment, the first control unit 400 may directly obtain current information about the battery cell from the current measuring unit 100 and directly obtain voltage information about the battery cell from the voltage sensing unit 200.

The first control unit 400 may be configured to transmit the generated first information to the external device 2000. Also, the first control unit 400 may receive second information including diagnostic information of the battery cell obtained based on the first information from the external device 2000.

Specifically, the second information is diagnostic information of the battery cell generated by the external device 2000 based on the first information. For example, the diagnostic information of the battery cell may include at least one information among a lithium precipitation diagnosis of the battery cell, a parallel connection abnormality of the battery cell, or an internal short circuit of the battery cell.

The first control unit 400 may be configured to diagnose an abnormal state of the battery cell based on the first information and the second information.

Specifically, the first control unit 400 may detect at least one of a voltage abnormality of the battery cell and a behavior abnormality of the battery cell based on the first information. Also, the first control unit 400 may be configured to diagnose an abnormal state of the battery cell based on at least one of the voltage abnormality, the behavior abnormality, and the second information. As such, the present disclosure is characterized in that the battery cell diagnosing apparatus 1000 and the external device 2000 diagnose different diagnostic items, rather than diagnosing the same diagnostic item. For example, the battery cell diagnosing apparatus 1000 may diagnose at least one of the voltage abnormality and the behavior abnormality of the battery cell, and the external device 2000 may diagnose the lithium precipitation of the battery cell, the parallel connection abnormality of the battery cell, and the internal short circuit of the battery cell.

The feature that the first control unit 400 detects a voltage abnormality or a behavior abnormality of the battery cell based on the first information will be described later.

The display unit 500 may include at least one display. The display unit 500 may display information about the abnormal state of the battery cell on the included display.

Here, the display unit 500 may be electrically connected to the first control unit 400 and may be included in a load device receiving power from a cell group CG. When the load device is an electric vehicle, a hybrid electric vehicle, a plug-in hybrid vehicle, or the like, the diagnosis result information may be output through an integrated information display of the vehicle.

For example, the first control unit 400 may be configured to display on the display unit 500 the information about an abnormal state of the battery cell based on the diagnostic information of the battery cell included in the second information.

As another example, the first control unit 400 may generate third information representing whether the battery cell is in an abnormal state based on at least one of the voltage abnormality, the behavior abnormality, and the second information. In addition, the first control unit 400 may display the third information using the display included in the display unit 500. By displaying the third information by the first control unit 400 using the display included in the display unit 500, the abnormality of the battery cell may be specifically provided to the user.

In addition, the first control unit 400 may transmit the third information to a second control unit of a device equipped with the battery cell.

Here, the second control unit may be configured to perform a function of controlling the device equipped with a battery cell. For example, the device equipped with a battery cell may be an electric vehicle. In this case, the second control unit may be an ECU (Electronic Control Unit) configured to control the electric vehicle. The first control unit 400 may transmit the third information to the second control unit of the electric vehicle equipped with the battery cell.

Figure 3:
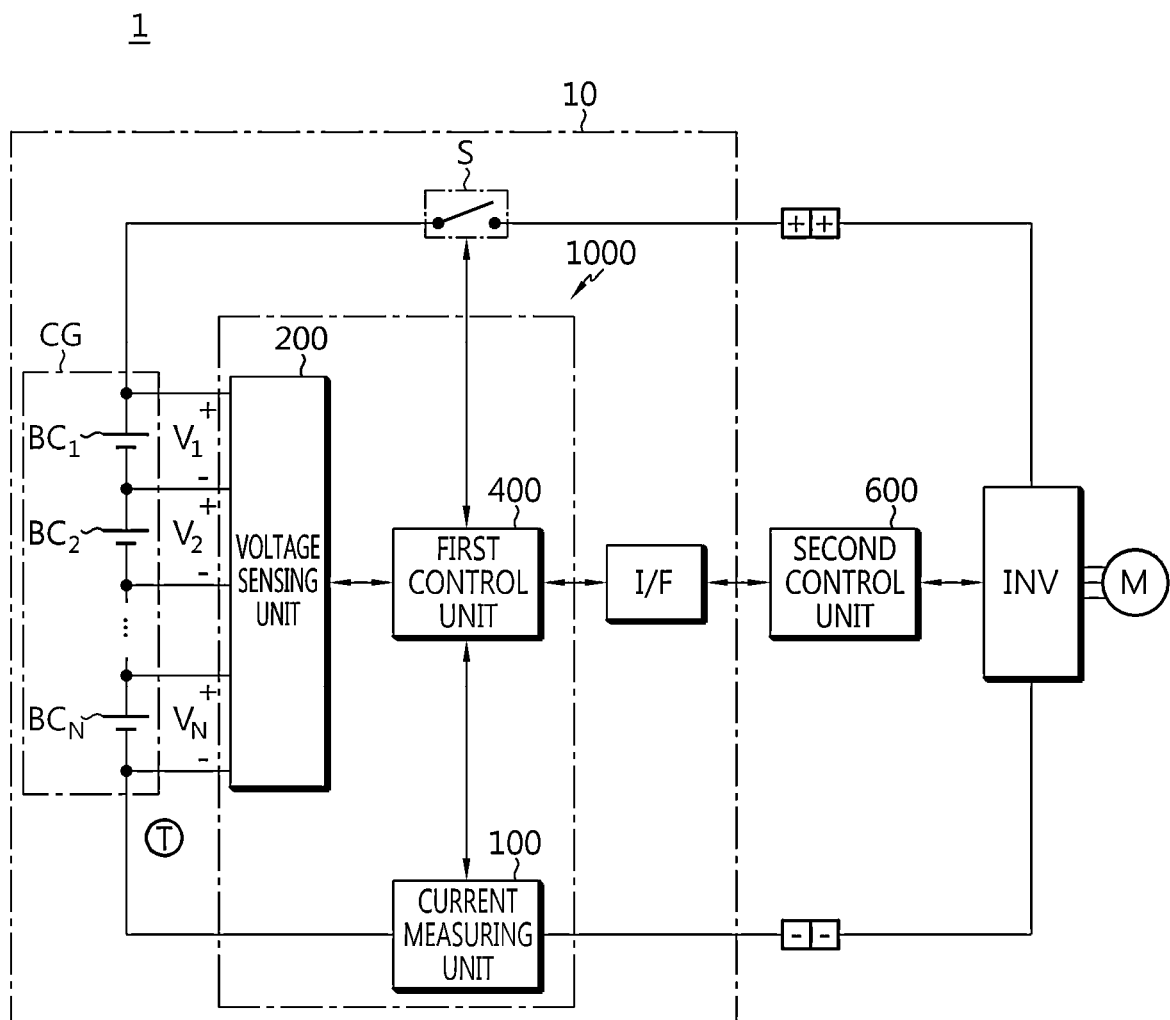
FIG. 3 is an exemplary diagram conceptually illustrating the configuration of an electric vehicle according to an embodiment of the present disclosure.

FIG. 3 is an exemplary diagram conceptually illustrating the configuration of an electric vehicle according to an embodiment of the present disclosure. Referring to FIG. 3, the electric vehicle includes a battery pack 10, an inverter INV, an electric motor M, and a second control unit 600.

The battery pack 10 may include a cell group CG, a switch S, and the battery cell diagnosing apparatus 1000.

The cell group CG may be coupled to the inverter INV through a pair of power terminals provided in the battery pack 10. The cell group CG includes a plurality of battery cells $BC_1$ to $BC_N$ connected in series (where N is a natural number equal to or greater than 2). The type of each battery cell $BC_i$ is not particularly limited as long as it can be recharged like a lithium-ion battery cell. i is an index for cell identification. i is a natural number from 1 to N.

The switch S is connected in series to the cell group CG. The switch S is installed on a current path for charging and discharging the cell group CG. The switch S is controlled to turn on/off in response to a switching signal from the battery cell diagnosing apparatus 1000. Preferably, the operating state of the switch S may be controlled by the first control unit 400 as a turn-on state or a turn-off state.

For example, the switch S may be a mechanical relay turned on/off by the magnetic force of the coil. As another example, the switch S may be a semiconductor switch such as a Field Effect Transistor (FET) or a Metal Oxide Semiconductor Field Effect Transistor (MOSFET).

The inverter INV is provided to convert a DC current from the cell group CG into an AC current in response to a command from the battery cell diagnosing apparatus 1000.

The electric motor M may be, for example, a three-phase AC motor. The electric motor M is driven using AC power from the inverter INV.

The battery cell diagnosing apparatus 1000 is provided to take charge of overall control related to charging and discharging of the cell group CG.

The battery cell diagnosing apparatus 1000 may further include at least one of a temperature sensor T and an interface unit I/F.

The voltage sensing unit 200 is connected to positive and negative electrodes of each of the plurality of battery cells $BC_1$ to $BC_N$ through a plurality of voltage sensing lines. The voltage sensing unit 200 is configured to measure a cell voltage across both ends of each battery cell $BC_i$ and generate a voltage signal representing the measured cell voltage.

The current measuring unit 100 is connected in series to the cell group CG through the current path. The current measuring unit 100 is configured to detect a battery current flowing through the cell group CG and generate a current signal representing the detected battery current (which may also be referred to as 'charging and discharging current'). Since the plurality of battery cells $BC_1$ to $BC_N$ are connected in series, the battery current flowing through any one of the plurality of battery cells $BC_1$ to $BC_N$ may be the same as the battery current flowing through the other battery cells. The current measuring unit 100 may be implemented using one or a combination of two or more of known current detection elements such as a shunt resistor and a Hall Effect element.

The temperature sensor T is configured to detect the temperature of the cell group CG and generate a temperature signal indicating the detected temperature. For example, the temperature sensor T may measure the temperature of the cell group CG or may individually measure the temperature of each battery cell $BC_i$ included in the cell group CG.

The first control unit 400 may be operatively coupled to the voltage sensing unit 200, the temperature sensor T, the current measuring unit 100, the interface unit I/F, and/or the switch S. The first control unit 400 may collect a sensing signal from the voltage sensing unit 200, the current measuring unit 100, and the temperature sensor T. The sensing signal refers to a voltage signal, a current signal, and/or a temperature signal synchronously detected.

The interface unit I/F may include a communication circuit configured to support wired communication or wireless communication between the first control unit 400 and the second control unit 600. For example, the wired communication may be CAN (Controller area network) and/or CAN-FD (Controller area network with flexible data rate) communication, and the wireless communication may be ZigBee or Bluetooth communication. Of course, as long as wired/wireless communication between the first control unit 400 and the second control unit 600 is supported, the type of communication protocol is not particularly limited.

The interface unit I/F may be coupled with an output device (e.g., a display, a speaker) that provides the information received from the second control unit 600 and/or the first control unit 400 in a user-recognizable form.

The second control unit 600 may control the inverter INV based on the battery information (e.g., voltage, current, temperature, SOC) collected through communication with the battery cell diagnosing apparatus 1000.

When the switch S is turned on while an electric load and/or a charger is operating, the battery cells $BC_1$ to $BC_N$ included in the battery pack 10 may be charged or discharged. When the switch S is turned off while the battery cells $BC_1$ to $BC_N$ are charging or discharging, the battery cells $BC_1$ to $BC_N$ may be switched to an idle state.

The first control unit 400 may turn on the switch S in response to a key-on signal. The first control unit 400 may turn off the switch S in response to a key-off signal. The key-on signal is a signal that requests transition from an idle state to a charging or discharging state. The key-off signal is a signal that requests transition from a charging or discharging state to an idle state. Alternatively, the on/off control of the switch S may be performed by the second control unit 600 instead of the first control unit 400.

In FIG. 3, the battery cell diagnosing apparatus 1000 is illustrated as being included in the battery pack 10 for an electric vehicle, but this should be understood as an example. For example, the battery cell diagnosing apparatus 1000 may be included in a test system used to select a behavior abnormal battery cell in a manufacturing process of the battery cell $BC_1$ to $BC_N$. As another example, the battery cell diagnosing apparatus 1000 may also be included in an energy storage system (ESS) including battery cells $BC_1$ to $BC_N$.

The first control unit 400 may detect voltage abnormality and behavior abnormality of the battery cell by using the first information. First, a method in which the first control unit 400 detects voltage abnormality of a battery cell using the first information will be described in detail with reference to FIG. 4.

FIGS. 4a to 4h are graphs exemplarily illustrating a process of detecting a voltage abnormality of each battery cell from time series data representing a change in cell voltage of each of the plurality of battery cells $BC_1$ to $BC_N$ illustrated in FIG. 3.

Figure 4A:
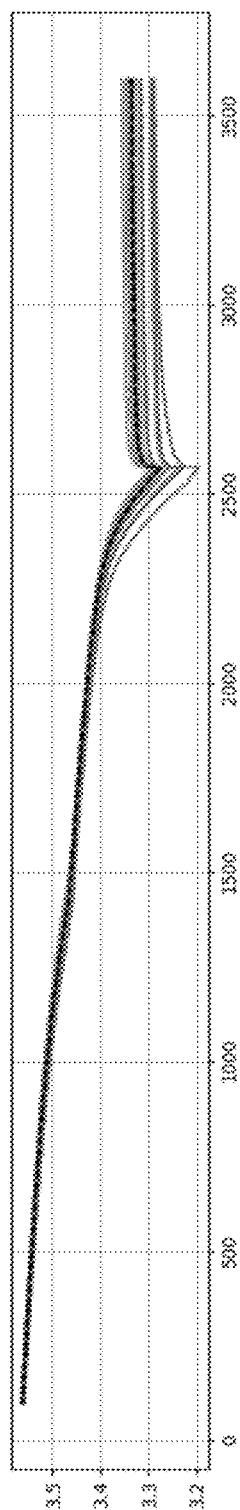
FIGS. 4a to 4h are graphs exemplarily illustrating a process of detecting a voltage abnormality of each battery cell from time series data representing a change in cell voltage of each of the plurality of battery cells illustrated in FIG. 3.

FIG. 4a shows a voltage curve of each of the plurality of battery cells $BC_1$ to $BC_N$. The number of battery cells shown in FIG. 4a is 14. The first control unit 400 collects the voltage signal from the voltage sensing unit 200 every unit time, and records the voltage value of the cell voltage of each battery cell $BC_i$ in the first information. The unit time may be an integer multiple of the voltage measurement period of the voltage sensing unit 200.

The first control unit 400 may be configured to generate time series data representing a history over time of the cell voltage included in the first information.

Specifically, the first control unit 400 may generate cell voltage time series data representing a history of the cell voltage of each battery cell over time based on the voltage value of the cell voltage of each battery cell $BC_i$ included in the first information. Whenever each time cell voltage is measured, the number of cell voltage time series data increases by 1.

The plurality of voltage curves shown in FIG. 4a are one-to-one related to the plurality of battery cells $BC_1$ to $BC_N$. Therefore, each voltage curve represents the change history of the cell voltage of any one battery cell BC associated therewith.

The first control unit 400 may be configured to determine a first average cell voltage and a second average cell voltage of each battery cell based on the time series data. Here, the first average cell voltage may be a short-term moving average, and the second average cell voltage may be a long-term moving average.

Specifically, the first control unit 400 may determine a moving average of each of the plurality of battery cells $BC_1$ to $BC_N$ for each unit time by using one moving window or two moving windows. When using two moving windows, the time length for one moving window is different from the time length for the other moving window.

Here, the time length of each moving window is an integer multiple of the unit time, an end point of each moving window is the current time point, and a start point of each moving window is a point ahead of the current time point by a predetermined time length.

Hereinafter, for convenience of description, among the two moving windows, one associated with a shorter time length will be referred to as a first moving window, and one associated with a longer time length will be referred to as a second moving window.

The first control unit 400 may diagnose the voltage abnormality of each battery cell $BC_i$ using only the first moving window or using both the first moving window and the second moving window.

The first control unit 400 may compare the short-term and long-term change trends of the cell voltage of the $i^{th}$ battery cell $BC_i$ based on the cell voltage of the $i^{th}$ battery cell $BC_i$ collected for each unit time.

The first control unit 400 may determine the first average cell voltage, which is a moving average of the $i^{th}$ battery cell $BC_i$ by the first moving window, for each unit time by using Equation 1 or Equation 2 below. That is, the first control unit 400 may determine the first average cell voltage of each battery cell using the first moving window.

Equation 1 is a moving average calculation formula using an arithmetic average method, and Equation 2 is a moving average calculation formula using a weighted average method.

$$SMA_i[k] = \frac{\sum_{j=1}^{S} V_i[k - S + j]}{S} \qquad <\text{Equation 1}>$$

$$SMA_i[k] = \frac{SMA_i[k-1] \times (S-1)}{S} + \frac{V_i[k]}{S} \qquad <\text{Equation 2}>$$

In Equation 1 and Equation 2, k is a time index indicating the current time point, $SMA_i[k]$ is the first average cell voltage of the $i^{th}$ battery cell $BC_i$ at the present time, S is the time length of the first moving window divided by the unit time, and $V_i[k]$ is the cell voltage of the $i^{th}$ battery cell $BC_i$ at the current time point. For example, if the unit time is 1 second and the time length of the first moving window is 10 seconds, S is 10. When x is a natural number less than or equal to k, $V_i[k-x]$ and $SMA_i[k-x]$ represent the cell voltage of the $i^{th}$ battery cell $BC_i$ and the first average cell voltage when the time index is k−x, respectively. For reference, the first control unit 400 may be set to increase the time index by 1 for each unit time.

The first control unit 400 may determine the second average cell voltage, which is a moving average of the $i^{th}$ battery cell $BC_i$ by the second moving window, for each unit time by using Equation 3 or Equation 4 below. That is, the second control unit 400 may determine the second average cell voltage using the second moving window.

Equation 3 is a moving average calculation formula using an arithmetic average method, and Equation 4 is a moving average calculation formula using a weighted average method.

$$LMA_i[k] = \frac{\sum_{j=1}^{L} V_i[k - L + j]}{L} \qquad <\text{Equation 3}>$$

$$LMA_i[k] = \frac{LMA_i[k-1] \times (L-1)}{L} + \frac{V_i[k]}{L} \qquad <\text{Equation 4}>$$

In Equation 3 and Equation 4, k is a time index indicating the current time point, $LMA_i[k]$ is the second average cell voltage of the $i^{th}$ battery cell $BC_i$ of the current time point, L is the time length of the second moving window divided by the unit time, and $V_i[k]$ is the cell voltage of the $i^{th}$ battery cell $BC_i$ at the current time point. For example, if the unit time is 1 second and the time length of the second moving window is 100 seconds, L is 100. When x is a natural number less than or equal to k, $LMA_i[k-x]$ represents the second average cell voltage when the time index is k−x.

In one embodiment, as $V_i[k]$ of Equation 1 to 4, the first control unit 400 may input the difference between the criterion cell voltage of the cell group CG at the current time point and the cell voltages of the battery cell $BC_i$, instead of the cell voltage of each battery cell $BC_i$ at the current time point.

The criterion cell voltage of the cell group CG at the current time point is an average value of the plurality of cell voltages at the current time point determined from the plurality of battery cells $BC_1$ to $BC_N$. In a modification, the average value of the plurality of cell voltages may be replaced by a median value.

Specifically, the first control unit 400 may set $VD_i[k]$ of the following Equation 5 to $V_i[k]$ of Equations 1 to 4.

$$VD_i[k] = Vav[k] - V_i[k] \qquad <\text{Equation 5}>$$

In Equation 5, $Vav[k]$ is an average value of the plurality of cell voltages as the criterion cell voltage of the cell group CG at the current time point.

When the time length of the first moving window is shorter than the time length of the second moving window, the first average cell voltage may be called a 'short-term movement average' of the cell voltage, and the second average cell voltage may be called a 'long-term movement average' of the cell voltage.

The first control unit may detect voltage abnormality of the battery cell based on the difference between the first average cell voltage and the second average cell voltage. It will be described in detail with reference to FIG. 4b.

The first control unit may determine, for each of the plurality of battery cells, a long-term and short-term average difference corresponding to the difference between the first average cell voltage and the second average cell voltage of the battery cell.

Figure 4B:
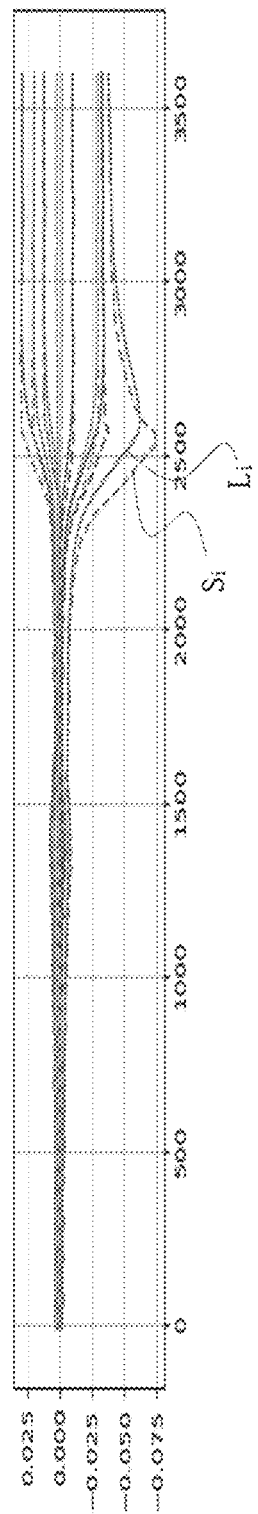

FIG. 4b shows a short-term movement average line and a long-term movement average line for the cell voltage of the $i^{th}$ battery cell $BC_i$ determined from the plurality of voltage curves shown in FIG. 4a. In FIG. 4b, the horizontal axis represents time, and the vertical axis represents a moving average value of the cell voltage.

Referring to FIG. 4b, a plurality of moving average lines Si indicated by dotted lines are one-to-one related to the plurality of battery cells $BC_1$ to $BC_N$, and represent the history of changes of the first average cell voltage ($SMA_i[k]$) of each battery cell BC according to time. In addition, the plurality of moving average lines Li indicated by solid lines are one-to-one related to the plurality of battery cells $BC_1$ to $BC_N$, and represent the history of changes of the second average cell voltage ($LMA_i[k]$) of each battery cell BC according to time.

The dotted line graph and the solid line graph are obtained using Equation 2 and Equation 4, respectively. In addition, $VD_i[k]$ of Equation 5 is used as $V_i[k]$ of Equation 2 and Equation 4, and Vav[k] is set as an average of the plurality of cell voltages. The time length of the first moving window is 10 seconds and the time length of the second moving window is 100 seconds.

The first control unit 400 may determine an average value of the determined long-term and short-term average differences of the plurality of battery cells.

In addition, for each of the plurality of battery cells, the first control unit 400 may determine the cell diagnosis deviation corresponding to the average value of the long-term and short-term average difference of all battery cells and the deviation of the long-term and short-term average difference of the battery cell. For example, the first control unit 400 may determine a cell diagnosis deviation for each battery cell by calculating the average value of the long-term and short-term average differences and the deviation of the long-term and short-term average difference of each battery cell.

Figure 4C:
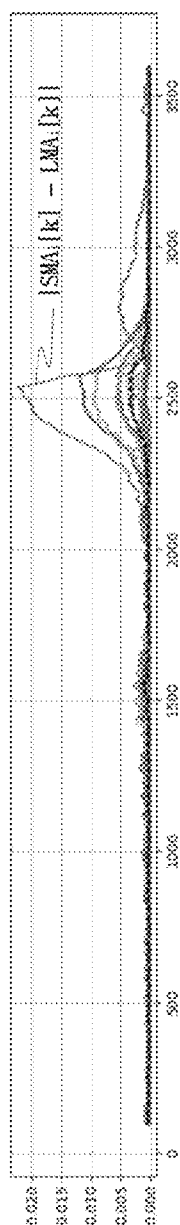

FIG. 4c shows the change of the long-term and short-term average difference (absolute value) corresponding to the difference between the first average cell voltage ($SMA_i[k]$) and the second average cell voltage ($LMA_i[k]$) of each battery cell shown in FIG. 4b according to time. In FIG. 4c, the horizontal axis represents time, and the vertical axis represents the long-term and short-term average difference of each battery cell $BC_i$.

The long-term and short-term average difference of each battery cell $BC_i$ is the difference between the first average cell voltage $SMA_i$ and the second average cell voltage $LMA_i$ of each battery cell $BC_i$ for each unit time. As an example, the long-term and short-term average difference of the $i^{th}$ battery cell $BC_i$ may be the same as the value obtained by subtracting the other (e.g., smaller one) from one (e.g., larger one) of $SMA_i[k]$ and $LMA_i[k]$.

The long-term and short-term average difference of the $i^{th}$ battery cell $BC_i$ depends on the short-term and long-term changes in the cell voltage of the $i^{th}$ battery cell $BC_i$.

The temperature or SOH of the $i^{th}$ battery cell $BC_i$ continuously affects the cell voltage of the $i^{th}$ battery cell $BC_i$ in the short term as well as in the long term. Therefore, if there is no voltage abnormality of the $i^{th}$ battery cell $BC_i$, the long-term and short-term average difference of the $i^{th}$ battery cell $BC_i$ is not significantly different from the long-term and short-term average difference of the other battery cells.

On the other hand, voltage abnormality suddenly generated due to an internal short circuit and/or an external short circuit in the $i^{th}$ battery cell $BC_i$ affects the first average cell voltage ($SMA_i[k]$) more than the second average cell voltage ($LMA_i[k]$). As a result, the long-term and short-term average difference of the $i^{th}$ battery cell $BC_i$ has a large deviation from the long-term and short-term average difference of the remaining battery cells without voltage abnormality.

The first control unit 400 may determine the long-term and short-term average difference ($|SMA_i[k]-LMA_i[k]|$) of each battery cell $BC_i$ for each unit time. Also, the first control unit 400 may determine the average value of the long-term and short-term average difference ($|SMA_i[k]-LMA_i[k]|$). Hereinafter, the average value is expressed as $|SMA_i[k]-LMA_i[k]|av$. The first control unit 400 may also determine the deviation for the long-term and short-term average difference ($|SMA_i[k]-LMA_i[k]|$) compared with the average value ($|SMA_i[k]-LMA_i[k]|av$) of the long-term and short-term average difference as the cell diagnosis deviation (Ddiag,i[k]). Also, the first control unit 400 may detect voltage abnormality of each battery cell $BC_i$ based on the cell diagnosis deviation (Ddiag,i[k]).

In an embodiment, for at least one battery cell among the plurality of battery cells, the first control unit 400 may detect a battery cell that meets the condition in which the cell diagnosis deviation exceeds the diagnosis threshold as a voltage abnormal cell. For example, when the cell diagnosis deviation (Ddiag,i[k]) for the $i^{th}$ battery cell $BC_i$ exceeds a preset diagnosis threshold (e.g., 0.015), the first control unit 400 may judge that voltage abnormality occurs in the corresponding $i^{th}$ battery cell $BC_i$, and detect voltage abnormality of the battery cell.

In another embodiment, the first control unit 400 may determine a statistically variable threshold dependent on the standard deviation of the cell diagnosis deviations of the plurality of battery cells. Also, the first control unit 400 may filter the time series data based on the statistically variable threshold in order to generate filtered time series data. Finally, the first control unit 400 may be configured to detect a voltage abnormality of the battery cell based on the time or number of data of the filtered time series data exceeding the diagnosis threshold for at least one battery cell among the plurality of battery cells. Here, the feature of detecting the voltage abnormality of the battery cell using the statistically variable threshold will be described later in detail through the following embodiment considering a normalized cell diagnosis deviation for convenience of explanation.

Meanwhile, the first control unit 400 may determine a normalization value corresponding to an average value of the determined long-term and short-term average differences of the plurality of battery cells. In addition, the first control unit 400 may normalize the long-term and short-term average differences according to the normalization value for each of the plurality of battery cells.

For example, the first control unit 400 may normalize the long-term and short-term average difference ($|SMA_i[k]-LMA_i[k]|$) of each battery cell $BC_i$ using a normalization criterion value in order to detect voltage abnormality. Preferably, the normalization criterion value is the average value ($|SMA_i[k]-LMA_i[k]|av$) of the long-term and short-term average difference.

Specifically, the first control unit 400 may set the average value ($|SMA_i[k]-LMA_i[k]|av$) of the long-term and short-term average difference of the first to $N^{th}$ battery cells $BC_i$ to $BC_N$ as the normalization criterion value. The first control unit 400 may also divide the long-term and short-term average difference ($|SMA_i[k]-LMA_i[k]|$) of each battery cell $BC_i$ by the normalization criterion value to normalize the long-term and short-term average difference ($|SMA_i[k]-LMA_i[k]|$).

Equation 6 below represents an equation normalizing the long-term and short-term average difference ($|SMA_i[k]-LMA_i[k]|$) of each battery cell $BC_i$. In an embodiment, the value calculated by Equation 6 may be referred to as a normalized cell diagnosis deviation (D*diag,i[k]).

$$D^*\text{diag},i[k]=(|SMA_i[k]-LMA_i[k]|)+(|SMA_i[k]-LMA_i[k]|av) \qquad \text{<Equation 6>}$$

In Equation 6, $1\ SMA_i[k]-LMA_i[k]$ is the long-term and short-term average difference of the $i^{th}$ battery cell $BC_i$ at the current time point, $|SMA_i[k]-LMA_i[k]|av$ is the average value (normalization criterion value) of the long-term and short-term average differences of all battery cells, and $D^*\text{diag},i[k]$ is the normalized cell diagnosis deviation of $i^{th}$ battery cell $BC_i$ at the current time point. The symbol '*' indicates that the parameter is normalized.

The long-term and short-term average difference ($|SMA_i[k]-LMA_i[k]|$) of each battery cell $BC_i$ may also be normalized through the logarithmic operation of Equation 7 below. In an embodiment, the value calculated by Equation 7 may also be called a normalized cell diagnosis deviation ($D^*\text{diag},i[k]$).

$$D^*\text{diag},i[k]=\text{Log}|SMA_i[k]-LMA_i[k]| \quad <\text{Equation 7}>$$

Figure 4D:
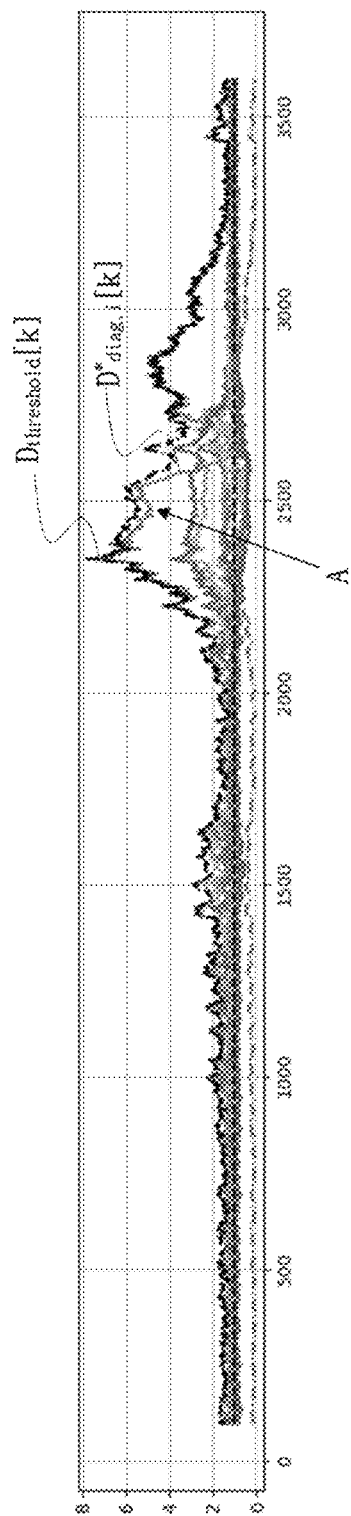

FIG. 4d shows the change of the normalized cell diagnosis deviation ($D^*\text{diag},i[k]$) of each battery cell $BC_i$ according to time. The cell diagnosis deviation ($D^*\text{diag},i[k]$) is calculated using Equation 6. In FIG. 4d, the horizontal axis represents time, and the vertical axis represents the cell diagnosis deviation ($D^*\text{diag},i[k]$) of each battery cell $BC_i$.

Referring to FIG. 4d, as the long-term and short-term average difference ($|SMA_i[k]-LMA_i[k]|$) of each battery cell $BC_i$ is normalized, it may be seen that the change in the long-term and short-term average difference of each battery cell $BC_i$ is amplified based on the average value. Accordingly, the voltage abnormality of the battery cell may be detected more accurately.

The first control unit 400 may determine a statistically variable threshold dependent on the standard deviation for the normalized cell diagnosis deviations of the plurality of battery cells.

For example, the first control unit 400 may detect voltage abnormality in each battery cell $BC_i$ by comparing the normalized cell diagnosis deviation ($D^*\text{diag},i[k]$) of each battery cell $BC_i$ with the statistically variable threshold ($D\text{threshold}[k]$).

For example, the first control unit 400 may determine the statistically variable threshold ($D\text{threshold}[k]$) for each unit time using Equation 8 below.

$$D\text{threshold}[k]=\beta^*\text{Sigma}(D^*\text{diag},i[k]) \quad <\text{Equation 8}>$$

In Equation 8, Sigma is a function that calculates the standard deviation of the normalized cell diagnosis deviations ($D^*\text{diag},i[k]$) of all battery cells BC at the time index k. In addition, β is a constant determined experimentally. β is a factor that determines the diagnostic sensitivity. β may be appropriately determined by trial and error so that, when the present disclosure is applied to a cell group containing a battery cell having an actual voltage abnormality, the corresponding battery cell may be detected as a voltage abnormal cell. In one example, β may be set to 5 or more, or 6 or more, or 7 or more, or 8 or more, or 9 or more. Since $D\text{threshold}[k]$ generated by Equation 8 is plural, they constitute time series data.

On the other hand, in the battery cell with voltage abnormality, the normalized cell diagnosis deviation ($D^*\text{diag},i[k]$) is relatively larger than that of normal battery cells. Therefore, in calculating Sigma ($D^*\text{diag},i[k]$) at the time index k to improve detection accuracy and reliability, it is desirable to exclude max ($D^*\text{diag},i[k]$) corresponding to a maximum value. Here, max is a function that returns a maximum value for a plurality of input variables, and the input variables are normalized cell diagnosis deviations ($D^*\text{diag},i[k]$) of all battery cells.

In FIG. 4d, the time series data representing the time change of the statistically variable threshold ($D\text{threshold}[k]$) corresponds to a profile indicated in the darkest color among all profiles.

The first control unit 400 may be configured to filter the normalized long-term and short-term average difference of each battery cell based on the statistically variable threshold in order to generate filtered time series data for each of the plurality of battery cells.

Specifically, the first control unit 400 may generate time series data of the filter diagnosis values by filtering the time series data on the cell diagnosis deviation of each battery cell based on the statistically variable threshold.

For example, the first control unit 400 may determine the statistically variable threshold ($D\text{threshold}[k]$) at the time index k and then determine the filter diagnosis value ($D\text{filter},i[k]$) by filtering the normalized cell diagnosis deviation ($D^*\text{diag},i[k]$) for each battery cell $BC_i$ using Equation 9 below.

$$D\text{filter},i[k]=D^*\text{diag},i[k]-D\text{threshold}[k](\text{IF } D^*\text{diag},i[k]>D\text{threshold}[k])$$

$$D\text{filter},i[k]=0(\text{IF } D^*\text{diag},i[k]<D\text{threshold}[k]) \quad <\text{Equation 9}>$$

Two values may be assigned to the filter diagnosis value ($D\text{filter},i[k]$) for each battery cell $BC_i$. That is, if the cell diagnosis deviation ($D^*\text{diag},i[k]$) is greater than the statistically variable threshold ($D\text{threshold}[k]$), the difference of the cell diagnosis deviation ($D^*\text{diag},i[k]$) and the statistically variable threshold ($D\text{threshold}[k]$) is assigned to the filter diagnosis value ($D\text{filter},i[k]$). On the other hand, if the cell diagnosis deviation ($D^*\text{diag},i[k]$) is less than or equal to the statistically variable threshold ($D\text{threshold}[k]$), 0 is assigned to the filter diagnosis value ($D\text{filter},i[k]$).

The first control unit 400 may be configured to detect a voltage abnormality of the battery cell based on the time or number of data of filtered time series data exceeding the diagnosis threshold for at least one battery cell among the plurality of battery cells.

Specifically, the first control unit 400 may detect voltage abnormality of the battery cell from the time that the filter diagnosis value exceeds the diagnosis threshold or the number of data of filter diagnosis value that exceeds the diagnosis threshold.

Figure 4E:
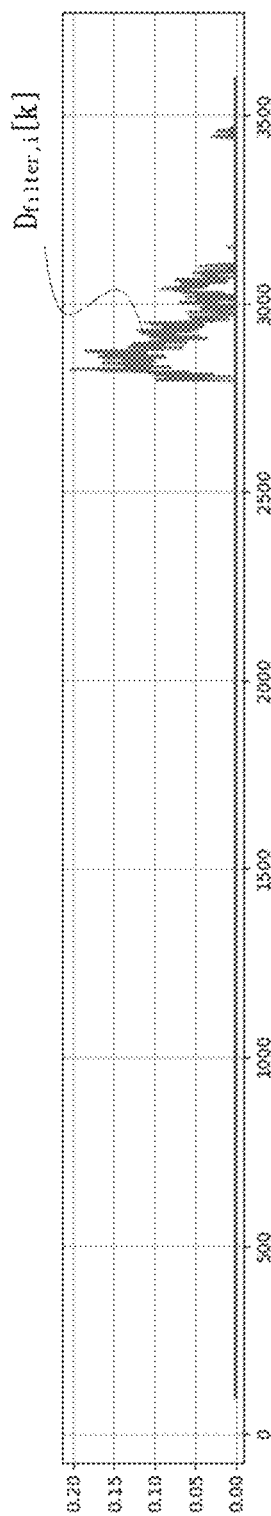

FIG. 4e is a diagram showing time series data of the filter diagnosis value ($D\text{filter},i[k]$) obtained by filtering the cell diagnosis deviation ($D^*\text{diag},i[k]$) at the time index k.

Referring to FIG. 4e, an irregular pattern with positive values around 3000 seconds is found in the filter diagnosis value ($D\text{filter},i[k]$) of a specific battery cell. For reference, the specific battery cell having an irregular pattern is a battery cell having time series data indicated by A in FIG. 4d.

In one example, the first control unit 400 may integrate a time region in which the filter diagnosis value ($D\text{filter},i[k]$) is greater than the diagnosis threshold (e.g., 0) in the time series data of the filter diagnosis value ($D\text{filter},i[k]$) for each battery cell $BC_i$, and detect a battery cell establishing the condition that the integration time is greater than a preset criterion time as a voltage abnormal cell.

Preferably, the first control unit 400 may integrate time regions in which the condition that the filter diagnosis value ($D\text{filter},i[k]$) is greater than the diagnosis threshold is continuously satisfied. If there are a plurality of corresponding time sections, the first control unit 400 may independently calculate the integration time for each time section.

The first control unit 400 may detect voltage abnormality of the battery cell from the time that the filter diagnosis value exceeds the diagnosis threshold or the number of data of filter diagnosis value that exceeds the diagnosis threshold.

For example, the first control unit 400 may integrate the number of data included in the time region in which the filter diagnosis value (Dfilter,i[k]) is greater than the diagnosis threshold (e.g. 0) in the time series data of the filter diagnosis value (Dfilter,i[k]) for each battery cell $BC_i$, and detect a battery cell establishing the condition that the data integration value is greater than a preset criterion count as a voltage abnormal cell.

Preferably, the first control unit 400 may integrate only the number of data included in a time region in which the condition in which the filter diagnosis value (Dfilter,i[k]) is greater than the diagnosis threshold is continuously satisfied. If the corresponding time region is plural, the first control unit 400 may independently integrate the number of data of each time region.

Meanwhile, the first control unit 400 may replace $V_i$[k] of Equations 1 to 5 with the normalized cell diagnosis deviation (D*diag,i[k]) of each battery cell $BC_i$ shown in FIG. 4d. In addition, at the time index k, the first control unit 400 may calculate the long-term and short-term average difference ($|SMA_i[k]-LMA_i[k]|$) of the cell diagnosis deviation (D*diag,i[k]), calculate the average value of the long-term and short-term average difference ($|SMA_i[k]-LMA_i[k]|$) of the cell diagnosis deviation (D*diag,i[k]), calculate the cell diagnosis deviation (Ddiag,i[k]) corresponding to the difference of the long-term and short-term average difference ($|SMA_i[k]-LMA_i[k]|$) compared to the average value, calculate the normalized cell diagnosis deviation (D*diag,i[k]) for the long-term and short-term average difference ($|SMA_i[k]-LMA_i[k]|$) using Equation 6, determine the statistically variable threshold (Dthreshold[k]) for the normalized cell diagnosis deviation (D*diag,i[k]) using Equation 8, determine the filter diagnosis value (Dfilter,i[k]) by filtering the cell diagnosis deviation (D*diag,i[k]) using Equation 9, and detect voltage abnormality of the battery cell using the time series data in a recursive way.

Figure 4F:
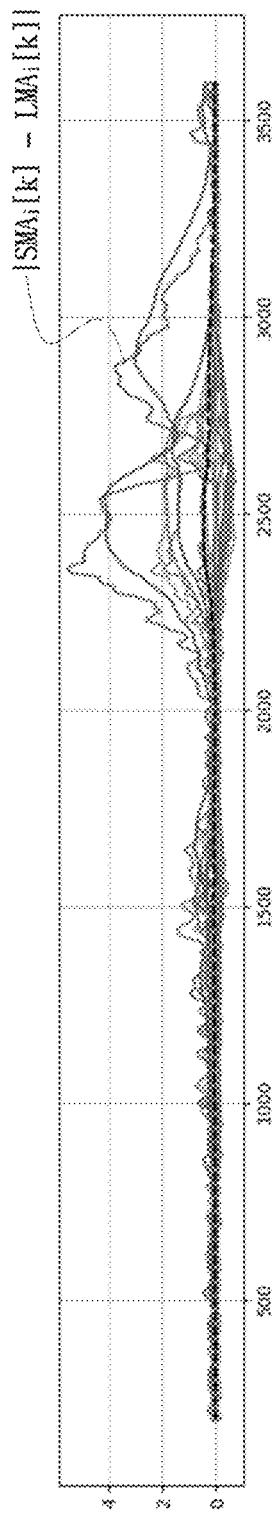

FIG. 4f is a graph showing the change in the long-term and short-term average difference ($|SMA_i[k]-LMA_i[k]|$) for the time series data (FIG. 4d) of the normalized cell diagnosis deviation (D*diag,i[k]) according to time. In Equation 2, Equation 4, and Equation 5 used to calculate the long-term and short-term average difference ($|SMA_i[k]-LMA_i[k]|$), $V_i$[k] may be replaced with D*diag,i[k], and Vav[k] may be replaced with the average value of D*diag,i[k].

Figure 4G:
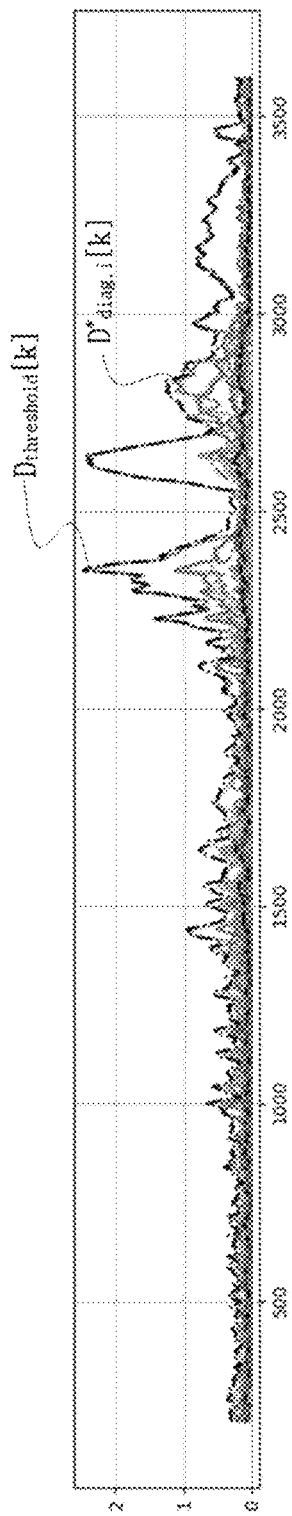

FIG. 4g is a graph showing the time series data of the normalized cell diagnosis deviation (D*diag,i[k]) calculated using Equation 6. In FIG. 4g, the time series data of the statistically variable threshold (Dthreshold[k]) corresponds to the profile indicated in the darkest color.

Figure 4H:
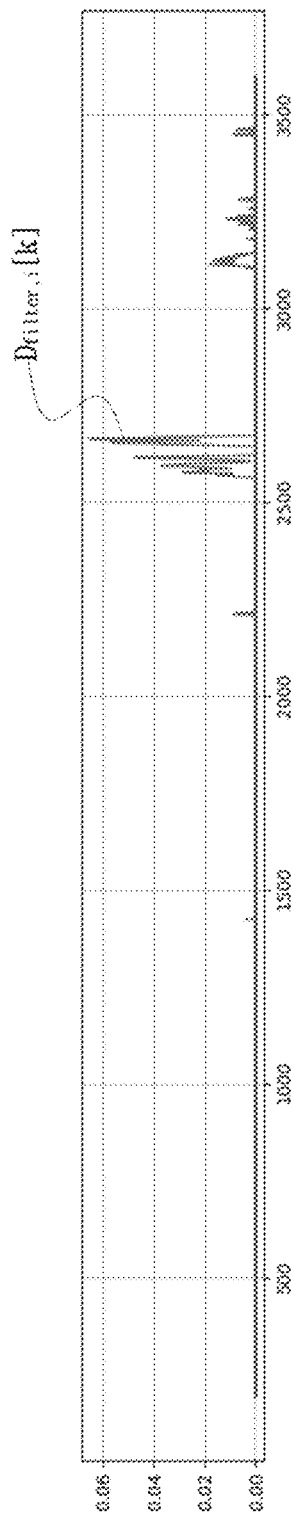

FIG. 4h is a profile showing the time series data of the filter diagnosis value (Dfilter,i[k]) obtained by filtering the time series data of the cell diagnosis deviation (D*diag,i[k]) using Equation 9.

In one example, the first control unit 400 may integrate a time region in which the filter diagnosis value (Dfilter,i[k]) is greater than the diagnosis threshold (e.g., 0) in the time series data of the filter diagnosis value (Dfilter,i[k]) for each battery cell $BC_i$, and detect a battery cell establishing the condition that the integration time is greater than a preset criterion time as a voltage abnormal cell.

Preferably, the first control unit 400 may integrate a time region in which a condition that the filter diagnosis value (Dfilter,i[k]) is greater than the diagnosis threshold is successively satisfied. If the corresponding time region is plural, the first control unit 400 may independently calculate the integration time for each time region.

In another example, the first control unit 400 may integrate the number of data included in a time region in which the filter diagnosis value (Dfilter,i[k]) is greater than the diagnosis threshold (e.g., 0) in the time series data of the filter diagnosis value (Dfilter,i[k]) for each battery cell $BC_i$, and detect a battery cell establishing a condition that the data integration value is greater than a preset criterion count as a voltage abnormal cell.

Preferably, the first control unit 400 may integrate only the number of data included in a time region in which a condition that the filter diagnosis value (Dfilter,i[k]) is greater than the diagnosis threshold is continuously satisfied. If the corresponding time region is plural, the first control unit 400 may independently integrate the number of data of each time region.

The first control unit 400 may additionally repeat the recursive computation process described above as many times as a criterion number. That is, the first control unit 400 may replace the voltage time series data shown in FIG. 4a with the time series data (e.g., the data of FIG. 4g) of the normalized cell diagnosis deviation (D*diag,i[k]). In addition, at the time index k, the first control unit 400 may calculate the long-term and short-term average difference ($|SMA_i[k]-LMA_i[k]|$), calculate the average value of the long-term and short-term average difference ($|SMA_i[k]-LMA_i[k]|$), calculate the cell diagnosis deviation (Ddiag,i[k]) corresponding to the difference of the long-term and short-term average difference ($|SMA_i[k]-LMA_i[k]|$) compared to the average value, calculate the normalized cell diagnosis deviation (D*diag,i[k]) for the long-term and short-term average difference ($|SMA_i[k]-LMA_i[k]|$) using Equation 6, determine the statistically variable threshold (Dthreshold[k]) for the cell diagnosis deviation (D*diag,i[k]) using Equation 8, determine the filter diagnosis value Dfilter,i[k] by filtering the cell diagnosis deviation (D*diag,i[k]) using Equation 9, and detect voltage abnormality of the battery cell using the time series data of the filter diagnosis value Dfilter,i[k] in a recursive way.

If the recursive computation process as described above is repeated, the voltage abnormality of the battery cell may be diagnosed more precisely. That is, referring to FIG. 4e, a positive profile pattern is observed only in two time regions in the time series data of the filter diagnosis value (Dfilter,i[k]) of a battery cell with voltage abnormality. However, referring to FIG. 4h, a positive profile pattern is observed in more time regions than in FIG. 4e in the time series data of the filter diagnosis value (Dfilter,i[k]) of a battery cell with voltage abnormality. Therefore, if the recursive computation process is repeated, it is possible to more accurately detect the time point at which the voltage abnormality occurs in the battery cell.

Heretofore, a detailed method for detecting voltage abnormality by the first control unit 400 using the first information is described. Hereinafter, a method in which the first control unit 400 detects behavior abnormality using the first information will be described in detail with reference to FIGS. 5 to 9.

Figure 5:
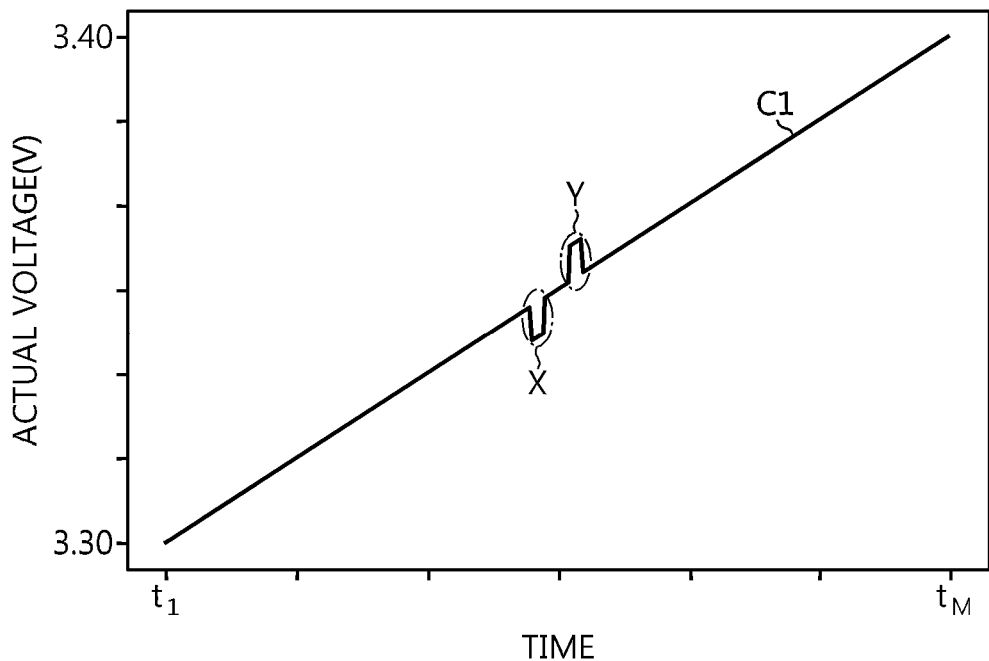
FIG. 5 is a graph exemplarily showing a voltage curve corresponding to a raw time series of actual voltage values of a cell voltage of a battery cell referenced in various embodiments of the present disclosure.
Figure 6:
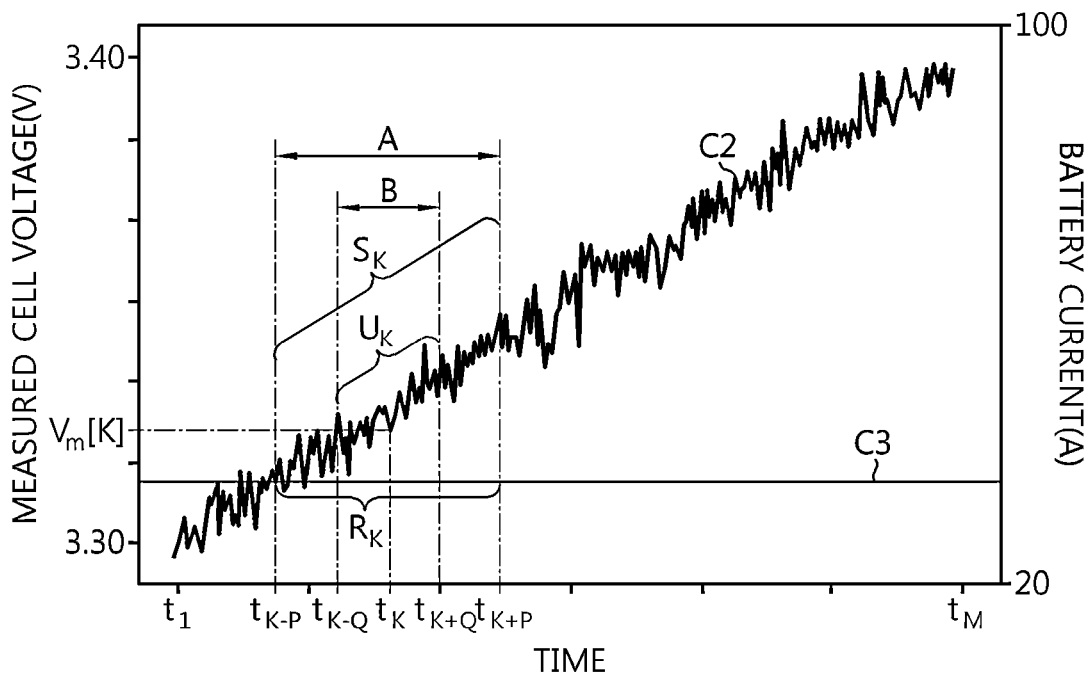
FIG. 6 is a graph exemplarily showing a measured voltage curve obtained by synthesizing the measured noise with the raw time series corresponding to the voltage curve of FIG. 5.
Figure 7:
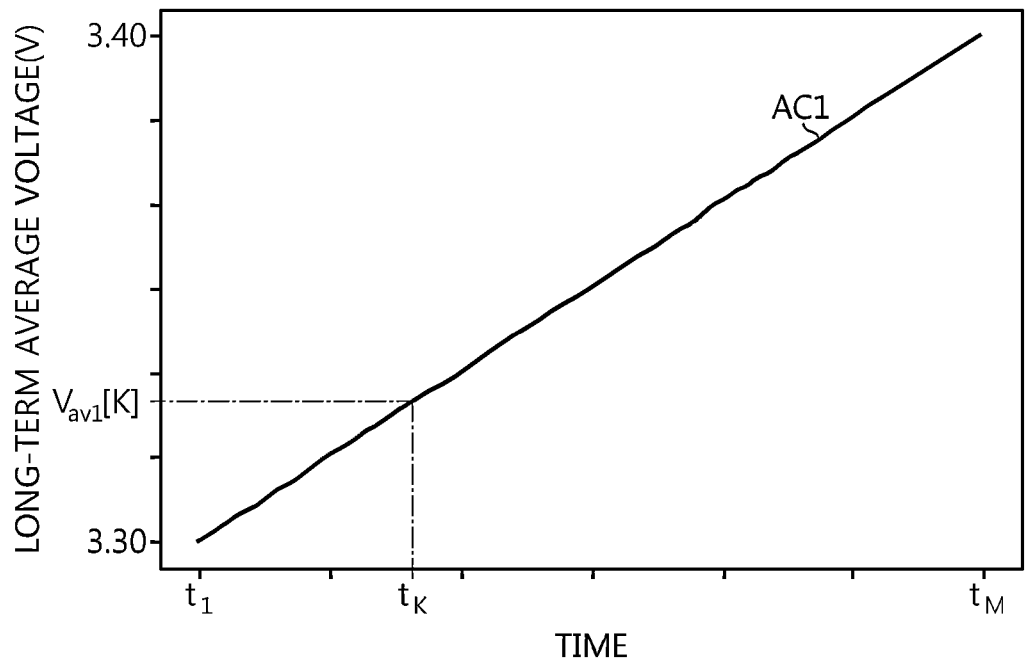
FIG. 7 is a graph exemplarily showing a first movement average curve obtained by applying a first average filter to the voltage curve of FIG. 6.
Figure 8:
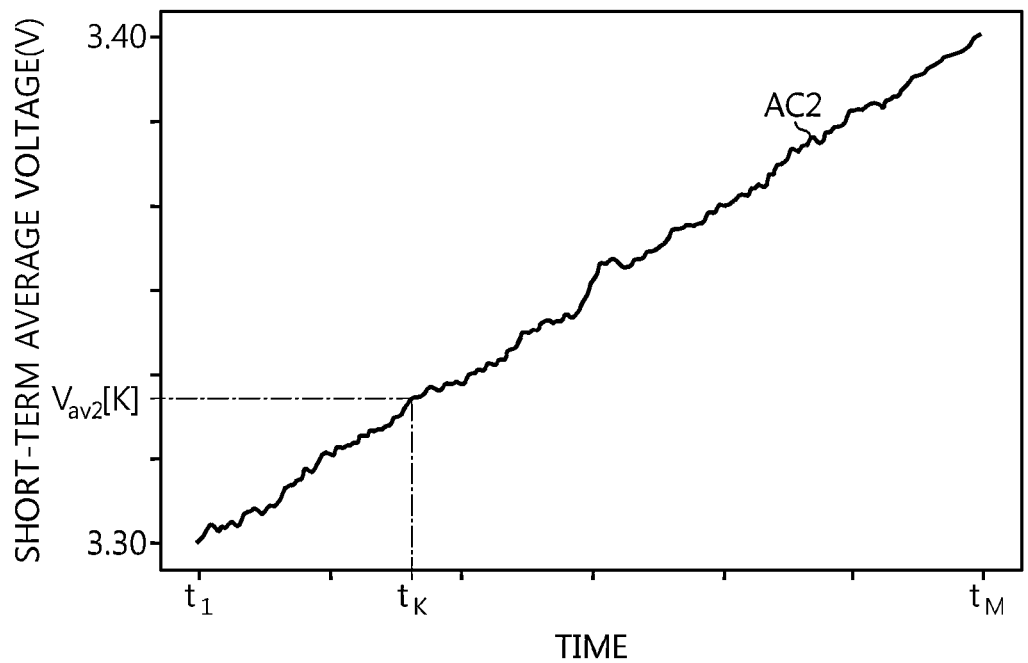
FIG. 8 is a graph exemplarily showing a second movement average curve obtained by applying a second average filter to the voltage curve of FIG. 6.
Figure 9:
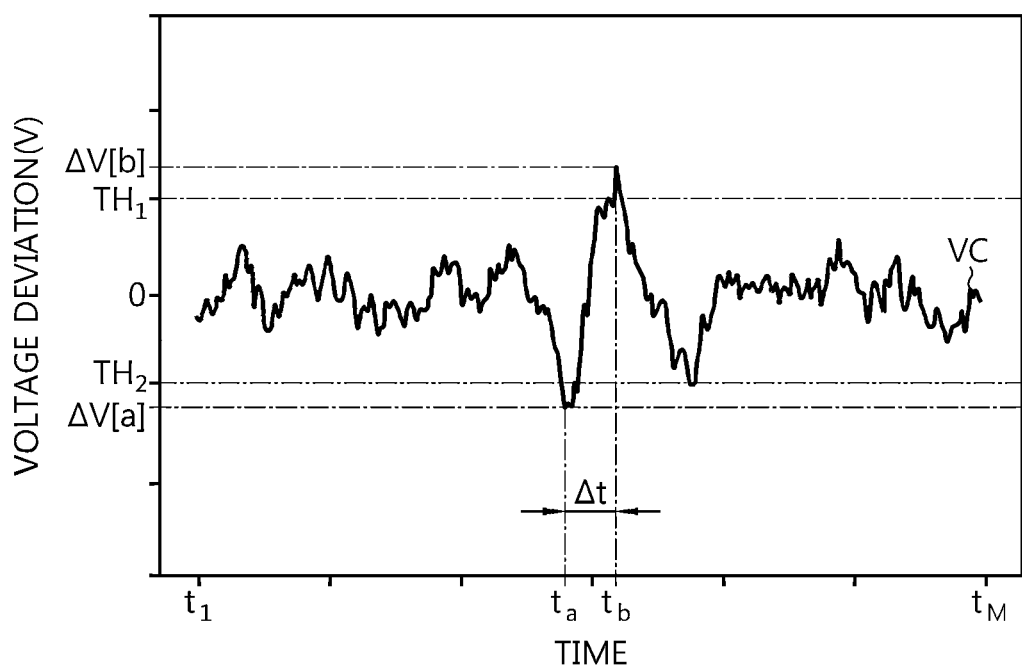
FIG. 9 is a graph exemplarily showing a voltage deviation curve that is a difference between the first movement average curve of FIG. 7 and the second movement average curve of FIG. 8.

FIG. 5 is a graph exemplarily showing a voltage curve C1 corresponding to a raw time series of actual voltage values of the cell voltage of the battery cell referenced in various embodiments of the present disclosure, and FIG. 6 is a graph exemplarily showing a measured voltage curve C2 obtained by synthesizing the measured noise with the raw time series corresponding to the voltage curve C1 of FIG. 5. FIG. 7 is a graph exemplarily showing a first movement average curve AC1 obtained by applying the first average filter to the voltage curve C2 of FIG. 6, and FIG. 8 is graph exemplarily showing a second movement average curve AC2 obtained by applying the second average filter to the voltage curve C2 of FIG. 6. FIG. 9 is a graph exemplarily showing a voltage deviation curve VC that is a difference between the first movement average curve AC1 of FIG. 7 and the second movement average curve AC2 of FIG. 8.

First, referring to FIG. 5, the voltage curve C1 is an example of a raw time series including actual voltage values of the cell voltage of the battery cell BC during charging over a predetermined period t1 to tM. For better understanding, the cell voltage increases linearly, and the illustration of the actual voltage values for the period before t1 and after tM is omitted.

If the battery cell BC is normal, the cell voltage continues to rise gradually during charging. On the other hand, if the battery cell BC has behavioral abnormality with any fault condition therein (e.g., a micro-short, a part of the electrode tab is torn), abnormal behavior that the cell voltage temporarily drops or rises even during charging may be irregularly observed.

The voltage curve C1 of FIG. 5 is related to an embodiment in which the battery cell BC has behavior abnormality, in which the region X represents a time range in which the cell voltage sharply drops as behavior abnormality, and the region Y represents a time range in which the cell voltage rapidly rises as behavior abnormality. FIG. 5 illustrates a cell voltage during charging, but the cell voltage of a behavior abnormal battery cell may change as behavioral abnormality even during discharging or resting. For example, during discharging, the cell voltage of a normal battery cell continuously and gently falls, while the cell voltage of a behavior abnormal battery cell may temporarily rise or fall sharply.

Next, referring to FIG. 6, the voltage curve C2 represents the result of synthesizing the measured noise with the actual cell voltage of the voltage curve C1 of FIG. 5. That is, the voltage curve C2 of FIG. 6 represents a time series in which voltage values representing the measured cell voltage are arranged in time order.

When M is a natural number indicating a predetermined total number of sampling times (e.g., 300) and K is a natural number less than or equal to M, tK is the measurement timing (the $K^{th}$ measurement timing tK) of the $K^{th}$ voltage value (Vm[K]) in time order among the total M number of voltage values included in voltage curve C2, and the time interval between two adjacent measurement timings is spaced apart by a predetermined sampling time (e.g., 0.1 second). The voltage value (Vm[K]) is a data point indexed to the measurement timing tK among the total M number of voltage values included in the voltage curve C2.

The measured noise may be generated irregularly over time due to internal and external factors of the voltage sensing unit 200 (e.g., temperature of the voltage measuring device, sampling rate, electromagnetic wave, etc.). The current curve C3 is a time series including current values of the battery current measured over a predetermined period (t1 to tM). For convenience of explanation, the battery current is exemplified as being constant during the predetermined period (t1 to tM).

If comparing the voltage curve C2 of FIG. 6 with the voltage curve C1 of FIG. 5, the abnormal behavior (X, Y) can be easily identified from the voltage curve C1 without the measured noise of FIG. 5, while there is a problem in that it is difficult to identify the abnormal behavior (X, Y) from the voltage curve C2 in which the measured noise is mixed over the entire predetermined period (t1 to tM).

The inventor of the present disclosure has confirmed that the above-mentioned problem can be solved by applying the first average filter and the second average filter to the time series of voltage values (measured values) including the measured noise generated in the measurement timing of the cell voltage. The time series of voltage values acquired over a predetermined period in the past for the battery cell BC to be detected can be called a 'criterion voltage curve', and the time series of current values can be called a 'criterion current curve'. Hereinafter, the voltage curve C2 and the current curve C3 of FIG. 6 will be described to be assumed as the criterion voltage curve C2 and the criterion current curve C3, respectively.

The first control unit 400 may be configured to determine a plurality of sub voltage curves by applying a moving window of a first time length to the time series of the cell voltages included in the first information.

Specifically, the first control unit 400 may determine a plurality of sub voltage curves by applying a moving window of a first time length to the criterion voltage curve C2. In addition, the first control unit 400 may determine a plurality of sub current curves that are one-to-one associated with the plurality of sub voltage curves by applying the moving window of the first time length to the criterion current curve C3.

When K is a natural number less than or equal to M, the total M number of sub voltage curves (i.e., first to $M^{th}$ sub voltage curves) may be determined from the criterion voltage curve C2. The criterion voltage curve C2 includes the total M number of voltage values (i.e., first to $M^{th}$ voltage values) sequentially measured for every sampling time W.

The sub voltage curve SK is a subset of the criterion voltage curve C2 and includes the (A/W+1) number of voltage values consecutive in time order. For example, when the sampling time W=0.1 seconds and the first time length A=10 seconds, the sub voltage curve SK is a time series of a total of 101 voltage values, that is, from the $(K-P)^{th}$ voltage value to the $(K+P)^{th}$ voltage value. P=A/2 W=50.

In FIG. 6, RK is a sub current curve related to the sub voltage curve SK. Accordingly, the sub current curve RK may also include the (A/W+1) number of data points (current values) consecutive in time order.

As the battery current fluctuates greatly, the cell voltage also fluctuates greatly. Abrupt fluctuations in cell voltage due to battery current may be a hindrance to identifying abnormal behavior of the cell voltage from the criterion voltage curve C2.

The first control unit 400 may determine a current change amount of the sub current curve RK, which is a difference between the maximum current value and the minimum current value of the sub current curve RK. The first control unit 400 may detect behavior abnormality of the battery cell from the time series of the cell voltage measured while the change in battery current is small, such as constant current charging or rest, by using a sub current curve RK.

The first control unit 400 may determine a long-term average voltage value and a short-term average voltage value of the sub voltage curve SK related to the sub current curve RK on condition that the current change amount is less than a threshold change amount.

The first control unit 400 may execute the calculation processes described below for the sub voltage curve SK under the condition that the current change amount of the sub current curve RK is equal to or less than the threshold change amount.

The first control unit 400 may determine a long-term average voltage value of each sub voltage curve SK by using the first average filter of the first time length.

Referring to FIG. 7, the first average voltage curve AC1 may be obtained by applying the first average filter of the first time length A to the criterion voltage curve C2. The first average filter is a kind of low-pass filter, and may be a centered moving average having a subset size (A/W+1) corresponding to the first time length A. For example, the first control unit 400 determine the long-term average voltage value (Vav1[K]) indexed to the measurement timing tK by averaging the (A/W+1) number of voltage values included in the sub voltage curve SK, that is, the $(K-P)^{th}$ voltage value to the $(K-1)^{th}$ voltage value, the $K^{th}$ voltage value and the $(K+1)^{th}$ voltage value to the $(K+P)^{th}$ voltage value. Equation 10 below shows the first average filter.

$$V_{av1}[k] = \frac{\sum_{i=k-P}^{k+P} V_m[i]}{\frac{A}{W} + 1} \qquad <\text{Equation 10}>$$

In Equation 10, Vm[i] is the $i^{th}$ voltage value included in the criterion voltage curve C2, A is the first time length, W is the sampling time, P=A/2 W, and Vav1[K] is the long-term average voltage value at the measurement timing tK. The first control unit 400 may determine the first average voltage curve AC1 of FIG. 7 by substituting 1 to M for K of Equation 10. The first time length A is predetermined as an integer multiple of the sampling time W. Therefore, the first time length A indicates the size of the subset (A/W+1) used to obtain the long-term average voltage value (Vav1[K]).

In addition, the first control unit 400 may determine a short-term average voltage value of the sub voltage curve by using the second average filter having a second time length shorter than the first time length.

Referring to FIG. 8, the second average voltage curve AC2 is obtained by applying the second average filter of the second time length B shorter than the first time length A to the criterion voltage curve C2. The second average filter is a kind of low pass filter, and may be a central moving average having a subset size (B/W+1) corresponding to the second time length B.

As an example, the first control unit 400 determine the short-term average voltage value (Vav2[K]) indexed to the measurement timing tK by averaging the (B/W+1) number of voltage values included in the sub voltage curve SK, that is, the $(K-Q)^{th}$ voltage value to the $(K-1)^{th}$ voltage value, the $K^{th}$ voltage value and the $(K+1)^{th}$ voltage value to the $(K+Q)^{th}$ voltage value. Q=B/2 W. The short-term average voltage value (Vav2[K]) is the average of the subset UK of the sub voltage curve SK. The subset UK is located within the time range (tK−P to tK+P) of the sub voltage curve SK and is the voltage curve of a time range (tK−Q to tK+Q) having the same measurement timing tK as the time range (tK−P to tK+P). Equation 11 below shows the second average filter.

$$V_{av2}[k] = \frac{\sum_{i=k-Q}^{k+Q} V_m[i]}{\frac{B}{W} + 1} \qquad <\text{Equation 11}>$$

In Equation 11, Vm[i] is the $i^{th}$ voltage value included in the criterion voltage curve C2, B is the second time length, W is the sampling time, Q=B/2 W, and Vav2[K] is the short-term average voltage value at the measurement timing tK. The first control unit 400 may determine the second average voltage curve AC2 of FIG. 8 by substituting 1 to M for K of Equation 11 one by one. The second time length B is predetermined as an integer multiple of the sampling time W. Accordingly, the second time length B indicates the size of the subset (B/W+1) used to obtain the short-term average voltage value (Vav2[K]).

The first time length A>the second time length B, each data point (i.e., the long-term average voltage value) of the first average voltage curve AC1 may be called a 'long-term average value', and each data point (i.e., the short-term average voltage value) of the second average voltage curve AC2 may be called as a 'short-term average value'. For example, A may be ten times greater than B.

The first control unit 400 may determine a voltage deviation corresponding to a difference between the long-term average voltage value and the short-term average voltage value of the sub voltage curve.

For example, the first control unit 400 may determine a voltage deviation associated with the sub voltage curve by subtracting the other from one of the long-term average voltage value and the short-term average voltage value of each sub voltage curve.

Referring to FIG. 9, the voltage deviation curve VC is a result of subtracting the other from one of the first average voltage curve AC1 and the second average voltage curve AC2. That is, the voltage deviation curve VC is a time series of the total M number of voltage deviations for a predetermined period (t1 to tM). The voltage deviation (ΔV[K]) related to the sub voltage curve SK is a value obtained by subtracting the other from one of the long-term average voltage value (Vav1[K]) and the short-term average voltage value (Vav2[K]). For example, ΔV[K]=Vav2[K]− Vav1[K].

As described above, the long-term average voltage value (Vav1[K]) is an average cell voltage for a long period of the first time length A centered on the measurement timing tK, and the short-term average voltage value (Vav2[K]) is an average cell voltage for a short period of the second time length B centered on the measurement timing tK. Therefore, by subtracting the other from one of the long-term average voltage value (Vav1[K]) and the short-term average voltage value (Vav2[K]) to obtain the voltage deviation (ΔV[K]), there is an effect that the measured noise generated over a predetermined period before and after the measurement timing tK is effectively removed.

There is an advantage in that the measured noise generated over a certain period before and after the measurement timing tK is offset to a considerable extent through the process of subtracting the other from one of the long-term average voltage value (Vav1[K]) and the short-term average voltage value (Vav2[K]).

The first control unit 400 may compare each of the plurality of voltage deviations (ΔV[K]) determined for the plurality of sub voltage curves with at least one of a first threshold deviation TH1 and a second threshold deviation TH2 in order to detect behavior abnormality of the battery cell.

For example, the first control unit 400 may compare the voltage deviation (ΔV[K]) with the first threshold deviation TH1 and the second threshold deviation TH2. The first threshold deviation TH1 may be a predetermined positive number (e.g., +0.001 V), and the second threshold deviation TH2 may be a predetermined negative number (e.g., −0.001 V) having the same absolute value as the first threshold deviation TH1.

The first control unit 400 may detect that the battery cell BC has behavior abnormality when among all the voltage deviations included in the voltage deviation curve VC, a predetermined number (e.g., 10) of voltage deviations or more are equal to or greater than the first threshold deviation TH1 or equal to or less than the second threshold deviation TH2.

The first control unit 400 may be configured to detect a behavior abnormality in response to any two voltage deviations satisfying a first condition, a second condition, and a third condition, respectively, among the plurality of voltage deviations.

Specifically, the first control unit 400 may be configured to determine that the battery cell has behavior abnormality when any two voltage deviations among the plurality of voltage deviations determined for the plurality of sub voltage curves satisfy the first condition, the second condition and the third condition.

For example, the first control unit 400 may judge that the battery cell BC has behavior abnormality when among the total M number of voltage deviations included in the voltage deviation curve VC, any two voltage deviations satisfy the first condition, the second condition, and the third condition. The first condition is satisfied when one of the two voltage deviations is greater than or equal to the first threshold deviation TH1. The second condition is satisfied when the other of the two voltage deviations is less than or equal to the second threshold deviation TH2. The third condition is satisfied when the time interval between the two voltage deviations is equal to or less than the threshold time. The threshold time may be predetermined to be less than the first time length A. Referring to FIG. 9, the voltage deviation (ΔV[a]) is less than or equal to the second threshold deviation TH2 (the second condition is satisfied), and the voltage deviation (ΔV[b]) is greater than or equal to the first threshold deviation TH1 (the first condition is satisfied). Therefore, when the time interval (Δt=tb−ta) between the two voltage deviations (ΔV[a], ΔV[b]) is less than or equal to the threshold time, the battery cell BC may be detected as having behavior abnormality.

So far, a method in which the first control unit 400 detects at least one abnormality among voltage abnormality and behavior abnormality by using first information according to various embodiments of the present disclosure has been described with reference to FIGS. 3 to 9. Hereinafter, an external device 2000 according to an embodiment of the present disclosure will be described in detail with reference to FIG. 10.

Figure 10:
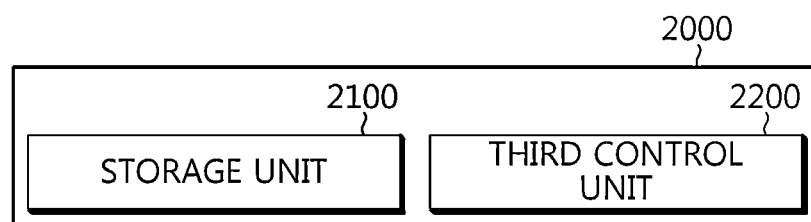
FIG. 10 is a block diagram showing a schematic configuration of an external device according to an embodiment of the present disclosure.

FIG. 10 is a block diagram showing a schematic configuration of the external device 2000 according to an embodiment of the present disclosure. The external device 2000 may be a dedicated device for diagnosing a battery cell. The external device 2000 may include a storage unit 2100 and a third control unit 2200.

The storage unit 2100 may collect the charging and discharging data included in the first information and store the collected charging and discharging data.

The storage unit 2100 is not particularly limited in its type as long as it can record and erase data and/or information. As an example, the storage unit 2100 may be a RAM, a ROM, a register, a flash memory, a hard disk, or a magnetic recording medium.

The storage unit 2100 may be electrically connected to the third control unit 2200 through a data bus or the like so that it can be accessed by the third control unit 2200.

The storage unit 2100 stores and/or updates and/or erase and/or transmit a program including various control logic performed by the third control unit 2200, and/or data generated when the control logic is executed, and/or preset data, parameters, lookup information/table, etc.

First, an embodiment in which the diagnostic information of the battery cell included in the second information is information about lithium precipitation diagnosis of the battery cell will be described.

In an embodiment, the second information may represent whether the accumulated capacity difference change amount is greater than or equal to a threshold value. Here, the accumulated capacity difference change amount may be the sum of capacity difference change amounts. That is, the sum of a plurality of capacity difference change amounts may be calculated as the accumulated capacity difference change amount. Here, each of the capacity difference change amounts is a difference between a capacity difference of a $k^{th}$ charging and discharging cycle of the battery cell and a capacity difference of a $k-1^{th}$ charging and discharging cycle of the battery cell (k is a natural number greater than or equal to 2). Here, the capacity difference of each charging and discharging cycle corresponds to a difference between a charging capacity of the battery cell during the charging process of the charging and discharging cycle and a discharging capacity of the battery cell during the discharging process of the charging and discharging cycle. Here, each of the charging capacity and the discharging capacity may be derived from data obtained from the current measuring unit and included in the first information.

The third control unit 2200 may generate second information including the diagnostic information of the battery cell related to a lithium precipitation diagnosis by using the first information. The number of charging and discharging cycles required to generate the second information may be set in advance. In one example, the number of charging and discharging cycles required to generate the second information may be 20.

For example, the charging and discharging cycle may include a charging cycle and a discharging cycle. The charging cycle may mean charging a battery from the lower limit to the upper limit of a preset charging voltage region and stopping the charging while maintaining the battery cell temperature constant. The discharging cycle may mean stabilizing the battery for a predetermined time after the charging cycle is completed, then discharging the battery from the upper limit to the lower limit of a preset discharging voltage region and stopping the discharging while maintaining the battery cell temperature to be the same as the charging cycle. The charging voltage region and the discharging voltage region may be the same or different. However, in performing a plurality of charging and discharging cycles, it is preferable that the charging voltage regions of the charging cycles are the same and the discharging voltage regions of the discharging cycles are also the same.

In another example, the charging cycle means charging the battery from the lower limit to the upper limit of the preset charging voltage region and stopping charging while keeping the battery cell temperature constant. The discharging cycle starts discharging from the upper limit of the preset discharging voltage region and stops the discharging when the accumulated current value reaches a preset discharging capacity by integrating the discharging current. In performing the plurality of charging and discharging cycles, it is preferable that the charging voltage regions of the charging cycles are the same and the discharging capacity of the discharging cycles are the same.

The third control unit 2200 may derive a charging capacity and a discharging capacity of the battery cell from the data included in the first information. Specifically, the third control unit 2200 may receive the current measurement value included in the first information in the $K^{th}$ (k is a natural number greater than or equal to 2) charging and discharging cycle by using the information about the charging current or discharging current included in the first information, and calculate a charging capacity (ChgAh[k]) and a discharging capacity (DchgAh[k]).

For example, the third control unit 2200 may initialize the charging and discharging cycle index k to 1, and initialize the first capacity difference change amount ΔdAh[1] and the first accumulated capacity difference change amount ($\Sigma_{i=1}^{1}$ ΔdAh) to 0, respectively.

The third control unit 2200 may start the first charging and discharging cycle for the battery. In this specification, when the external device 2000 starts the charging and discharging cycle, it may mean that data corresponding to the charging and discharging cycle is obtained using the first information.

The third control unit 2200 may calculate the charging capacity (ChgAh[1]) and the discharging capacity (DchgAh[I]) by using the current measurement value included in the first information during the first charging and discharging cycle.

The first information may include information about the charging cycle performed in the preset charging voltage region and the discharging cycle performed in the preset discharging voltage region.

The charging voltage region and the discharging voltage region may be the same or different. Preferably, the discharging cycle is initiated after the voltage of the battery cell is stabilized after the charging cycle is finished. Also, the discharging cycle may be ended when the voltage of the battery cell reaches a preset discharging end voltage or when the integrated value of the discharging current reaches a preset discharging capacity. When the start and end of the charging cycle and the discharging cycle are controlled based on the voltage value, the external device 2000 may refer to the voltage measurement value included in the first information. The voltage measurement value included in the first information may be a value measured through the voltage sensing unit 200.

The third control unit 2200 may continue the charging and discharging cycle until the index k for the charging and discharging cycle is equal to n. n is a preset natural number that is the total number of charging and discharging cycles that can proceed to detect lithium precipitation abnormality. In one example, n may be 20.

The third control unit 2200 may determine the capacity difference (dAh[k]) corresponding to the difference between the charging capacity (ChgAh[k]) and the discharging capacity (DchgAh[k]). That is, the capacity difference (dAh[k]) may be calculated as a difference between the charging capacity (ChgAh[k]) and the discharging capacity (DchgAh[k]).

For example, the first charging and discharging cycle (e.g., k=1) will be described. The third control unit 2200 may record the determined capacity difference (dAh[1]) together with a time stamp in the storage unit 2100. In one example, the capacity difference (dAh[I]) may be determined by subtracting the discharging capacity (DchgAh[1]) from the charging capacity (ChgAh[1]). The third control unit 2200 may determine the capacity difference (dAh[1]) corresponding to the difference between the charging capacity (ChgAh[1]) and the discharging capacity (DchgAh[1]), and record the determined capacity difference (dAh[1]) in the storage unit 2100 together with a time stamp. In one example, the capacity difference (dAh[I]) may be determined by subtracting the discharging capacity (DchgAh[1]) from the charging capacity (ChgAh[1]).

The third control unit 2200 may determine the $K^{th}$ capacity difference change amount (ΔdAh[k]) by subtracting the capacity difference (dAh[k]) of the $K^{th}$ charging and discharging cycle from the capacity difference (dAh[k−1]) of the k−$1^{th}$ charging and discharging cycle. Namely, the capacity difference change amount (ΔdAh[k]) may be calculated as a difference between the capacity difference (dAh[k]) of the $K^{th}$ charging and discharging cycle and the capacity difference (dAh[k−1]) of the k−$1^{th}$ charging and discharging cycle.

For example, the third control unit 2200 may determine the second capacity difference change amount (ΔdAh[2]) by subtracting the capacity difference (dAh[2]) of the second charging and discharging cycle from the capacity difference (dAh[1]) of the first charging and discharging cycle.

The third control unit 2200 may update the accumulated capacity difference change amount by adding the $K^{th}$ capacity difference change amount (ΔdAh[k]) to the accumulated capacity difference change amount if the $K^{th}$ capacity difference change amount (ΔdAh[k]) is greater than the criterion value. Here, the accumulated capacity difference change amount may be the sum of the plurality of calculated capacity difference change amounts.

For example, the third control unit 2200 updates the accumulated capacity difference change amount by adding the second capacity difference change amount (ΔdAh[2]) to the first accumulated capacity difference change amount ($\Sigma_{i=1}^{1}$ ΔdAh), and determines the updated value to the second accumulated capacity difference change amount ($\Sigma_{i=1}^{2}$ ΔdAh). For reference, the first accumulated capacity difference change amount ($\Sigma_{i=1}^{1}$ ΔdAh) is 0 that is an initialization value.

If the updated accumulated capacity difference change amount is greater than or equal to a threshold value, the third control unit 2200 may detect that there is lithium precipitation abnormality and generate the second information.

The threshold value may mean a value suitable for detecting lithium precipitation abnormality. For example, the threshold value may be 0.1% of the battery capacity. The threshold value may be a value preset in the external device 2000 or a value included in the first information.

If the updated accumulated capacity difference change amount is greater than or equal to the threshold value, the third control unit 2200 may judge that lithium precipitation abnormality occurs inside the battery, and generate the second information. That is, the second information may represent whether the accumulated capacity difference change amount is greater than or equal to the threshold value.

In another embodiment, the second information may also represent a capacity difference change amount between successive charging and discharging cycles of the battery cell. Here, the capacity difference for each charging and discharging cycle of the battery cell may be a difference between (i) the charging capacity of the battery cell during the charging process of the charging and discharging cycle of the battery cell and (ii) the discharging capacity of the battery cell during the discharging process of the charging and discharging cycle of the battery cell. In this case, the first control unit 400 may calculate the accumulated capacity difference change amount by calculating the sum of the capacity difference change amounts from the second information. Also, the first control unit 400 may judge whether the accumulated capacity difference change amount is greater than or equal to the threshold value.

Next, an embodiment in which the diagnostic information of the battery cell included in the second information is information about a parallel connection abnormality of the battery cell will be described.

The second information may represent a parallel connection abnormality of a plurality of unit cells included in the battery cell based on a result of monitoring a change over time of the estimated capacity value by the external device 2000. Here, the estimated capacity value may represent a full charging capacity of the battery cell based on charging and discharging data. Here, the charging and discharging data may include a voltage time series representing the change over time of the voltage of the battery cell and a current time series representing the change over time of the charging and discharging current of the battery cell.

The storage unit 2100 may collect charging and discharging data including the voltage time series representing the change over time of the voltage across both ends of the battery cell and the current time series representing the change over time of the charging and discharging current flowing through the battery cell by using the information on the charging current or the discharging current included in the first information, and store the collected charging and discharging data.

The third control unit 2200 may determine an estimated capacity value representing the full charging capacity of the battery cell based on the charging and discharging data. Also, the third control unit 2200 may detect a parallel connection abnormality by monitoring the change over time of the determined estimated capacity value. The diagnostic information of the battery cell corresponding to the parallel connection abnormality may be included in the second information.

A method for the external device 2000 to detect a parallel connection abnormality will be described in detail with reference to FIGS. 11 to 14.

Figure 11:
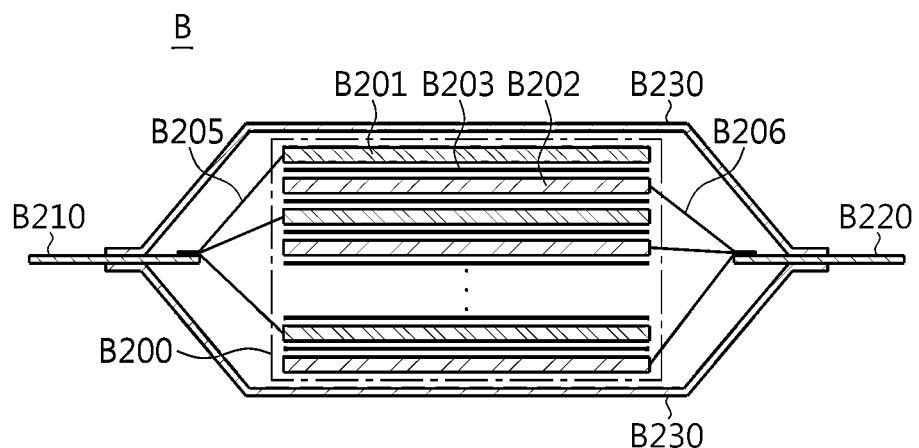
FIG. 11 is a diagram exemplarily showing a schematic configuration of a battery cell referred to in various embodiments of the present disclosure.
Figure 12:
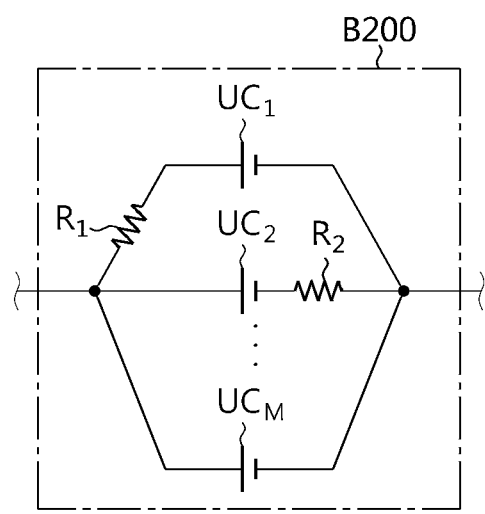
FIG. 12 is a diagram for illustrating a first capacity abnormality (incomplete disconnection failure) of a battery cell referred to in various embodiments of the present disclosure.
Figure 13:
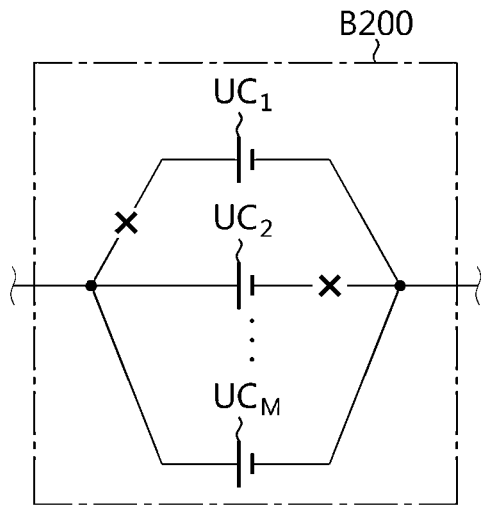
FIG. 13 is a diagram for illustrating a second capacity abnormality (complete disconnection failure) of a battery cell referred to in various embodiments of the present disclosure.

FIG. 11 is a diagram exemplarily showing a schematic configuration of the battery cell shown in FIG. 3, FIG. 12 is a diagram referred to for illustrating a first capacity abnormality (incomplete disconnection failure) of a battery cell, and FIG. 13 is a diagram referred to for illustrating a second capacity abnormality (complete disconnection failure) of a battery cell.

Referring to FIG. 11, the battery B includes an electrode assembly B200, a positive electrode lead B210, a negative electrode lead B220, and an exterior B230.

The electrode assembly B200 is an example of parallel connection of a plurality of unit cells BUC1 to UCM (M is a natural number of 2 or more). The unit cell BUC includes a separator B203, a positive electrode plate B201, and a negative electrode plate B202 insulated from the positive electrode plate B201 by a separator B203.

The positive electrode plate B201 has a positive electrode tab B205 that is a portion connected to one end of the positive electrode lead B210, and the negative electrode plate B202 has a negative electrode tab B206 that is a portion connected to one end of the negative electrode lead B220.

In a state where the positive electrode tabs B205 and the negative electrode tabs B206 of the plurality of unit cells UC1 to UCM are coupled to one end of the positive electrode lead B210 and the negative electrode leads B220, respectively, the electrode assembly B200 is accommodated in the exterior B230 together with an electrolyte. The other ends of the positive electrode lead B210 and negative electrode lead B220 exposed to the outside of the exterior B230 are provided as a positive electrode terminal and a negative electrode terminal of the battery B, respectively.

Referring to FIG. 12, the first capacity abnormality of the electrode assembly B200 may mean a state in which the contact resistances R1, R2 between the unit cells UC1, UC2 and the electrode leads B210, B220 vary widely and irregularly since a minor damage and/or incomplete disconnection failure occurs in the electrode tabs B205, B206 of some unit cells UC1, UC2 among the plurality of unit cells UC1 to UCM.

The incomplete disconnection failure may mean a state in which disconnected parts of the electrode tabs B205, B206 do not maintain a state of being separated from each other, the disconnected parts are flexibly connected and separated according to the contraction-expansion of the battery B, and the contact area during connection is also variable.

While the contact resistance in the unit cells UC1, UC2 is kept small, all unit cells UC1 to UCM are charged and discharged almost equally, and as the contact resistances R1, R2 increase, the unit cells UC1, UC2 closely come into a state of being separated (disconnected) from the remaining unit cells UC3 to UCM, and as a result, the capacity of the battery B shows an irregular behavior of rapidly increasing or decreasing depending greatly on the contact resistances R1, R2 of the unit cells UC1, UC2. For example, while a large tensile force acts between the electrode tabs B205, B206 of the unit cells UC1, UC2 and the electrode leads B210, B220 due to swelling of the battery B, the contact resistances R1, R2 of the unit cells UC1, UC2 increase, and conversely, as the tensile force gradually decreases, the contact resistances R1, R2 of the unit cells UC1, UC2 decrease.

Referring to FIG. 13, the second capacity abnormality of the electrode assembly B200 is equalized to a state in which some unit cells UC1, UC2 among the plurality of unit cells UC1 to UCM are irreversibly broken, namely in which the charging and discharging current path between the unit cells UC1, UC2 and the electrode leads B210, B220 is irreversibly lost due to a complete disconnection failure of the unit cells UC1, UC2.

The complete disconnection failure is a state in which the electrode tabs B205, B206 or the electrode plates B201, B202 of the unit cells UC1, UC2 are cut into multiple parts that are spaced apart so as not to be reconnected, and is distinguished from the aforementioned incomplete disconnection failure.

The occurrence of a second capacity abnormality by the unit cells UC1, UC2 at a certain time during manufacture or use of the battery B may mean that the unit cells UC1, UC2 are irretrievably removed from the electrode leads B210, B220. Thus, from the specific time when the second capacity abnormality occurs, the unit cells UC1, UC2 do not contribute to the charging and discharging of the battery B at all, so the capacity of the battery B depends only on the capacity of the remaining unit cells UC3 to UCM excluding the unit cells UC1, UC2.

The external device 2000 may repeat periodically or aperiodically a procedure for determining an estimated capacity value representing the full charging capacity (FCC) of the battery cell by applying a capacity estimation model to the charging and discharging data. The external device 2000 may monitor a change over time of the estimated capacity value. The capacity estimation model is a kind of algorithm that receives charging and discharging data and provides an estimated capacity value as a corresponding output, and is a combination of several functions.

Specifically, the capacity estimation model may include (i) a first function that calculates a current integration value of the charging and discharging current of the battery B over a certain period or variable period in the past from the current time series of the battery B, (ii) a second function that calculates an OCV (Open Circuit Voltage) of the battery B over a certain period or variable period in the past from the voltage time series and/or the current time series of the battery B, (iii) a third function that calculates a SOC (State Of Charge) of the battery B from the OCV of the battery B using a given OCV-SOC relationship table, and (iv) a fourth function that calculates an estimation result of the full charging capacity of the battery B, namely an estimated capacity value, from the ratio of the current integration value and the SOC change value respectively calculated for a common period. Equation 12 below is an example of the fourth function.

$$FCC_{t2} = \frac{\Delta Ah_{t1-t2}}{\Delta SOC_{t1-t2}} \qquad <\text{Equation 12}>$$

In the above equation, $\Delta Ah_{t1-t2}$ is a current integration value of the charging and discharging current repeatedly measured over a time range between two times t1 and t2, $\Delta SOC_{t1-t2}$ is a SOC change value over the time range between two times t1 and t2, and $FCC_{t2}$ is an estimated capacity value representing the full charging capacity at time t2. Time t1 may be a recent time that precedes time t2 and satisfies that the absolute value of $\Delta Ah_{t1-t2}$ is greater than or equal to a criterion integration value and/or that the absolute value of $\Delta SOC_{t1-t2}$ is greater than or equal to a criterion change value. The criterion integration value and the criterion change value may be predetermined in order to prevent deterioration in accuracy of $FCC_{t2}$ due to a very small absolute value of $\Delta Ah_{t1-t2}$ and/or $\Delta SOC_{t1-t2}$.

In calculating the current integration value, the charging current may be set as a positive number and the discharging current may be set as a negative number. Time t2 is a calculation timing of the full charging capacity. If the full charging capacity is repeatedly calculated at every first time interval, it will be easily understood by those skilled in the art that time t2 is shifted to the first time interval.

For example, when the current integration value and the SOC change value over a common period in the past are +100 Ah [ampere-hour] and +80%, respectively, the estimated capacity value of the full charging capacity is 125 Ah. As another example, if the current integration value and the SOC change value over a common period in the past are −75 Ah [ampere-hour] and −60%, respectively, the estimated capacity value of the full charging capacity is also 125 Ah.

The full charging capacity represents a maximum storage capacity of the battery B, namely a remaining capacity of the battery B at SOC 100%. It is normal that the full charging capacity slowly decreases as the battery B degrades. Therefore, when the amount of reduction in the full charging capacity for a short time interval exceeds a certain level, it represents that a first capacity abnormality or a second capacity abnormality occurs.

Figure 14:
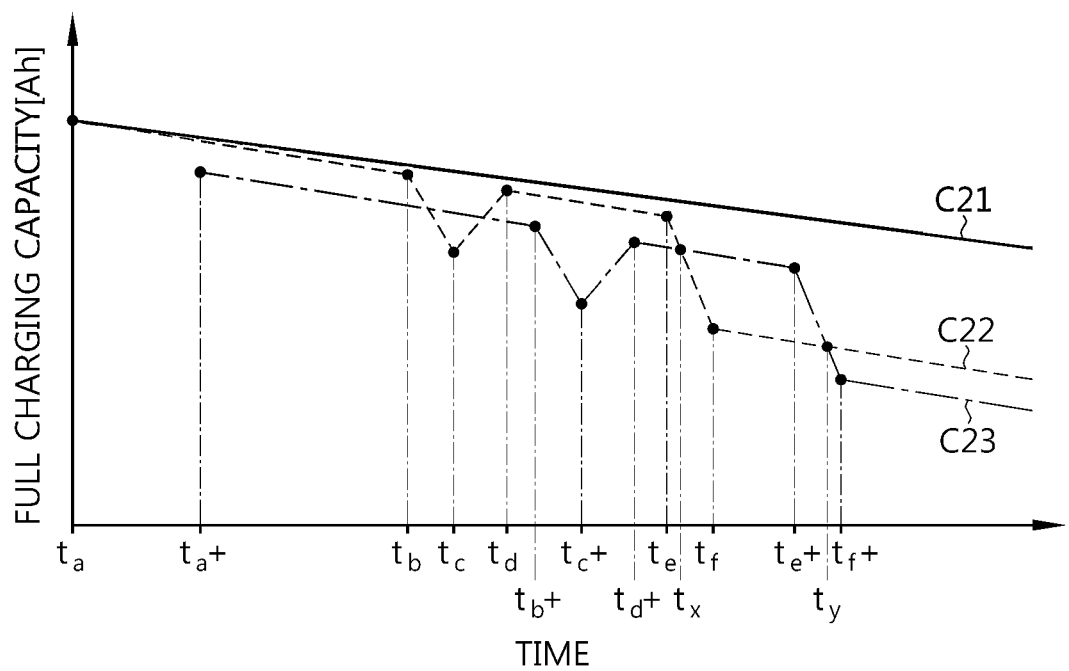
FIG. 14 is an exemplary diagram for illustrating a relationship between a capacity abnormality and a full charging capacity of a battery cell referred to in various embodiments of the present disclosure.

FIG. 14 is an exemplary diagram referred to for illustrating a relationship between the capacity abnormality and the full charging capacity of the battery cell.

Referring to FIG. 14, the curve C21 illustrates a change over time of the full charging capacity of a normal battery cell. For better understanding, the curve C21 is simplified to show that the full charging capacity of a normal battery cell decreases linearly over time.

The curve C22 exemplifies a change over time of the full charging capacity of the battery B when the first capacity abnormality and the second capacity abnormality occur sequentially. As shown in FIG. 12, the curve C22 represents the full charging capacity of the battery B in which a first capacity abnormality occurs due to a minute damage and/or incomplete disconnection failure of the unit cells UC1, UC2. In the curve C22, the full charging capacity gradually decreases from time ta (e.g., release time of the battery cell) to time tb, then decreases rapidly from time tb to time tc, and then increases rapidly from time tc to time td. That is, the decrease amount of the full charging capacity between time tb and time tc is mostly recovered between time tc and time td. As described above with reference to FIG. 12, this is because the contact resistances R1, R2 of the unit cells UC1, UC2 increase rapidly between time tb and time tc and then return to normal levels between time tc and time td.

This means that if the first capacity abnormality lasts for a long term, it may develop (intensify) into the second capacity abnormality. Seeing the curve C22, after time td, from time te to time tf, similar to the previous period from time tb to time tc, the full charging capacity rapidly decreases. However, in contrast to the behavior at times tc to td, even after time tf when the rapid decrease of the full charging capacity stops, the curve C22 has a similar slope to the curve C21 in a state where the full charging capacity does not recover to a normal level. As described above with reference to FIG. 13, this is because the complete disconnection failure of the unit cells UC1, UC2, namely the second capacity abnormality, occurs near time te.

The external device 2000 judges whether the first capacity abnormality and/or the second capacity abnormality of the parallel connection B200 occurs by monitoring the full charging capacity according to the curve C22, namely the change over time (time series) of the estimated capacity value.

Specifically, the external device 2000 judges whether the first capacity abnormality and/or the second capacity abnormality of the parallel connection B200 occurs by applying a diagnostic logic to two estimated capacity values at the first time and the second time, which are shifted to the first time interval with a second time interval equal to or greater than the first time interval. The second time is a time behind the first time by the second time interval, and the first time and the second time may be set by the external device 2000 to increase by the first time interval for each first time interval. The first time interval may be equal to the collection period of the charging and discharging data (or the calculation period of the estimated capacity value), and the second time interval may be an integer multiple (e.g., 10 times) of the first time interval.

The diagnostic logic may include (i) a first routine that determines a threshold capacity value for the second time to be smaller than the estimated capacity value at the first time, and (ii) a second routine that compares the estimated capacity value at the second time with the threshold capacity value for the second time.

In the first routine, the threshold capacity value for the second time may be equal to the result of subtracting a criterion capacity value from the estimated capacity value at the first time or the result of multiplying the estimated capacity value at the first time by a criterion factor less than 1. The criterion capacity value may be recorded in a memory 120 as a predetermined value in consideration of the total number M of the plurality of unit cells UC1 to UCM included in the battery B and the design capacity of the battery B (full charging capacity in a new state). The criterion factor may be recorded in a memory 120 as a predetermined value (e.g., (M−1)/M, (M−2)/M) in consideration of the total number M of the plurality of unit cells UC1 to UCM included in the battery B. The curve C23 of FIG. 14 illustrates the change over time of the threshold capacity value calculated by applying the first routine to the curve C22.

If the estimated capacity value at the second time is less than the threshold capacity value for the second time, the external device 2000 may judge that at least one of the first capacity abnormality and the second capacity abnormality has occurred in the parallel connection B200. In addition, the external device 2000 may generate second information representing whether or not there is a parallel connection abnormality.

Specifically, the external device 2000 may increase a diagnosis count by 1 whenever the estimated capacity value at the second time is less than the threshold capacity value for the second time. The calculation circuit 130 may reset the diagnosis count to an initial value (e.g., 0) or decrease the diagnosis count by 1 whenever the estimated capacity value at the second time is greater than or equal to the threshold capacity value for the second time. In response to that the estimated capacity value at the second time before the diagnosis count reaches the threshold count is recovered to the threshold capacity value for the second time or higher, the external device 2000 may judge that the abnormality type of the parallel connection B200 is the first capacity abnormality. In response to that the diagnosis count reaches the threshold count (e.g., 5), the external device 2000 may judge that the second capacity abnormality of the parallel connection B200 has occurred.

In FIG. 14, times ta+, tb+, tc+, td+, te+, and tf+ are times shifted in the positive direction by the second time interval from times ta, tb, tc, td, te, and tf, respectively. Over the time range between time tx and time ty, the curve C22 lies below the curve C22. Therefore, from time tx to time ty, the diagnosis count increases by 1 for each first time interval. The external device 2000 may activate a predetermined protection function related to the second capacity abnormality of the battery B in response to the diagnosis count reaching the threshold count before time ty.

Finally, an embodiment in which the diagnostic information of the battery cell included in the second information is information about the internal short circuit of the battery cell will be described.

The second information may represent whether the battery cell has an internal short circuit based on a first SOC change and a criterion factor of the battery cell. Here, the criterion factor may be determined by applying a statistical algorithm to the first SOC change of at least two battery cells among the plurality of battery cells. Here, the first SOC change may be a difference between a first SOC at a first charging time point of each battery cell and a second SOC at a second charging time point. Here, the first SOC may be estimated by applying a SOC estimation algorithm to a state parameter of the battery cell at the first charging time point. Here, the second SOC may be estimated by applying the SOC estimation algorithm to the state parameter of the battery cell at the second charging time point. Here, the state parameter may be obtained based on the first information.

The storage unit 2100 may obtain a state parameter of each of the plurality of battery cells by using information included in the first information. The state parameter may include voltage, current, and/or temperature of the battery cell BC.

The third control unit 2200 may monitor a SOC change of the battery cell BC during a charging period, a discharging period, and/or an idle period of the battery pack 10 by applying a SOC estimation algorithm to the state parameter of the battery cell BC. For example, as the SOC estimation algorithm, an OCV-SOC relationship map or a Kalman filter may be used. The OCV-SOC relationship map and the Kalman filter are widely used techniques for SOC estimation, and thus will not be described in detail.

The third control unit 2200 may determine the first SOC change, which is a difference between the first SOC at the first charging time point and the second SOC at the second charging time point, for each battery cell BC by applying the SOC estimation algorithm to the state parameters of each of the plurality of battery cells $BC_1$ to $BC_N$ obtained during charging. The first charging time point and the second charging time point are not particularly limited as long as they are two different time points within the latest charging period.

The third control unit 2200 may determine a criterion factor by applying a statistical algorithm to the first SOC changes of at least two battery cells among the plurality of battery cells. The criterion factor may be a representative value for the first SOC changes of at least two battery cells among the plurality of battery cells $BC_1$ to $BC_N$. For example, the criterion factor may be an average value or a median value of the first SOC changes of at least two battery cells among the plurality of battery cells.

The third control unit 2200 may detect an internal short circuit abnormality of each battery cell based on the first SOC change of each battery cell and the criterion factor. Also, the diagnostic information of the battery cell corresponding to whether or not the battery cell has an internal short circuit may be included in the second information.

Hereinafter, a method of detecting an internal short circuit abnormality by the external device 2000 will be described in detail with reference to FIGS. 15 to 18.

Figure 15:
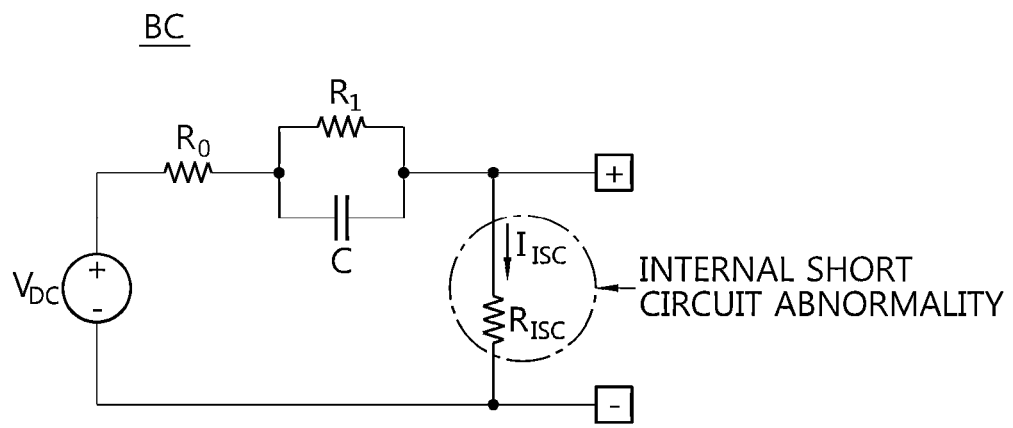
FIG. 15 is a reference diagram for illustrating an exemplary equivalent circuit of a battery cell referred to in various embodiments of the present disclosure.

FIG. 15 is a diagram referred to for explaining an exemplary equivalent circuit of a battery cell. In this specification, a normal battery cell refers to a battery cell having no internal short circuit abnormality among the plurality of battery cells $BC_1$ to $BC_N$, and an abnormal battery cell refers to a battery cell having an internal short circuit abnormality among the plurality of battery cells $BC_1$ to $BC_N$.

Referring to FIG. 15, a normal battery cell may be equivalent as a series circuit of a DC voltage source ($V_{DC}$), an internal resistance component ($R_0$), and an RC pair ($R_1$, C). In comparison, an abnormal battery cell may be equivalent to a battery cell in which an additional resistance component ($R_{ISC}$) is connected between both ends of a series circuit corresponding to a normal battery cell. The additional resistance component ($R_{ISC}$) acts as a path for a leakage current ($I_{ISC}$).

When an abnormal battery cell is charged, some of the charging power is consumed as a leakage current ($I_{ISC}$) without being stored in the abnormal battery cell. Also, when an abnormal battery cell is discharged, some of the discharging power is consumed as a leakage current ($I_{ISC}$) without being supplied to an electric load. For reference, when the abnormal battery cell is idle, the energy stored in the abnormal battery cell is consumed as a leakage current ($I_{ISC}$), similar to discharging. The decrease in the resistance value of the resistor ($R_{ISC}$) means an increase in internal short circuit abnormality, and as the internal short circuit abnormality worsens, the amount of power consumed as a leakage current ($I_{ISC}$) may increase.

As a result, during charging, the voltage change (i.e., the increase amount of SOC) of the abnormal battery cell is smaller than that of the normal battery. Meanwhile, during discharging, the voltage change (i.e., the decrease amount of SOC) of the abnormal battery cell is greater than that of the normal battery cell.

Figure 16:
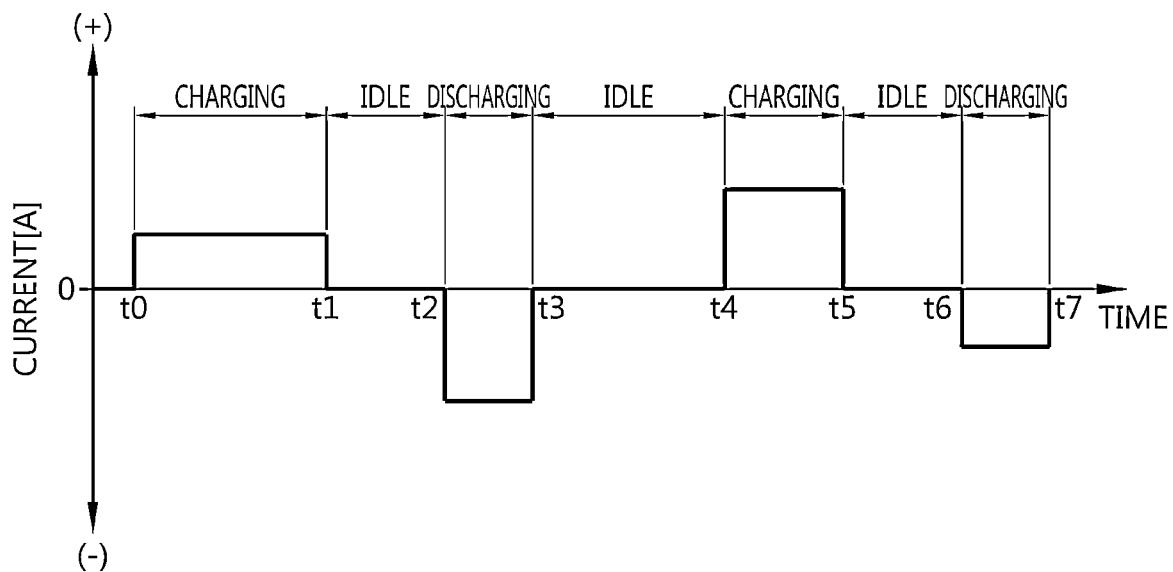
FIG. 16 is an exemplary graph for comparing SOC changes of a battery cell according to the presence or absence of an internal short circuit abnormality referred to in various embodiments of the present disclosure.

FIGS. 16 to 18 are exemplary graphs referred to for comparing SOC changes of the battery cell according to the presence or absence of an internal short circuit abnormality. FIGS. 16 to 18 respectively illustrate the change of the charging and discharging current, the voltage of the battery cell BC, and the SOC of the battery cell BC in the same period.

Referring to FIG. 16, the time point t0 and the time point t4 represent time points at which an idle state is switched to a charging state, the time point t1 and the time point t5 represent time points at which a charging state is switched to an idle state, the time point t2 represents a time point at which an idle state is switched to a discharging state, and the time point t3 represents a time point at which a discharging state is switched to an idle state. That is, in FIG. 16, the period from the time point t0 to the time point t1 and the period from the time point t4 to the time point t5 are a charging period, the period from the time point t2 to the time point t3 is a discharging period, and the remaining period is a rest period. For convenience of explanation, in FIG. 16, a positive value is assigned to the charging current of each charging period, a negative value is assigned to the discharging current of the discharging period, and the current in each period is illustrated as being constant.

In FIG. 17, a curve VC2 represents a voltage curve of a normal battery cell corresponding to the current curve shown in FIG. 16, and a curve VC3 represents a voltage curve of an abnormal battery cell corresponding to the current curve shown in FIG. 16. The curve VC2 may be treated as a time series of an average voltage of the plurality of battery cells $BC_1$ to $BC_N$. The external device 2000 may periodically or aperiodically obtain a state parameter of each of the plurality of battery cells $BC_1$ to $BC_N$ and record a time series of the state parameter in the storage unit 2100.

Referring to FIG. 17, in the charging period, the voltages of both the normal battery cell and the abnormal battery cell gradually increase. However, since the abnormal battery cell has a lower charging power capacity than the normal battery cell, the voltage increase of the abnormal battery cell is smaller than that of the normal battery cell.

In the discharging period, the voltages of both the normal battery cell and the abnormal battery cell gradually decreases. However, in the abnormal battery cell, an additional power is consumed due to the leakage current ($I_{ISC}$) in addition to the discharging power of the normal battery cell, so the voltage decrease amount of the abnormal battery cell is greater than that of the normal battery cell.

In FIG. 18, the curve VC4 represents a SOC curve of a normal battery cell corresponding to the voltage curve VC2 shown in FIG. 17, and the curve VC5 represents a SOC curve of an abnormal battery cell corresponding to the voltage curve VC3 shown in FIG. 17. The curve VC4 may also be treated as a time series of an average SOC of the plurality of battery cells $BC_1$ to $BC_N$.

The external device 2000 may monitor a SOC change of the battery cell BC during a charging period, a discharging period, and/or an idle period of the battery pack 10 by applying a SOC estimation algorithm to the state parameter of the battery cell BC. For example, as the SOC estimation algorithm, an OCV-SOC relationship map or a Kalman filter may be used. The OCV-SOC relationship map and the Kalman filter are widely used techniques for SOC estimation, and thus will not be described in detail.

Referring to FIG. 18, in the charging period, the abnormal battery cell has a smaller SOC increase rate and amount than the normal battery cell. In the discharging period, the abnormal battery cell has a higher SOC drop rate and amount than the normal battery cell. In addition, in the idle period, the SOC of the normal battery cell is generally constant, while the SOC of the abnormal battery cell is gradually decreasing even though the charging and discharging current does not flow.

The external device 2000 may execute a diagnosis process for detecting an internal short circuit abnormality of the battery cell BC based on the SOC changes of all of the plurality of battery cells $BC_1$ to $BC_N$ in a recent charging period, whenever the battery pack 10 is charged. For example, when the external device 2000 switches from charging to idle at the time point t1, the internal short circuit abnormality of the battery cell BC may be detected based on the SOC changes of all of the plurality of battery cells $BC_1$ to $BC_N$ obtained during the charging period (t0 to t1).

As another example, when the external device 2000 switches from charging to idle at time point t5, an internal short circuit abnormality may be detected based on the SOC changes of all of the plurality of battery cells $BC_1$ to $BC_N$ obtained in the recent charging period (t4 to t5).

Alternatively, whenever the battery pack 10 is charged or discharged, the external device 2000 may execute a diagnostic process for detecting an internal short circuit abnormality of the battery cell BC based on the SOC changes of all of the plurality of battery cells $BC_1$ to $BC_N$ in the recent charging period and the SOC changes of all of the plurality of battery cells $BC_1$ to $BC_N$ in the recent discharging period.

For example, when the external device 2000 switches from the discharging state to the idle state at time point t3, the external device 2000 may detect an internal short circuit abnormality of the battery cell BC based on the SOC changes of all of the plurality of battery cells $BC_1$ to $BC_N$ obtained in the recent charging period (t0 to t1) and on the SOC changes of all of the plurality of battery cells $BC_1$ to $BC_N$ obtained in the recent discharging period (t2 to t3).

As another example, when switching from the charging state to the idle state at time point t5, the external device 2000 may detect an internal short circuit abnormality of the battery cell BC based on the SOC changes of all of the plurality of battery cells $BC_1$ to $BC_N$ obtained in the recent discharging period (t2 to t3) and the SOC changes of all of the plurality of battery cells $BC_1$ to $BC_N$ obtained in the recent charging period (t4 to t5).

In FIGS. 16 to 18, the idle mode is located between the charging period and the discharging period, but this is only one example. For example, it is possible to switch from a charging state to a discharging state without an idle state, or from a discharging state to a charging state without an idle state.

Hereinafter, a battery cell abnormal state diagnosis method of the present disclosure using the battery cell diagnosing apparatus 1000 and the external device 2000 will be described in detail. The operation of the control circuit 220 will be described in more detail in various embodiment (s) of the battery diagnosing method.

In this specification, what the external device 2000 performs, it may include that the third control unit 2200 performs.

Hereinafter, a battery cell diagnosing method abnormal state using the battery cell diagnosing apparatus 1000 and the external device 2000 of the present disclosure described above will be described in detail. The operation of the control circuit 220 will be described in more detail in various embodiment(s) of the battery diagnosis method.

Figure 19:
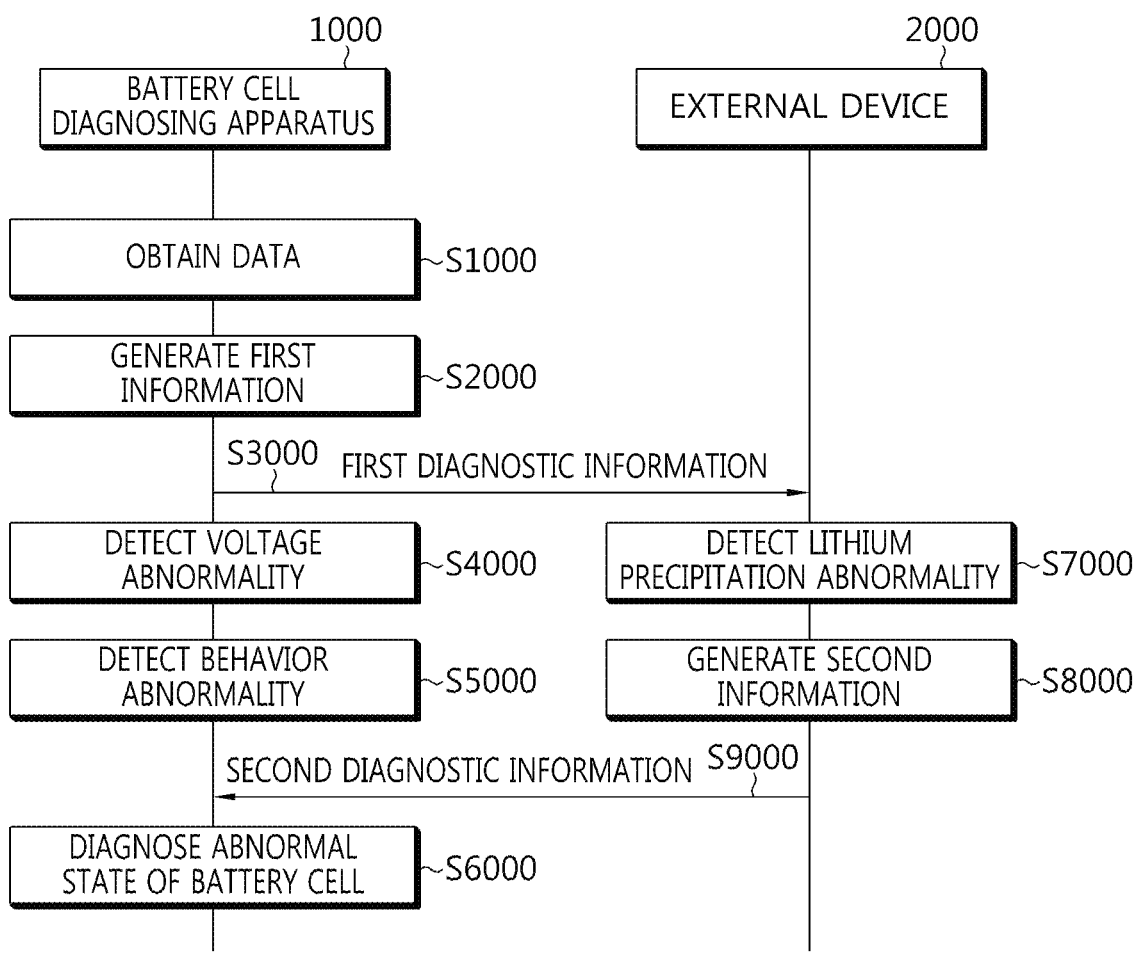
FIG. 19 is a flowchart in which the battery cell diagnosing apparatus according to an embodiment of the present disclosure diagnoses an abnormal state of a battery cell using the external device.

FIG. 19 is a flowchart in which the battery cell diagnosing apparatus 1000 according to an embodiment of the present disclosure diagnoses an abnormal state of a battery cell using the external device 2000.

In the step S1000, the battery cell diagnosing apparatus 1000 may obtain data. For example, the battery cell diagnosing apparatus 1000 may obtain data measured by the current measuring unit 100 or the voltage sensing unit 200 using the data obtaining unit 300. Specifically, the battery cell diagnosing apparatus 1000 may obtain data on at least one of the charging current, discharging current, and voltage signal measured by the current measuring unit 100 or the voltage sensing unit 200 by using the data obtaining unit 300. In addition, the battery cell diagnosing apparatus 1000 may obtain data on the temperature signal detected by the temperature sensor T using the data obtaining unit 300.

In the step S2000, the battery cell diagnosing apparatus 1000 may generate first information. For example, the battery cell diagnosing apparatus 1000 may generate the first information of the battery cell based on the data obtained in the step S1000. The first information may include data about at least one of a charging current, a discharging current, and a voltage signal of a battery cell that is a target of abnormality judgment.

In the step S3000, the battery cell diagnosing apparatus 1000 may transmit the generated first information to the external device 2000.

In the step S4000, the battery cell diagnosing apparatus 1000 may detect voltage abnormality. This will be described in detail with reference to FIGS. 20 to 24.

In the step S5000, the battery cell diagnosing apparatus 1000 may detect behavior abnormality. This will be described in detail with reference to FIGS. 25 to 26.

In the step S7000, the external device 2000 may detect lithium precipitation abnormality. This will be described in detail with reference to FIGS. 27 to 32.

In the step S8000, the external device 2000 may generate second information. The second information may include whether lithium precipitation abnormality is detected.

In the step S9000, the external device 2000 may transmit the second information to the battery cell diagnosing apparatus 1000.

In the step S6000, the battery cell diagnosing apparatus 1000 may diagnose a battery cell abnormal state. The battery cell diagnosing apparatus 1000 may diagnose an abnormal state of the battery cell based on the voltage abnormality, the behavior abnormality, and the second information.

FIGS. 20 to 24 are flowcharts illustrating in detail a process of detecting voltage abnormality by the battery cell diagnosing apparatus 1000 according to an embodiment of the present disclosure.

Figure 20:
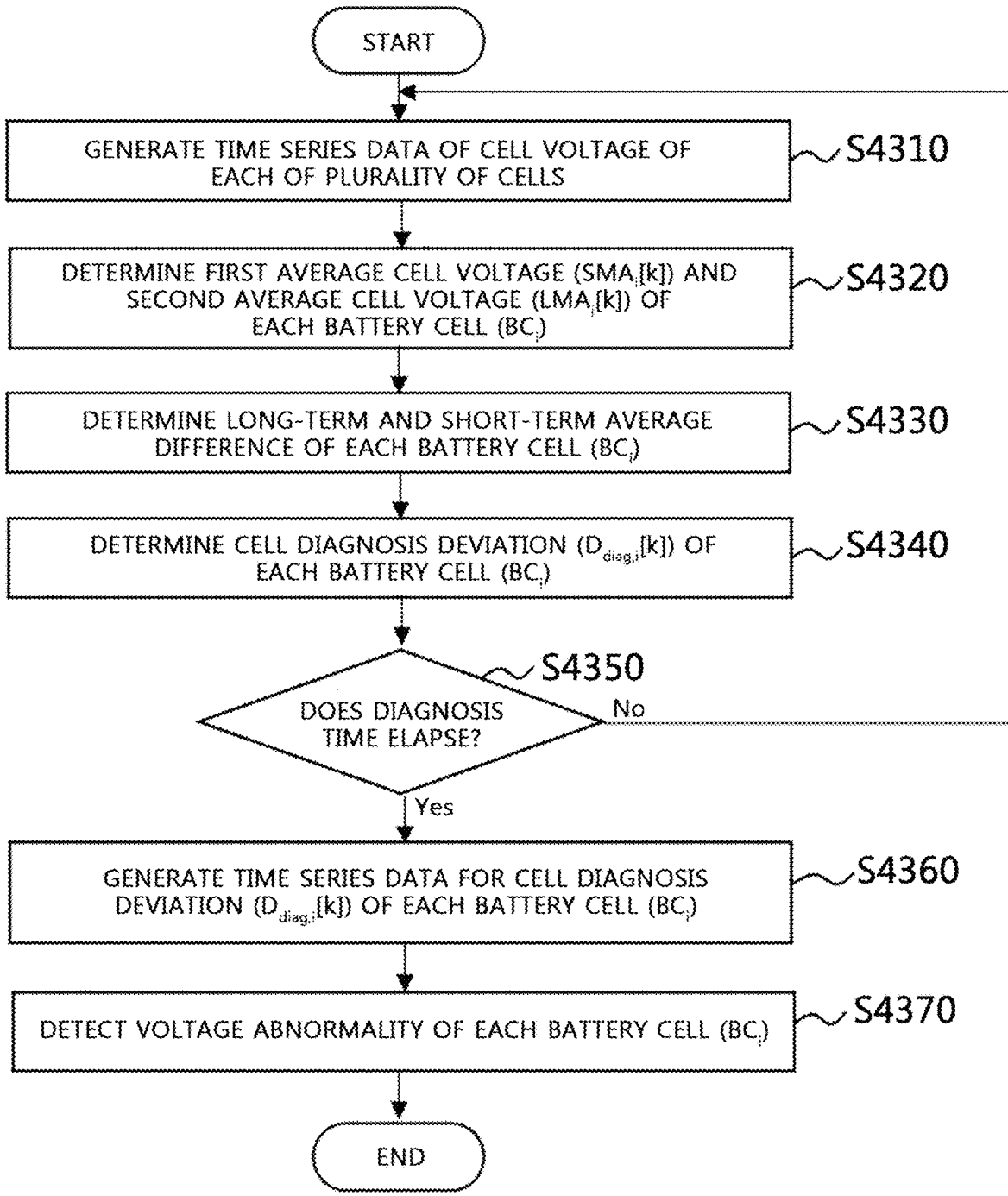
FIG. 20 is a flowchart exemplarily showing a method for detecting voltage abnormality according to an embodiment of the present disclosure.

FIG. 20 is a flowchart exemplarily showing a method for detecting voltage abnormality according to an embodiment of the present disclosure. The method of FIG. 20 may be periodically executed every unit time by the first control unit 400.

In the step S4310, the first control unit 400 may collect a voltage signal representing the cell voltage of each of the plurality of battery cells $BC_1$ to $BC_N$ included in the first information, and generate time series data of the cell voltage of each battery cell BC (see FIG. 4a). In the time series data of the cell voltage, the number of data may increase by 1 every time unit time elapses.

For example, $V_i[k]$ or $VD_i[k]$ of Equation 5 may be used as the cell voltage.

In the step S4320, the first control unit 400 may determine the first average cell voltage of (S4MAi[k], see Equation 1 and Equation 11) of each battery cell $BC_i$ and the second average cell voltage ($LMA_i[k]$, see Equation 3 and Equation 4), based on the time series data of the cell voltage of each battery cell $BC_i$ (see FIG. 4b).

The first average cell voltage (S4MAi[k]) may mean a short-term movement average of the cell voltage of each battery cell $BC_i$ over a first moving window having a first time length. The second average cell voltage ($LMA_i[k]$) may mean a long-term movement average of cell voltages of each battery cell $BC_i$ over a second moving window having a second time length. When calculating the first average cell voltage (S4MAi[k]) and the second average cell voltage ($LMA_i[k]$), $V_i[k]$ or $VD_i[k]$ may be used.

In the step S4330, the first control unit 400 may determine a long-term and short-term average difference (|S4MAi[k]−$LMA_i[k]$|) of each battery cell $BC_i$ (see FIG. 4c).

In the step S4340, the first control unit 400 may determine a cell diagnosis deviation (Ddiag,i[k]) of each battery cell $BC_i$. The cell diagnosis deviation (Ddiag,i[k]) may mean deviation of the average value (|S4MAi[k]−$LMA_i[k]$|av) of the long-term and short-term average differences for all battery cells and the long-term and short-term average difference (|S4MAi[k]−$LMA_i[k]$|) of the $i^{th}$ battery cell $BC_i$.

In the step S4350, the first control unit 400 may judge whether the diagnosis time has elapsed. The diagnosis time may be preset. If the judgment of the step S4350 is YES, the step S4360 proceeds, and if the judgment of the step S4350 is NO, the step S4310 to the step S4340 are repeated again.

In the step S4360, the first control unit 400 may generate time series data for the cell diagnosis deviation (Ddiag,i[k]) of each battery cell $BC_i$ collected during the diagnosis time.

In the step S4370, the first control unit 400 may detect voltage abnormality of each battery cell $BC_i$ by analyzing the time series data for the cell diagnosis deviation (Ddiag, i[k]).

In one example, the first control unit 400 may integrate a time region in which the cell diagnosis deviation (Ddiag,i[k]) is greater than the diagnosis threshold (e.g., 0.015) in the time series data for the cell diagnosis deviation (Ddiag,i[k]) of each battery cell $BC_i$, and detect a battery cell establishing the condition that the integration time is greater than a preset criterion time as a voltage abnormal cell.

For example, the first control unit 400 may integrate only a time region in which the condition that the cell diagnosis deviation (Ddiag,i[k]) is greater than the diagnosis threshold is continuously satisfied. If the corresponding time region is plural, the first control unit 400 may independently calculate the integration time for each time region.

In another example, the first control unit 400 may integrate the number of data in which the cell diagnosis deviation (Ddiag,i[k]) is greater than the diagnosis threshold (e.g., 0.015) in the time series data for the cell diagnosis deviation (Ddiag,i[k]) of each battery cell $BC_i$, and detect a battery cell establishing the condition that the data integration value is greater than a preset criterion count as a voltage abnormal cell.

The first control unit 400 may integrate only the number of data included in the time region in which the condition that the cell diagnosis deviation (Ddiag,i[k]) is greater than the diagnosis threshold is continuously satisfied. If the corresponding time region is plural, the first control unit 400 may independently integrate the number of data of each time region.

Figure 21:
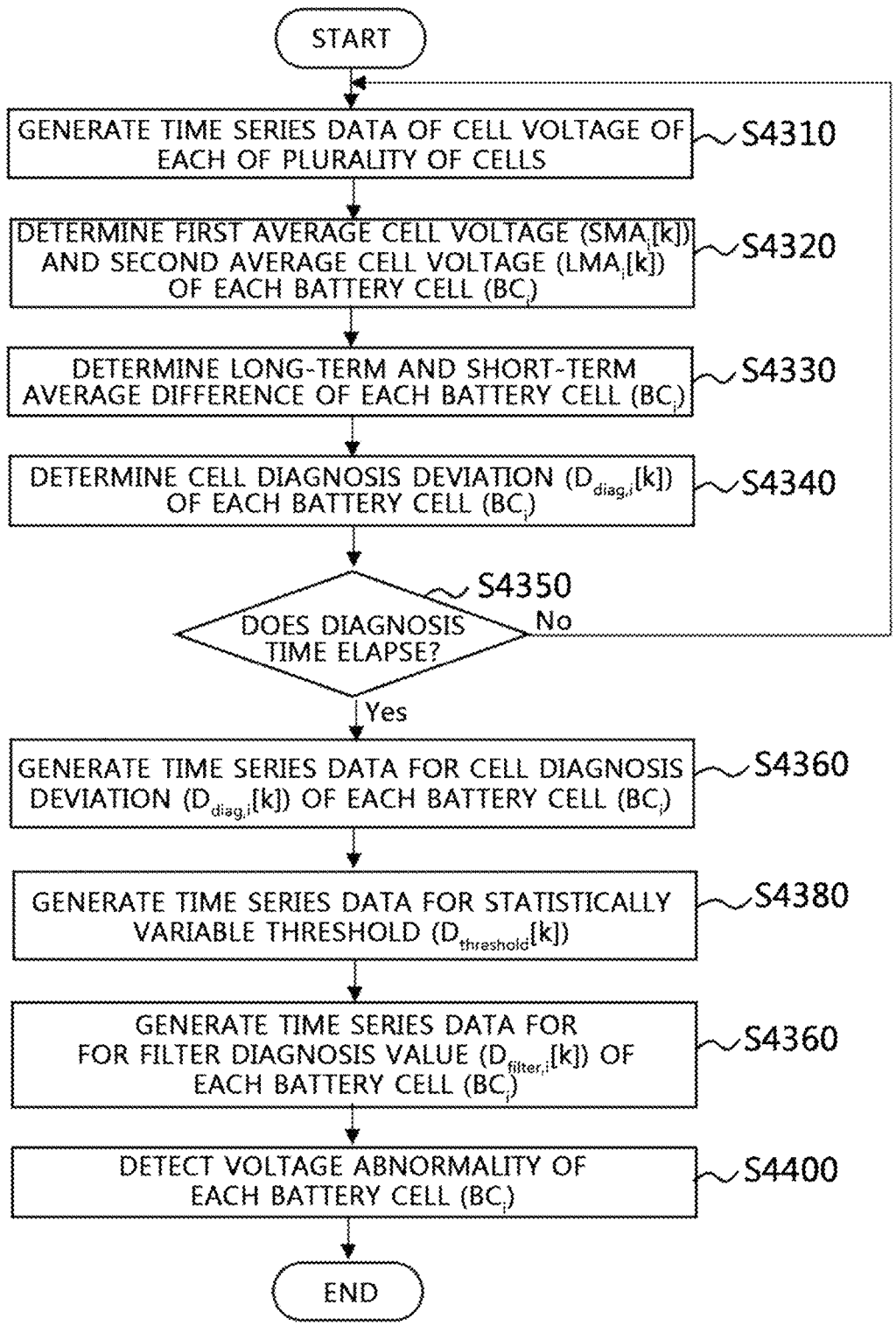
FIG. 21 is another flowchart exemplarily showing a method of detecting voltage abnormality according to an embodiment of the present disclosure.

FIG. 21 is another flowchart exemplarily showing a method of detecting voltage abnormality according to an embodiment of the present disclosure. The method of FIG. 21 may be periodically executed every unit time by the first control unit 400.

In the method of detecting the voltage abnormality of FIG. 21, the step S4310 to the step S4360 are substantially the same as the embodiment of FIG. 20, and thus a description thereof will be omitted. After the step S4360, the step S4380 proceeds.

In the step S4380, the first control unit 400 may generate time series data of a statistically variable threshold (Dthreshold[k]) using Equation 8. Inputs to the Sigma function of Equation 8 are time series data for the cell diagnosis deviation (Ddiag,i[k]) of all battery cells generated in the step S4360. Preferably, the maximum value of the cell diagnosis deviation (Ddiag,i[k]) may be excluded from the input value of the Sigma function. The cell diagnosis deviation (Ddiag,i[k]) is the deviation from the average value for the long-term and short-term average differences ($|SMA_i[k]-LMA_i[k]|$).

In the step S4390, the first control unit 400 may generate the time series data of the filter diagnosis value (Dfilter,i[k]) by filtering the cell diagnosis deviation (Ddiag,i[k]) of each battery cell $BC_i$ using Equation 9.

In using Equation 9, D*diag,i[k] may be replaced with Ddiag,i[k].

In the step S4400, the first control unit 400 may judge voltage abnormality of each battery cell $BC_i$ by analyzing the time series data of the filter diagnosis value (Dfilter,i[k]).

In one example, the first control unit 400 may integrate a time region in which the filter diagnosis value (Dfilter,i[k]) is greater than the diagnosis threshold (e.g., 0) in the time series data of the filter diagnosis value (Dfilter,i[k]) for each battery cell $BC_i$, and judge a battery cell establishing the condition that the integration time is greater than the preset criterion time as a voltage abnormal cell.

Preferably, the first control unit 400 may integrate only a time region in which the condition that the filter diagnosis value (Dfilter,i[k]) is greater than the diagnosis threshold is successively satisfied. If the corresponding time region is plural, the first control unit 400 may independently calculate the integration time for each time region.

In another example, the first control unit 400 may integrate the number of data included in a time region in which the filter diagnosis value (Dfilter,i[k]) is greater than the diagnosis threshold (e.g., 0) in the time series data of the filter diagnosis value (Dfilter,i[k]) for each battery cell $BC_i$, and detect a battery cell establishing the condition that the data integration value is greater than the preset criterion count as a voltage abnormal cell.

Preferably, the first control unit 400 may integrate only the number of data included in a time region in which the condition that the filter diagnosis value (Dfilter,i[k]) is greater than the diagnosis threshold is continuously satisfied. If the corresponding time region is plural, the first control unit 400 may independently integrate the number of data of each time region.

Figure 22:
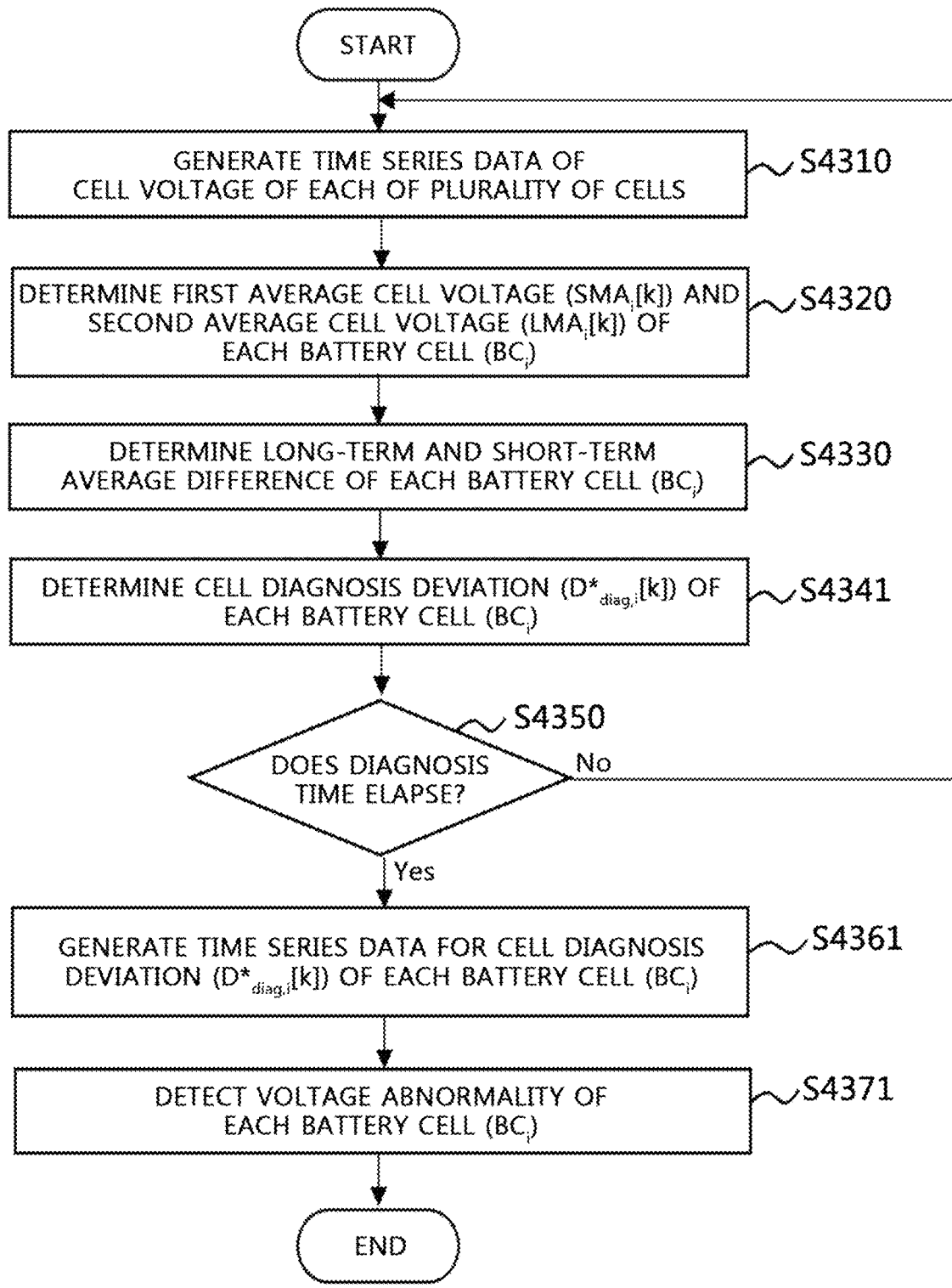
FIG. 22 is another flowchart exemplarily showing a method of detecting voltage abnormality according to an embodiment of the present disclosure.

FIG. 22 is still another flowchart exemplarily showing a method of detecting voltage abnormality according to an embodiment of the present disclosure. The method of FIG. 22 may be periodically executed every unit time by the first control unit 400.

The battery diagnosing method according to the third embodiment is substantially the same as the first embodiment, except that the steps S4340, S4360 and S4370 are changed to the steps S4341, S4361 and S4371, respectively. Accordingly, only configurations with differences will be described.

In the step S4341, the first control unit 400 may determine the normalized cell diagnosis deviation (D*diag,i[k]) for the long-term and short-term average difference ($|SMA_i[k]-LMA_i[k]|$) of each battery cell $BC_i$ using Equation 6. The normalization criterion value is the average value of the long-term and short-term average difference ($|SMA_i[k]-LMA_i[k]|$). Equation 6 can be replaced with Equation 7.

In the step S4361, the first control unit 400 may generate time series data for the normalized cell diagnosis deviation (D*diag,i[k]) of each battery cell $BC_i$ collected during the diagnosis time (see FIG. 4*d*).

In the step S4371, the first control unit 400 may detect voltage abnormality of each battery cell $BC_i$ by analyzing the time series data for the normalized cell diagnosis deviation (D*diag,i[k]).

In one example, the first control unit 400 may integrate a time region in which the cell diagnosis deviation (D*diag,i[k]) is greater than the diagnosis threshold (e.g., 4) in the time series data for the normalized cell diagnosis deviation (D*diag,i[k]) of each battery cell $BC_i$, and detect a battery cell establishing the condition that the integration time is greater than the preset criterion time as a voltage abnormal cell.

The first control unit 400 may integrate only a time region in which the condition that the normalized cell diagnosis deviation (D*diag,i[k]) is greater than the diagnosis threshold is continuously satisfied. If the corresponding time region is plural, the first control unit 400 may independently calculate the integration time for each time region.

In another example, the first control unit 400 may integrate the number of data in which the cell diagnosis deviation is greater than the diagnosis threshold (e.g., 4) in the time series data for the normalized cell diagnosis deviation (D*diag,i[k]) of each battery cell $BC_i$, and detect a battery cell establishing the condition that the data integration value is greater than the preset criterion count as a voltage abnormal cell.

The first control unit 400 may integrate only the number of data included in the time region in which the condition that the normalized cell diagnosis deviation (D*diag,i[k]) is greater than the diagnosis threshold is continuously satisfied. If the corresponding time region is plural, the first control unit 400 may independently integrate the number of data of each time region.

Figure 23:
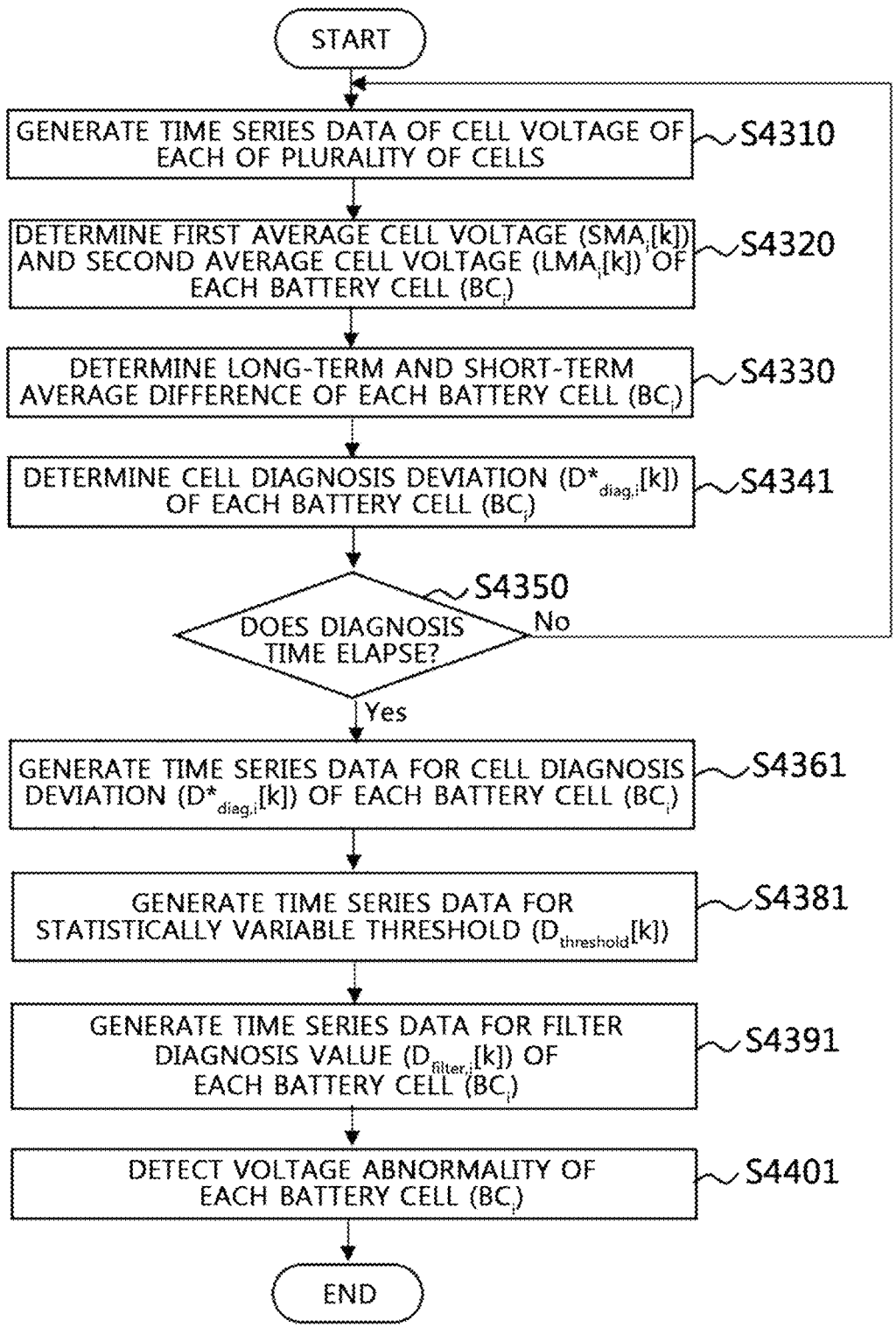
FIG. 23 is still another flowchart exemplarily showing a method of detecting voltage abnormality according to an embodiment of the present disclosure.

FIG. 23 is still another flowchart exemplarily showing a method of detecting voltage abnormality according to an embodiment of the present disclosure. The method of FIG. 23 may be periodically executed every unit time by the first control unit 400.

The battery diagnosing method according to FIG. 23 is substantially the same as in FIG. 21 except that the steps S4340, S4360, S4380, S4390, and S4400 are changed to the steps S4341, S4361, S4381, S4391, and S4401, respectively, and the rest configuration is substantially the same. Accordingly, only a configuration different from that of FIG. 21 will be described with respect to the embodiment of FIG. 23.

In the step S4341, the first control unit 400 may determine the normalized cell diagnosis deviation (D*diag,i[k]) for the long-term and short-term average difference ($|SMA_i[k]-LMA_i[k]|$) of each battery cell $BC_i$ using Equation 6. The normalization criterion value may mean an average value of the long-term and short-term average difference ($|SMA_i[k]-LMA_i[k]|$). Equation 6 can be replaced with Equation 7.

In the step S4361, the first control unit 400 may generate time series data for the normalized cell diagnosis deviation (D*diag,i[k]) of each battery cell $BC_i$ collected during the diagnosis time (see FIG. 4d).

In the step S4381, the first control unit 400 may generate time series data of the statistically variable threshold (Dthreshold[k]) using Equation 8. Inputs to the Sigma function of Equation 8 are time series data for the normalized cell diagnosis deviation (D*diag,i[k]) of all battery cells generated in the step S4361. According to an embodiment, at each time index, the maximum value of cell diagnosis deviation (D*diag,i[k]) may be excluded from the input value of the Sigma function.

In the step S4391, the first control unit 400 may generate time series data the diagnosis values (Dfilter,i[k]) by filtering the cell diagnosis deviation (D*diag,i[k]) of each battery cell $BC_i$ based on the statistically variable threshold (Dthreshold [k]) using Equation 9.

In the step S4401, the first control unit 400 may detect voltage abnormality of each battery cell $BC_i$ by analyzing the time series data of the filter diagnosis value (Dfilter,i[k]).

In one example, the first control unit 400 may integrate a time region in which that the filter diagnosis value (Dfilter, i[k]) is greater than the diagnosis threshold (e.g., 0) in the time series data of the filter diagnosis value (Dfilter,i[k]) for each battery cell $BC_i$, and detect a battery cell establishing the condition that the integration time is greater than the preset criterion time as a voltage abnormal cell.

For example, the first control unit 400 may integrate time regions in which the condition that the filter diagnosis value (Dfilter,i[k]) is greater than the diagnosis threshold is successively satisfied. If the corresponding time region is plural, the first control unit 400 may independently calculate the integration time for each time region.

In another example, the first control unit 400 may integrate the number of data included in a time region in which the filter diagnosis value (Dfilter,i[k]) is greater than the diagnosis threshold (e.g., 0) in the time series data of the filter diagnosis value (Dfilter,i[k]) for each battery cell $BC_i$, and detect a battery cell establishing the condition that the data integration value is greater than the preset criterion count as a voltage abnormal cell.

The first control unit 400 may integrate only the number of data included in the time region in which the condition that the filter diagnosis value (Dfilter,i[k]) is greater than the diagnosis threshold is continuously satisfied. If the corresponding time region is plural, the first control unit 400 may independently integrate the number of data of each time region.

Figure 24:
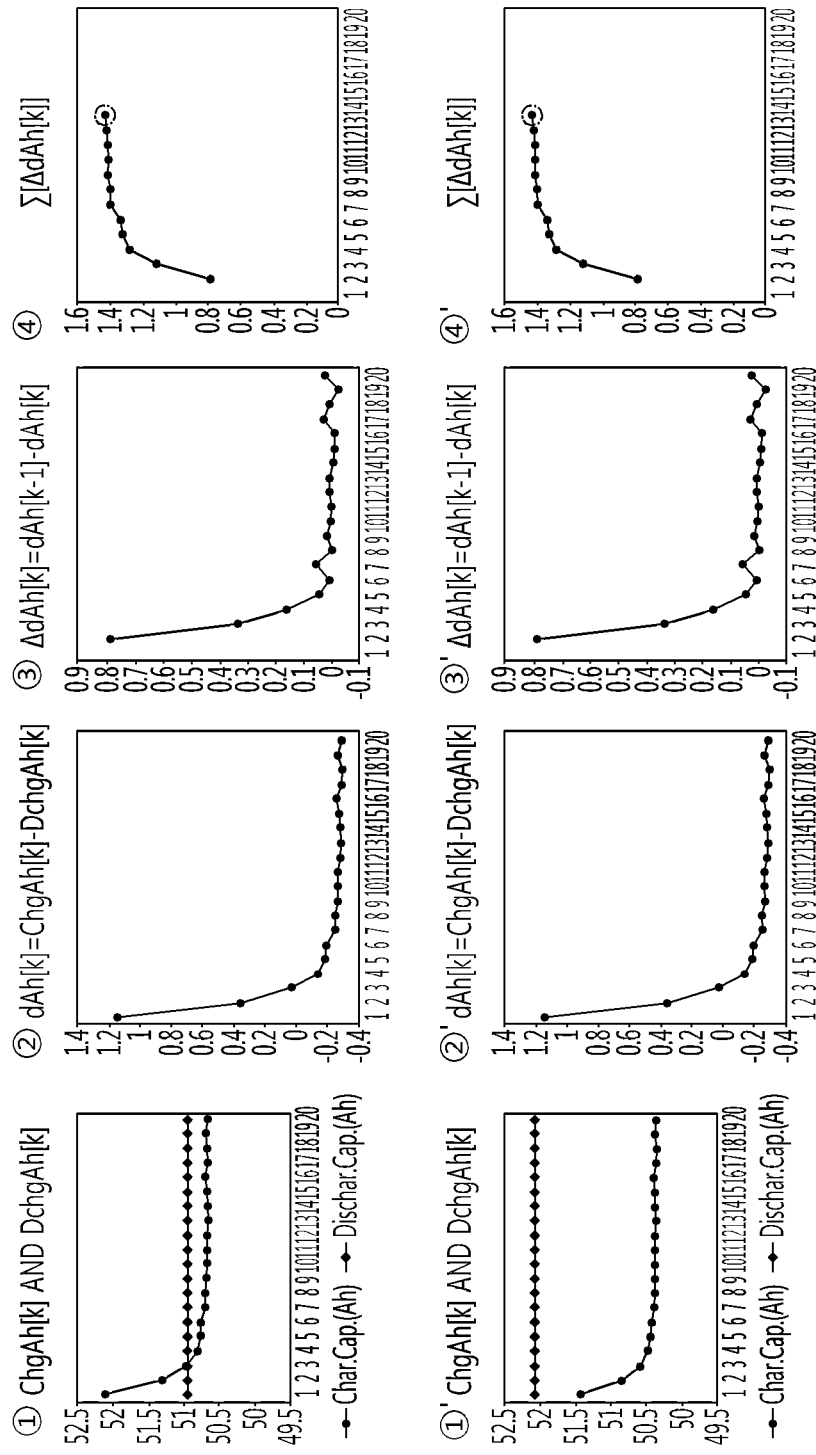
FIG. 24 is still another flowchart exemplarily showing a method of detecting voltage abnormality according to an embodiment of the present disclosure.

FIG. 24 is still another flowchart exemplarily showing a method of detecting voltage abnormality according to an embodiment of the present disclosure.

In FIG. 24, the step S4310 to the step S4361 are substantially the same as in FIG. 23. Accordingly, only the configuration different from that of FIG. 23 will be described.

In the step S4410, the first control unit 400 may generate time series data of the first moving average ($SMA_i[k]$) and time series data of the second moving average ($LMA_i[k]$) for the cell diagnosis deviation (D*diag,i[k]) using the time series data of the normalized cell diagnosis deviation (D*diag,i[k]) of each battery cell $BC_i$ (see FIG. 4f).

In the step S4420, the first control unit 400 may generate time series data of the normalized cell diagnosis deviation (D*diag,i[k]) using to the time series data of the first moving average ($SMA_i[k]$) and the time series data of the second moving average ($LMA_i[k]$) of each battery cell $BC_i$ using Equation 6 (see FIG. 4g).

In the step S4430, the first control unit 400 may generate time series data of the statistically variable threshold (Dthreshold[k]) using Equation 8 (see FIG. 4g).

In the step S4440, the first control unit 400 may generate time series data for the filter diagnosis value (Dfilter,i[k]) of each battery cell $BC_i$ based on the statistically variable threshold (Dthreshold[k]) using Equation 9 (see FIG. 4h).

In the step S4450, the first control unit 400 may detect voltage abnormality of each battery cell $BC_i$ by analyzing the time series data of the filter diagnosis value (Dfilter,i[k]) of each battery cell $BC_i$.

In one example, the first control unit 400 may integrate a time region in which the filter diagnosis value (Dfilter,i[k]) is greater than the diagnosis threshold (e.g., 0) in the time series data of the filter diagnosis value (Dfilter,i[k]) for each battery cell $BC_i$, and detect a battery cell establishing the condition that the integration time is greater than the preset criterion time as a voltage abnormal cell.

The first control unit 400 may integrate a time region in which the condition that the filter diagnosis value (Dfilter, i[k]) is greater than the diagnosis threshold is successively satisfied. If the corresponding time region is plural, the first control unit 400 may independently calculate the integration time for each time region.

The first control unit 400 may integrate the number of data included in the time region in which the filter diagnosis value (Dfilter,i[k]) is greater than the diagnosis threshold (e.g., 0) in the time series data of the filter diagnosis value (Dfilter,i[k]) for each battery cell $BC_i$, and detect a battery cell in which the data integration value is greater than the preset criterion count as a voltage abnormal cell.

The first control unit 400 may integrate only the number of data included in the time region in which the condition that the filter diagnosis value (Dfilter,i[k]) is greater than the diagnosis threshold is continuously satisfied. If the corresponding time region is plural, the first control unit 400 may independently integrate the number of data of each time region.

In FIG. 24, the first control unit 400 may recursively perform the step S4410 and the step S4420 twice or more. The first control unit 400 may generate time series data of the first moving average ($SMA_i[k]$) and time series data of the second moving average ($LMA_i[k]$) for the cell diagnosis deviation (D*diag,i[k]) in the step S4410 again by using the time series data of the normalized cell diagnosis deviation (D*diag,i[k]) generated in the step S4420.

The first control unit 400 may generate time series data of the normalized cell diagnosis deviation (D*diag,i[k]) based on Equation 6 again by using the time series data of the first moving average ($SMA_i[k]$) and the time series data of the second moving average ($LMA_i[k]$) of each battery cell $BC_i$ in the step S4420. Such a recursive algorithm may be repeated a predetermined number of times.

When the step S4410 and the step S4420 are performed according to the recursive algorithm, the step S4430 to the step S4450 may be implemented using the time series data of the cell diagnosis deviation (D*diag,i[k]) finally calculated through the recursive algorithm.

In an embodiment of the present disclosure, the first control unit 400 may detect voltage abnormality for all battery cells, and then, when voltage abnormality is detected in a specific battery cell(s), the first control unit 400 may generate third information including the detection result information. Also, the first control unit 400 may record the identification information ID of the battery cell in which the voltage abnormality is diagnosed, the time point in which the voltage abnormality is detected, and the detection flag in a memory unit (not shown).

The third information may include a message indicating that there is a cell with voltage abnormality in the cell group CG. Optionally, the third information may include a warning message indicating that a detailed check of the battery cells $BC_1$ to $BC_N$ is required.

According to the above-described embodiments, for each unit time, two moving averages of the cell voltage of each battery cell for two different time lengths are determined, and based on the difference between the two moving averages of each of the plurality of battery cells, voltage abnormality of each battery cell may be efficiently and accurately detected.

According to another aspect, voltage abnormality of each battery cell may be accurately detected by applying an advanced technique such as normalization and/or statistically variable threshold in analyzing the difference in the change trend of two moving averages of each battery cell.

According to still another aspect, it is possible to precisely detect the time region in which the voltage abnormality of each battery cell occurs and/or the voltage abnormality detection count by analyzing the time series data of the filter diagnosis value determined based on the statistically variable threshold.

As described above, the method for detecting voltage abnormality by the first control unit 400 included in the battery cell diagnosing apparatus 1000 has been reviewed. Hereinafter, a method for detecting behavior abnormality by the first control unit 400 included in the battery cell diagnosing apparatus 1000 will be reviewed.

Figure 25:
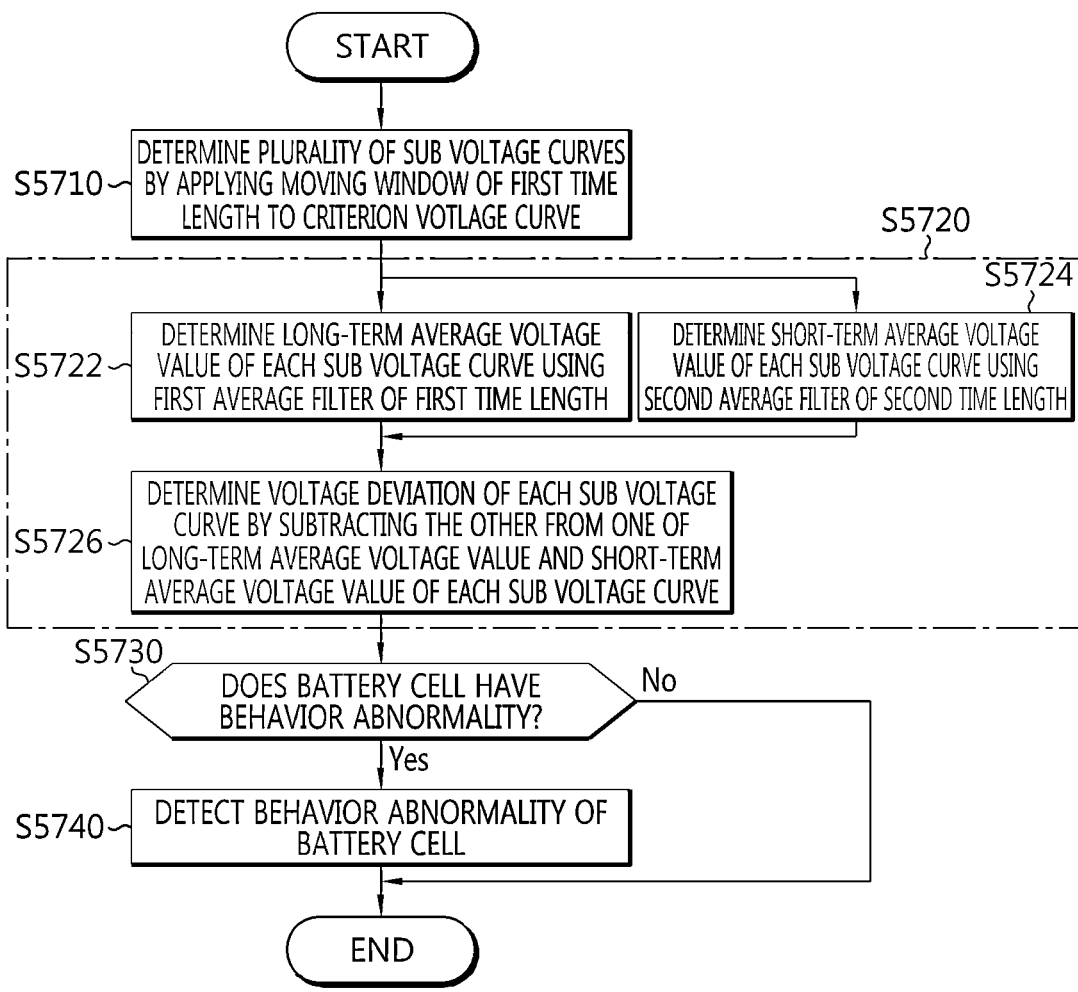
FIG. 25 is a flowchart exemplarily showing a method of detecting behavior abnormality according to an embodiment of the present disclosure.
Figure 26:
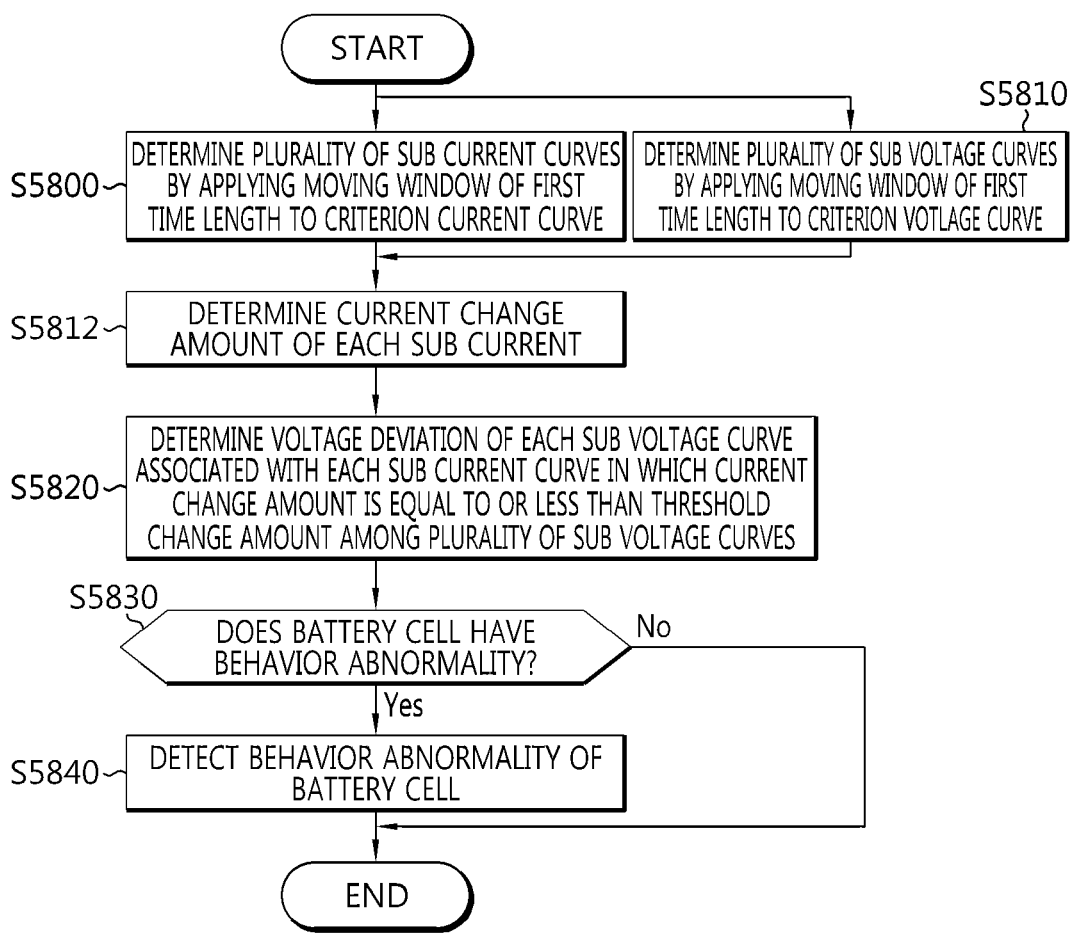
FIG. 26 is another flowchart exemplarily showing a method of detecting behavior abnormality according to an embodiment of the present disclosure.

FIGS. 25 and 26 are flowcharts illustrating in detail a process of detecting behavior abnormality by the battery cell diagnosing apparatus 1000 according to an embodiment of the present disclosure. FIG. 25 is a flowchart exemplarily showing a method of detecting behavior abnormality according to an embodiment of the present disclosure.

In the step S5710, the first control unit 400 determines a plurality of sub voltage curves by applying the moving window of the first time length A to the criterion voltage curve C2. The criterion voltage curve C2 is a time series of a plurality of voltage values representing the cell voltage of the battery cell BC measured at each sampling time for a predetermined period (t1 to tM).

In the step S5720, the first control unit 400 determines a voltage deviation ($\Delta V[K]$) associated with each sub voltage curve SK of the plurality of sub voltage curves. The step S5720 may include the steps S5722, S5724 and S5726 as sub-steps.

In the step S5722, the first control unit 400 may determine a long-term average voltage value (Vav1[K]) of the sub voltage curve SK by using the first average filter of the first time length A (see Equation 10).

In the step S5724, the first control unit 400 may determine a short-term average voltage value (Vav2[K]) of the sub voltage curve SK by using the second average filter of the second time length B (see Equation 11).

In the step S5726, the first control unit 400 may determine a voltage deviation ($\Delta V[K]$) by subtracting the other from one of the long-term average voltage value (Vav1[K]) and the short-term average voltage value (Vav2[K]).

In the step S5730, the first control unit 400 may judge whether the battery cell BC has behavior abnormality by comparing each of the plurality of voltage deviations determined for the plurality of sub voltage curves with at least one of a first threshold deviation and a second threshold deviation. When the value of the step S5730 is "Yes", the process may proceed to the step S5740.

In the step S5740, the first control unit 400 may detect behavior abnormality of the battery cell BC.

FIG. 26 is another flowchart exemplarily showing a method of detecting behavior anomalies according to an embodiment of the present disclosure.

In the step S5800, the first control unit 400 may determine a plurality of sub current curves by applying the moving window of the first time length A to the criterion current curve C3. The criterion current curve C3 is a time series of a plurality of current values representing the battery current of the battery cell BC measured at each sampling time for a predetermined period (t1 to tM).

In the step S5810, the first control unit 400 may determine a plurality of sub voltage curves by applying the moving window of the first time length A to the criterion voltage curve C2. The step S5810 is the same as the step S5710.

In the step S5812, the first control unit 400 may determine a current change amount of each sub current curve RK of the plurality of sub current curves.

In the step S5820, the first control unit 400 may determine a voltage deviation ($\Delta V[K]$) of each sub voltage curve SK associated with each sub current curve RK in which the current change amount is equal to or less than a threshold change amount among the plurality of sub voltage curves. The step S5820 may include the steps S5722, S5724, and S5726 of FIG. 25.

In the step S5830, the first control unit 400 may judge whether the battery cell BC has behavior abnormality by comparing each voltage deviation determined in the step S5820 with at least one of a first threshold deviation and a second threshold deviation. If the value of the step S5830 is "Yes", the process proceeds to the step S5840.

In the step S5840, the first control unit 400 may detect behavior abnormality of the battery cell BC.

FIGS. 27 to 30 are flowcharts in detail illustrating a process in which the external device 2000 detects lithium precipitation abnormality while repeatedly performing a charging and discharging cycle using the first information according to an embodiment of the present disclosure.

The external device 2000 may detect lithium precipitation abnormality according to an embodiment of the present disclosure as shown in the flowcharts of FIGS. 27 to 30, and generate second information including the detected result.

Figure 27:
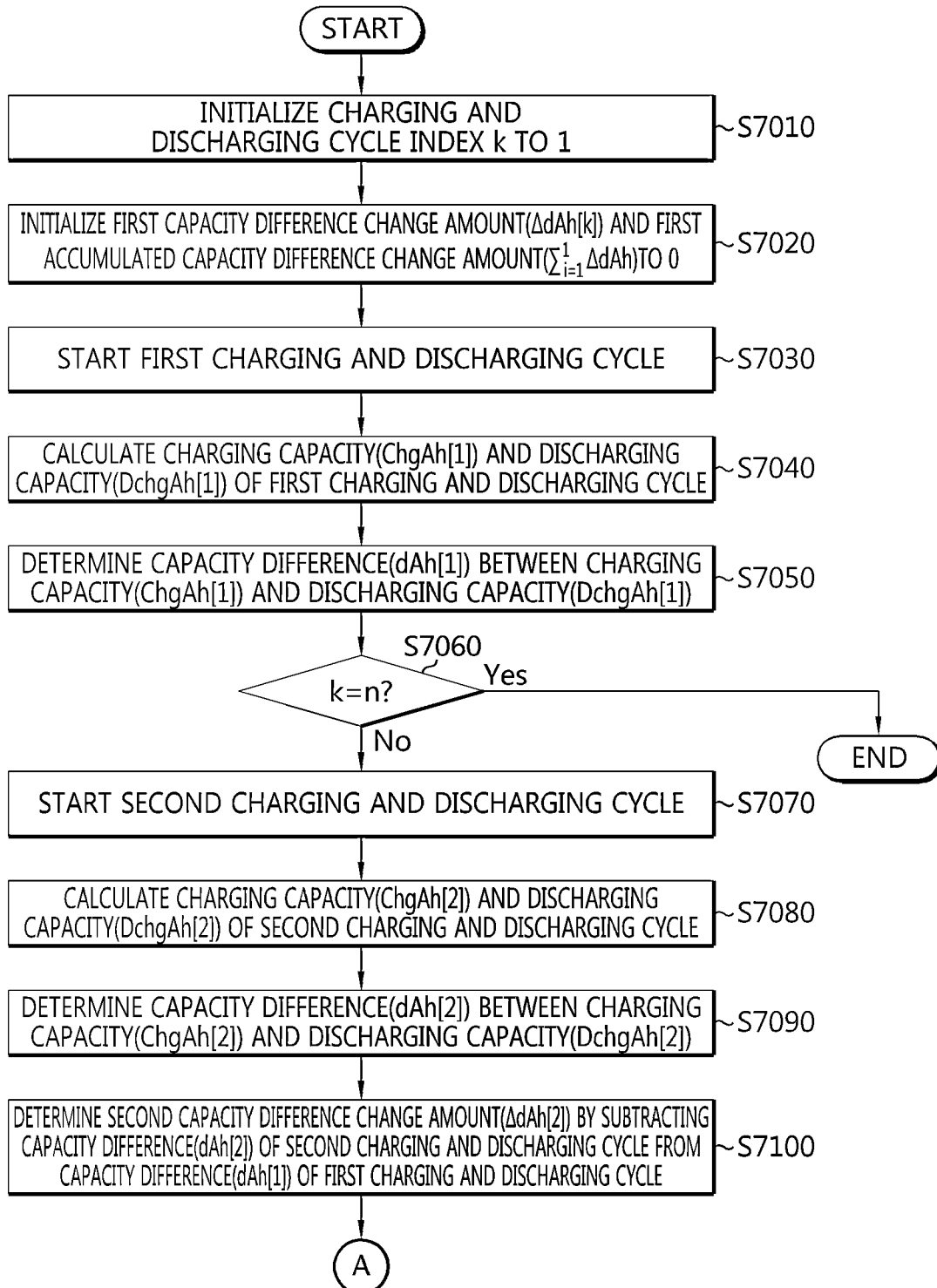
FIG. 27 is a flowchart exemplarily showing a method of detecting lithium precipitation abnormality according to an embodiment of the present disclosure.

FIG. 27 is a flowchart exemplarily showing a method of detecting lithium precipitation abnormality according to an embodiment of the present disclosure.

First, the external device 2000 initializes the charging and discharging cycle index k to 1 in the step S7010, and initializes the first capacity difference change amount ($\Delta dAh[1]$) and the first accumulated capacity difference change amount ($\Sigma_{i=1}^{1} \Delta dAh$) to 0 in the step S7020, respectively.

Subsequently, the external device 2000 may start the first charging and discharging cycle for the battery in the step S7030. In this specification, when the external device 2000 starts the charging and discharging cycle, it may mean that data corresponding to the charging and discharging cycle is obtained using the first information.

Subsequently, the external device 2000 may calculate the charging capacity (ChgAh[1]) and the discharging capacity (DchgAh[1]) using the current measurement value included in the first information during the first charging and discharging cycle in the step S7040.

The first information may include information on the charging cycle performed in a preset charging voltage region and the discharging cycle performed in a preset discharging voltage region.

The charging voltage region and the discharging voltage region may be the same or different. Preferably, the discharging cycle is initiated after the battery cell voltage is stabilized after the charging cycle is finished. Also, the discharging cycle may be ended when the battery cell voltage reaches the preset discharging end voltage or when the integrated value of the discharging current reaches the preset discharging capacity. When the start and end of the charging cycle and the discharging cycle are controlled based on the voltage value, the external device 2000 may refer to the voltage measurement value included in the first information. The voltage measurement value included in the first information may be a value measured through the voltage sensing unit 200.

In the step S7050, the external device 2000 may determine a capacity difference (dAh[1]) corresponding to the difference between the charging capacity (ChgAh[1]) and the discharging capacity (DchgAh[1]).

The external device 2000 may record the determined capacity difference (dAh[1]) together with a time stamp in the storage unit 2100. In one example, the capacity difference (dAh[I]) may be determined by subtracting the discharging capacity (DchgAh[1]) from the charging capacity (ChgAh[1]).

In the step S7060, the external device 2000 may judge whether the index k for the charging and discharging cycle is equal to n. n is a preset natural number, which is the total number of charging and discharging cycles that can proceed to detect lithium precipitation abnormality. In one example, n may be 20.

If the judgment of the step S7060 is YES, the external device 2000 may terminate the process for detecting lithium precipitation abnormality. On the other hand, if the judgment of the step S7060 is NO, the external device 2000 may move the process to S7070.

In the step S7070, the external device 2000 may start a second charging and discharging cycle. The condition of the second charging and discharging cycle may be substantially the same as that of the first charging and discharging cycle.

Subsequently, the external device 2000 may determine the charging capacity (ChgAh[2]) and the discharging capacity (DchgAh[2]) of the second charging and discharging cycle for the battery in the step S7080, and determine the capacity difference (dAh[2]) corresponding to the difference between the charging capacity (ChgAh[2]) and the discharging capacity (DchgAh[2]) in the step S7090.

Subsequently, the external device 2000 may determine the second capacity difference change amount (ΔdAh[2]) by subtracting the capacity difference (dAh[2]) of the second charging and discharging cycle from the capacity difference (dAh[1]) of the first charging and discharging cycle in the step S7100. After the step S7100, the step S7110 of FIG. 28 may be performed.

Figure 28:
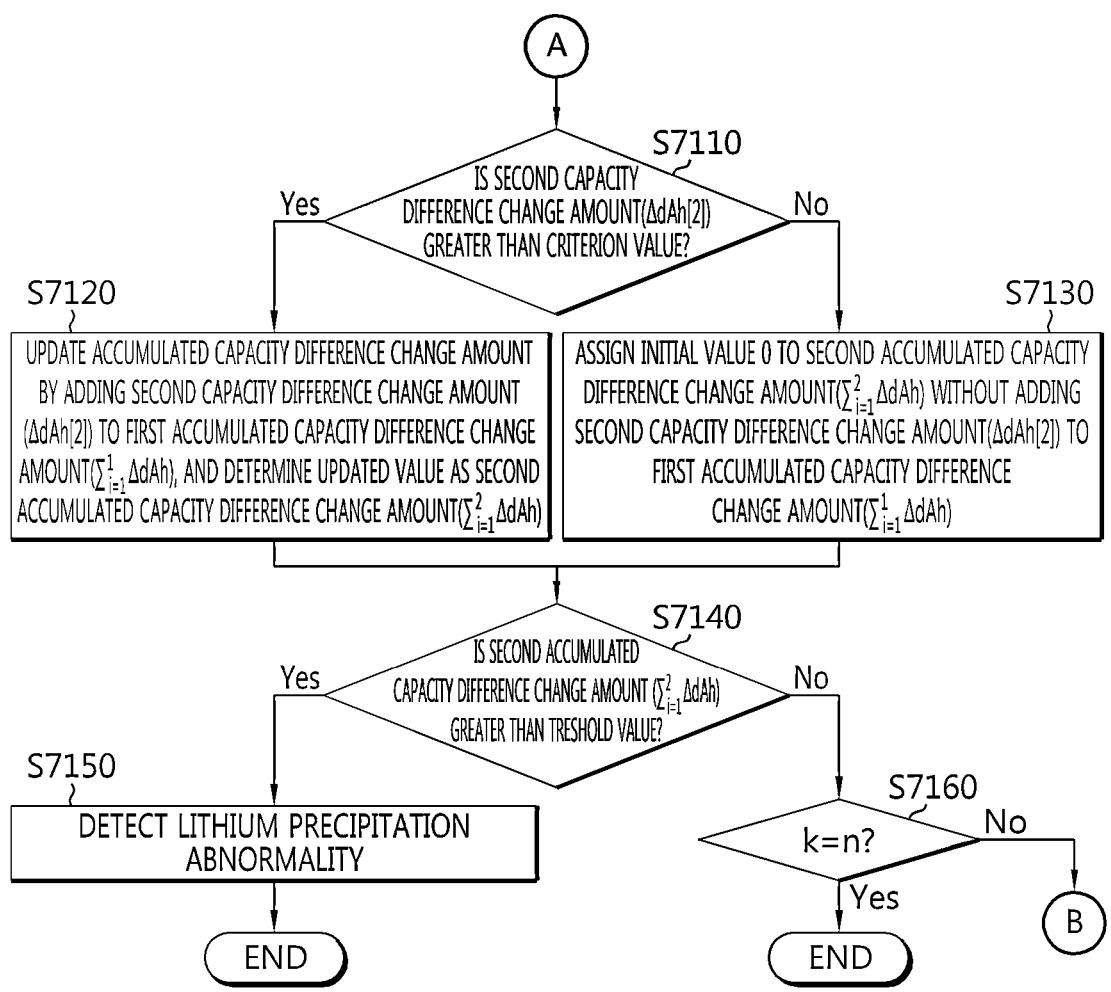
FIG. 28 is another flowchart exemplarily showing a method of detecting lithium precipitation abnormality according to an embodiment of the present disclosure.

FIG. 28 is another flowchart exemplarily showing a method of detecting lithium precipitation abnormality according to an embodiment of the present disclosure.

The external device 2000 may judge whether the second capacity difference change amount (ΔdAh[2]) is greater than the criterion value in the step S7110. The criterion value may be 0.

If the judgment of the step S7110 is YES, the external device 2000 may update the accumulated capacity difference change amount by adding the second capacity difference change amount (ΔdAh[2]) to the first accumulated capacity difference change amount ($\Sigma_{i=1}^{1} \Delta dAh$) in the step S7120, and determine the updated value as the second accumulated capacity difference change amount ($\Sigma_{i=1}^{2} \Delta dAh$). The first accumulated capacity difference change amount ($\Sigma_{i=1}^{1} \Delta dAh$) may be 0 that is an initialization value.

On the other hand, if the judgment of the step S7110 is NO, the initial value 0 may be assigned to the second accumulated capacity difference change amount ($\Sigma_{i=1}^{2} \Delta dAh$) without adding the second capacity difference change amount (ΔdAh[2]) to the first accumulated capacity difference change amount ($\Sigma_{i=1}^{1} \Delta dAh$).

The external device 2000 may judge whether the second accumulated capacity difference change amount ($\Sigma_{i=1}^{2} \Delta dAh$) is greater than or equal to a threshold value in the step S7140. The threshold value may mean a value suitable for detecting lithium precipitation abnormality. For example, the threshold value may be 0.1% of the battery capacity. The threshold value may be a value preset in the external device 2000 or a value included in the first information.

If the judgment of the step S7140 is YES, the external device 2000 may detect lithium precipitation abnormality in the step S7150.

If the judgment of the step S7140 is NO, that is, if the second accumulated capacity difference change amount ($\Sigma_{i=1}^{2} \Delta dAh$) is less than the threshold value (or, is 0), the external device 2000 may judge whether the index k for the charging and discharging cycle is equal to n in the step S7160. Here, n is the total number of charging and discharging cycles that can be performed to detect lithium precipitation abnormality.

If the judgment of the step S7160 is YES, the external device 2000 may finally judge that lithium precipitation abnormality does not occur in the battery and terminate the process because the charging and discharging cycle for detecting lithium precipitation is completed.

The external device 2000 may output that lithium precipitation abnormality is not detected through the second information. For example, the second information may include a message indicating that lithium precipitation abnormality has not occurred.

On the other hand, if the judgment of the step S7160 is NO, the external device 2000 may further proceed with the charging and discharging cycle to detect lithium precipitation abnormality. After the step S7160, the step S7180 of FIG. 29 is performed.

Figure 29:
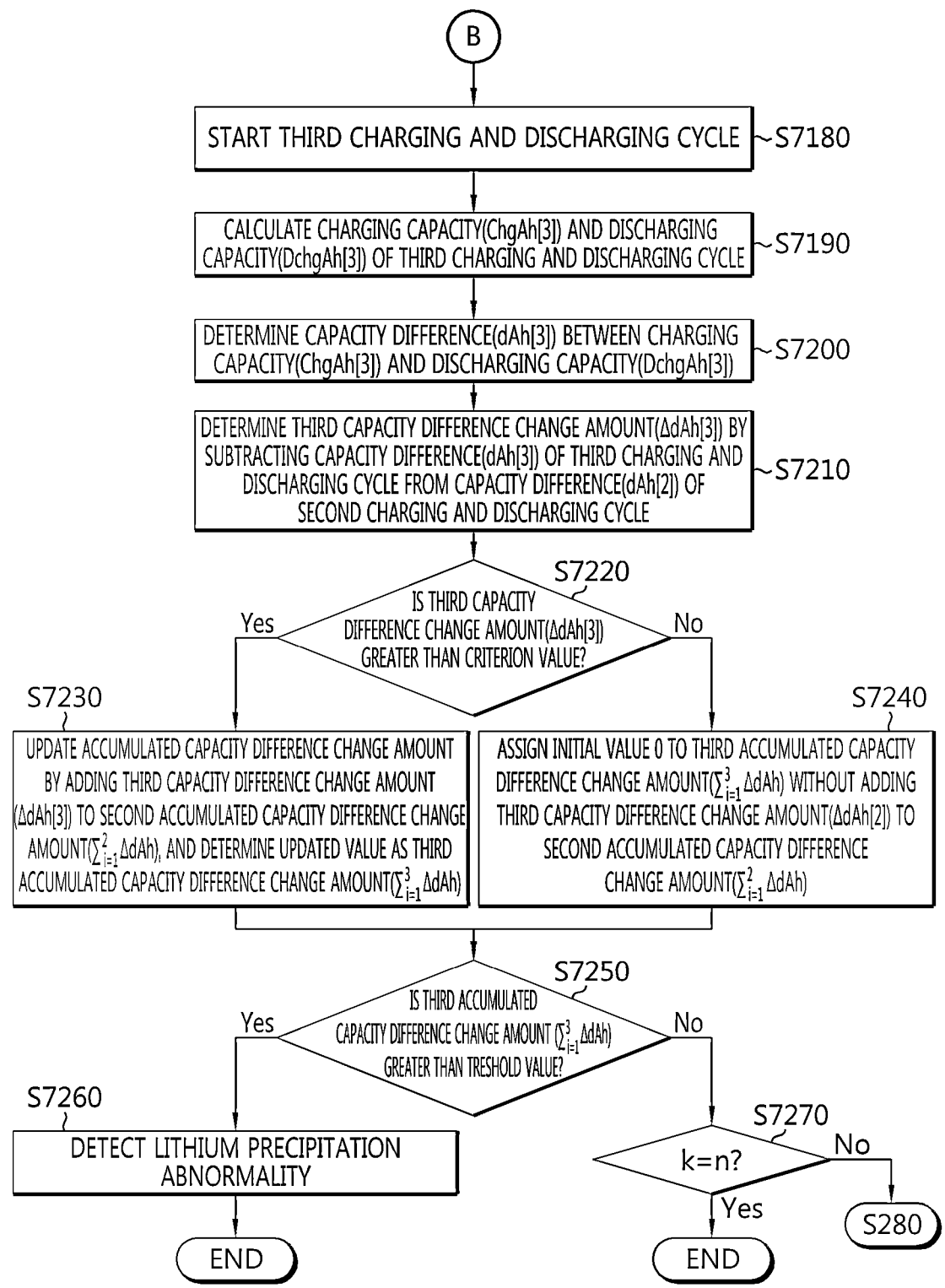
FIG. 29 is still another flowchart exemplarily showing a method of detecting lithium precipitation abnormality according to an embodiment of the present disclosure.

FIG. 29 is still another flowchart exemplarily showing a method of detecting lithium precipitation abnormality according to an embodiment of the present disclosure.

In the step S7180, the external device 2000 starts the third charging and discharging cycle. The condition of the third charging and discharging cycle may be substantially the same as that of the first charging and discharging cycle.

The external device 2000 may determine the charging capacity (ChgAh[3]) and the discharging capacity (DchgAh[3]) during the third charging and discharging cycle for the battery in the step S7190, and, determine the capacity difference (dAh[3]) corresponding to the difference between the charging capacity (ChgAh[3]) and the discharging capacity (DchgAh[3]) in the step S7200.

The external device 2000 may determine the third capacity difference change amount (ΔdAh[3]) by subtracting the capacity difference (dAh[3]) of the third charging and discharging cycle from the capacity difference (dAh[2]) of the second charging and discharging cycle in the step S7210.

The external device 2000 may judge whether the third capacity difference change amount ($\Delta dAh[3]$) is greater than the criterion value in the step S7220. For example, the criterion value may be 0.

If the judgment of the step S7220 is YES, the external device 2000 may update the accumulated capacity difference change amount by adding the third capacity difference change amount ($\Delta dAh[3]$) to the second accumulated capacity difference change amount ($\Sigma_{i=1}^{2} \Delta dAh$) in the step S7230, and determine the updated value as the third accumulated capacity difference change amount ($\Sigma_{i=1}^{3} \Delta dAh$).

On the other hand, if the judgment of the step S7220 is NO, the external device 2000 may assign the initial value 0 to the third accumulated capacity difference change amount ($\Sigma_{i=1}^{3} \Delta dAh$) without adding the third capacity difference change amount ($\Delta dAh[3]$) to the second accumulated capacity difference change amount ($\Sigma_{i=1}^{2} \Delta dAh$) in the step S7240.

After the step S7230 and the step S7240, the step S7250 may be performed.

In the step S7250, the external device 2000 may judge whether the third accumulated capacity difference change amount ($\Sigma_{i=1}^{3} \Delta dAh$) is greater than or equal to a threshold value.

If the judgment of the step S7250 is YES, the external device 2000 may detect lithium precipitation abnormality inside the battery in the step S7260.

The external device 2000 may terminate the process after detecting lithium precipitation abnormality in the step S7260.

If the judgment of the step S7250 is NO, that is, if the third accumulated capacity difference change amount ($\Sigma_{i=1}^{3} \Delta dAh$) is less than the threshold value (or, is 0), the external device 2000 may judge whether the index k for the charging and discharging cycle is equal to n in the step S7270. Here, n is the total number of charging and discharging cycles that can be performed to detect whether lithium precipitation has occurred inside the battery.

If the judgment of the step S7270 is YES, the charging and discharging cycle for detecting lithium precipitation abnormality has been completed, so it is judged that no lithium precipitation abnormality has occurred in the battery and the process may be terminated.

The external device 2000 may generate the second information after the process is terminated. The external device 2000 may generate a warning message indicating that lithium precipitation has been detected in the second information. Alternatively, the second information may include a message indicating that lithium precipitation abnormality is not detected.

On the other hand, if the judgment of the step S7270 is NO, the external device 2000 may further proceed with the charging and discharging cycle to detect lithium precipitation abnormality.

The detection logic for the lithium precipitation abnormality that the external device 2000 proceeds in the fourth charging and discharging cycle and the subsequent charging and discharging cycle is substantially the same as described above.

Figure 30:
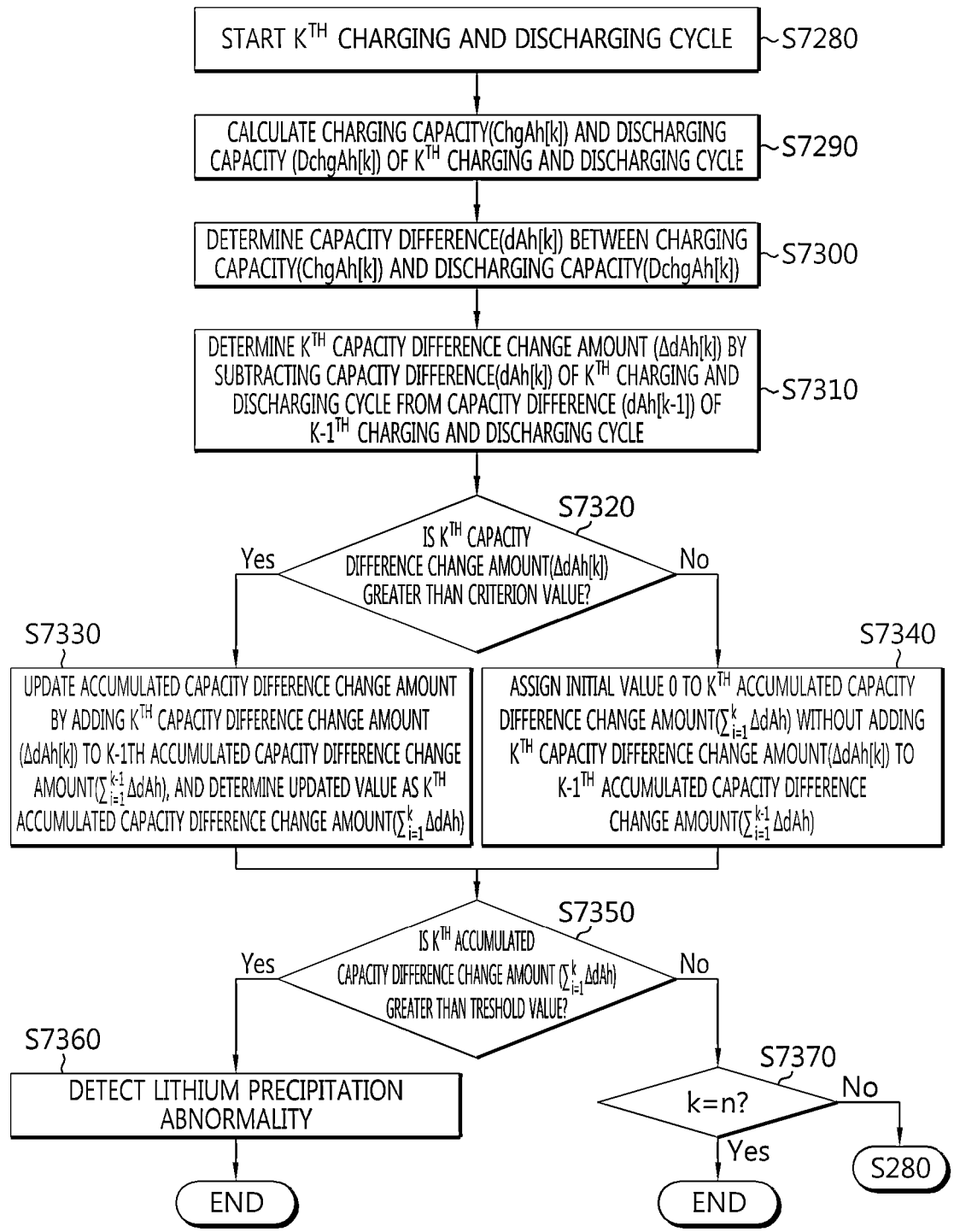
FIG. 30 is still another flowchart exemplarily showing a method of detecting lithium precipitation abnormality according to an embodiment of the present disclosure.

FIG. 30 is still another flowchart exemplarily showing a method of detecting lithium precipitation abnormality according to an embodiment of the present disclosure. Hereinafter, a process performed by the external device 2000 in the fourth to $n^{th}$ charging and discharging cycles will be generalized and described with reference to FIG. 30.

In the step S7280, the external device 2000 starts the $K^{th}$ charging and discharging cycle (k is a natural number of 4 to n). The condition of the $K^{th}$ charging and discharging cycle is substantially the same as that of the first charging and discharging cycle.

Subsequently, the external device 2000 determines the charging capacity (ChgAh[k]) and the discharging capacity (DchgAh[k]) during the $K^{th}$ charging and discharging cycle for the battery in the step S7290, and determines the capacity difference (dAh[k]) corresponding to the difference between the charging capacity (ChgAh[k]) and the discharging capacity (DchgAh[k]).

Subsequently, the external device 2000 determines the $K^{th}$ capacity difference change amount ($\Delta dAh[k]$) by subtracting the capacity difference (dAh[k]) of the $K^{th}$ charging and discharging cycle from the capacity difference (dAh[k-1]) of the $k-1^{th}$ charging and discharging cycle in the step S7310.

Subsequently, the external device 2000 judges whether the $K^{th}$ capacity difference change amount ($\Delta dAh[k]$) is greater than the criterion value in the step S7320. Preferably, the criterion value may be 0.

If the judgment of the step S7320 is YES, the external device 2000 may update the accumulated capacity difference change amount by adding the $K^{th}$ capacity difference change amount ($\Delta dAh[k]$) to the $k-1^{th}$ accumulated capacity difference change amount ($\Sigma_{i=1}^{k-1} \Delta dAh$) in the step S7330, and determine the updated value as the $K^{th}$ accumulated capacity difference change amount ($\Sigma_{i=1}^{k} \Delta dAh$).

On the other hand, if the judgment of the step S7320 is NO, the external device 2000 may assign the initial value of 0 to the $K^{th}$ accumulated capacity difference change amount ($\Sigma_{i=1}^{k} \Delta dAh$) without adding the $K^{th}$ capacity difference change amount ($\Delta dAh[k]$) to the $k-1^{th}$ accumulated capacity difference change amount ($\Sigma_{i=1}^{k-1} \Delta dAh$) in the step S7340.

The step S7350 proceeds after the step S7330 and the step S7340.

In the step S7350, the external device 2000 judges whether the $K^{th}$ accumulated capacity difference change amount ($\Sigma_{i=1}^{k} \Delta dAh$) is greater than or equal to a threshold value.

If the judgment in the step S7350 is YES, the external device 2000 may judge that lithium precipitation abnormality is detected in the battery and terminate the process in the step S7360.

If the judgment of the step S7350 is NO, that is, if the $K^{th}$ accumulated capacity difference change amount ($\Sigma_{i=1}^{k} \Delta dAh$) is less than the threshold value (or, is 0), the external device 2000 may judge whether the index k for the charging and discharging cycle is equal to n in the step S7370. Here, n is the total number of charging and discharging cycles that can be performed to detect whether lithium precipitation has occurred inside the battery.

If the judgment of the step S7370 is YES, the charging and discharging cycle for detecting lithium precipitation is completed, so it is finally judged that no lithium precipitation abnormality has occurred in the battery and the process may be terminated.

On the other hand, if the judgment of the step S7370 is NO, the external device 2000 returns the process to the step S7280 in order to further proceed with the charging and discharging cycle to detect lithium precipitation abnormality. Accordingly, the steps S7280 to S7370 may be periodically repeated until the index k of the charging and discharging cycle becomes n.

According to an embodiment of the present disclosure, if the capacity difference change amount calculated in the current charging and discharging cycle is equal to or less than the criterion value, the accumulated capacity difference change amount calculated up to the previous cycle may be initialized to 0. In addition, if the capacity difference change amount calculated in the current charging and discharging cycle is greater than the criterion value, the current capacity difference change amount may be added to the previous accumulated capacity difference change amount. As a result, the accumulated capacity difference change amount increases. The previous accumulated capacity difference change amount has a value of 0 or a positive value. If it has a positive value, the capacity difference change amount exceeding the criterion value calculated in successive charging and discharging cycles may be integrated.

In addition, when the capacity difference change amount is integrated and the capacity difference change amount decreases to the criterion value or less in a specific charging and discharging cycle, the accumulated capacity difference change amount may be initialized to 0. By applying this logic, the accumulated capacity difference change amount corresponds to a quantitative indicator that measures a kind of lithium precipitation abnormality. That is, if the capacity difference change amount is greater than the criterion value, it may mean that there is possibility of lithium precipitation.

In addition, if the accumulated capacity difference change amount increases to the threshold value or more as the condition that the capacity difference change amount exceeds the criterion value in a plurality of charging and discharging cycles consecutive in time series is successively satisfied, it may mean that the possibility of lithium precipitation is high. The present disclosure has technical significance in that the possibility of lithium precipitation is quantified using the factor of the accumulated capacity difference change amount.

Figure 31:
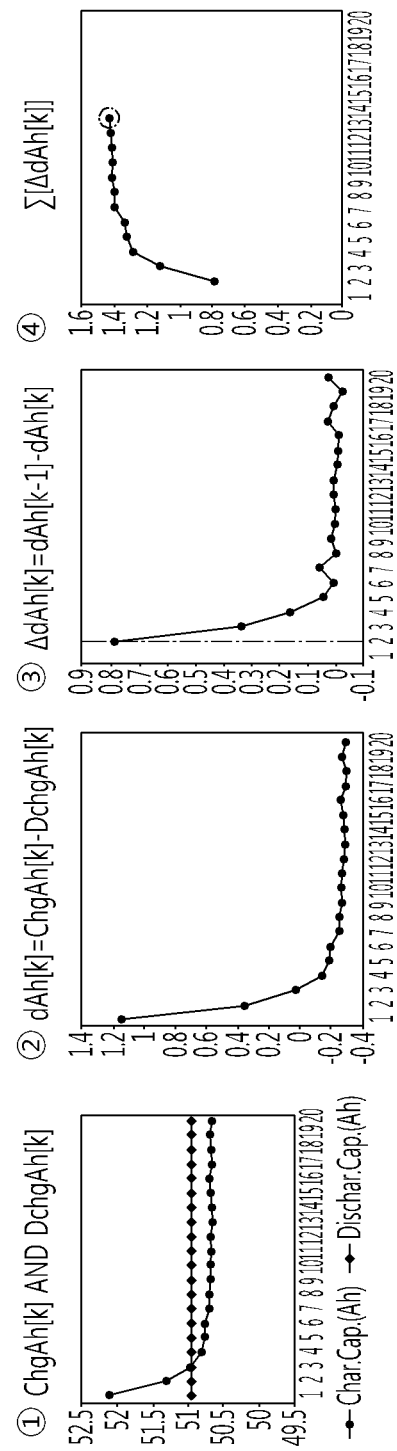
FIG. 31 is a graph showing changes in data measured in an experimental example to which a method for the external device to detect whether lithium precipitation according to an embodiment of the present disclosure occurs is applied.

FIG. 31 is a graph showing changes in data measured in an experimental example to which a method for the external device 2000 to detect whether lithium precipitation according to an embodiment of the present disclosure occurs is applied.

In this experimental example, a pouch-type lithium polymer battery was used. The lithium polymer battery selected for the experiment is degraded and thus is in a state in which lithium has started to precipitate on the negative electrode. The current capacity of the lithium polymer battery, which reflects the degree of degradation, is approximately 50 Ah. The charging condition of the charging cycle is CC-CV charging. When the CC charging target voltage is reached, CC charging is terminated and converted to CV charging, and the charging is terminated when the CV charging current reaches the target current. The discharging condition of the discharging cycle is CC discharging, and the discharging is terminated when discharging is performed as much as a given discharging capacity. The temperature condition of the charging cycle and the discharging cycle is 45° C. The criterion value for determining whether to integrate the capacity difference change amount is set to 0, and the threshold value for diagnosing lithium precipitation abnormality is set to 0.06 Ah.

Graph ① is a graph showing measurement results of the charging capacity (ChgAh[k]) and the discharging capacity (DChgAh[k]) for each charging and discharging cycle. The charging capacity (ChgAh[k]) and the discharging capacity (DChgAh[k]) are calculated by integrating the current value measured through the sense resistor. Due to an error in the discharging current measurement value, the discharging capacity is greater than the charging capacity from the fourth discharging cycle.

Graph ② is a graph showing the capacity difference (dAh[k]) for each charging and discharging cycle. Referring to Graph ①, since the discharging capacity is greater than the charging capacity from the fourth charging and discharging cycle, the capacity difference (dAh[k]) becomes negative from the fourth cycle.

Graph ③ is a graph showing the capacity difference change amount (ΔdAh[k]) for each charging and discharging cycle. Indices of the charging and discharging cycles in which the capacity difference change amount (ΔdAh[k]) is positive are 2 to 13, 17, 18, and 20. The indices of the charging and discharging cycle in which the capacity difference change amount (ΔdAh[k]) is negative are 14 to 16 and 19.

Graph ④ is a graph showing the accumulated capacity difference change amount ($\Sigma_{i=1}^{k}$ ΔdAh) for each charging and discharging cycle. Indices of the charging and discharging cycles in which the capacity difference change amount (ΔdAh[k]) is positive are 2 to 13. Therefore, the accumulated capacity difference change amount ($\Sigma_{i=1}^{k}$ dAh) increases as the capacity difference change amount (ΔdAh[k]) of the second to 13$^{th}$ charging and discharging cycles is integrated. In addition, when accumulated up to the capacity difference change amount of the 13$^{th}$ charging and discharging cycle, the accumulated capacity difference change amount ($\Sigma_{i=1}^{k}$ ΔdAh) exceeds the threshold value of 0.06 Ah. Therefore, the external device 2000 proceeds up to the 13$^{th}$ charging and discharging cycle, then judges that lithium precipitation abnormality has occurred inside the battery, outputs the lithium precipitation abnormality detection result through the second information, and terminates the detection process. Since lithium is precipitated in the negative electrode of the lithium polymer battery used in this experiment, it can be seen that the detection accuracy of the present disclosure is high.

Figure 32:
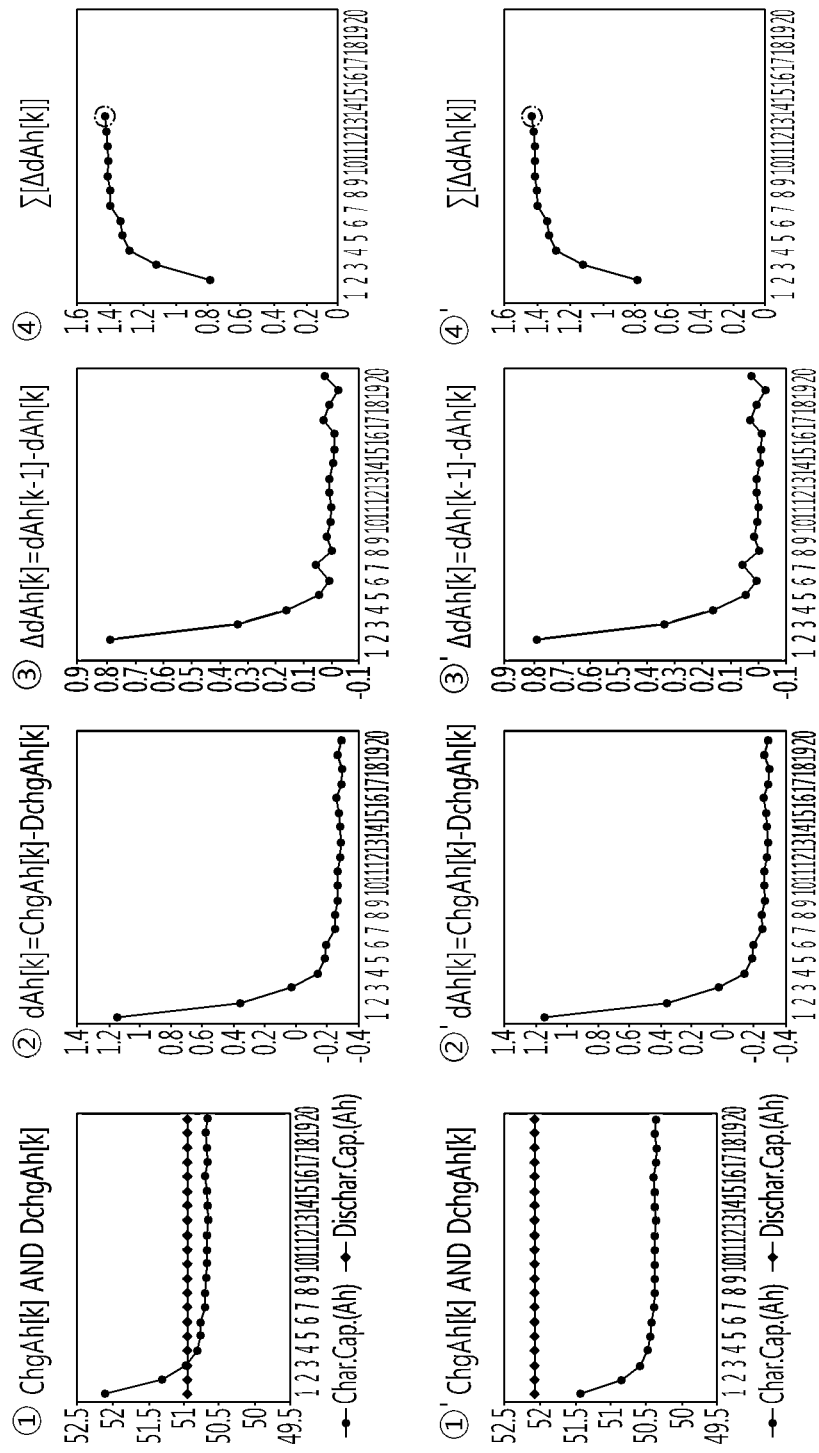
FIG. 32 is a graph showing changes in data measured in another experimental example to which a method for detecting lithium precipitation abnormality according to an embodiment of the present disclosure is applied.

FIG. 32 is a graph showing changes in data measured in another experimental example to which a method for detecting lithium precipitation abnormality according to an embodiment of the present disclosure is applied.

In FIG. 32, Graph ① is the same as Graph ① of the above-described experimental example. Graph ①' is a graph showing the measurement results of the charging capacity (ChgAh[k]) and the discharging capacity (DchgAh[k]) when using a current measurement means having a different current measurement value error from the experimental example described above. In this experimental example, the error of the discharging current measurement value is larger than that of the above-described experimental example. Therefore, the discharging capacity (DchgAh[k]) graph is shifted upward compared to the above-described experimental example.

Graphs ② and ②' are graphs showing the capacity difference (dAh[k]) for each charging and discharging cycle, Graphs ③ and ③' are graphs showing the capacity difference change amount (ΔdAh[k]) for each charging and discharging cycle, and Graphs ④ and ④' are graphs showing the accumulated capacity difference change amount ($\Sigma_{i=1}^{k}$ ΔdAh) for each charging and discharging cycle.

Graphs ②, ③ and ④ are calculated using the data of Graph ①, and Graphs ②', ③' and ④' are calculated using the data of Graph ①'.

As shown in FIG. 32, Graphs ②, ③ and ④ and Graphs ②', ③' and ④' are substantially the same. Therefore, the external device 2000 proceeds up to the 13$^{th}$ charging and discharging cycle regardless of the magnitude of the error even if the discharging current value includes a measurement error, then judges that lithium precipitation abnormality has occurred inside the battery, outputs the lithium precipitation abnormality detection result through the second information, and terminates the detection process. From the experimental results, it can be seen that the present disclosure can reliably detect lithium precipitation abnormality regardless of the error of the current measurement value.

Figure 33:
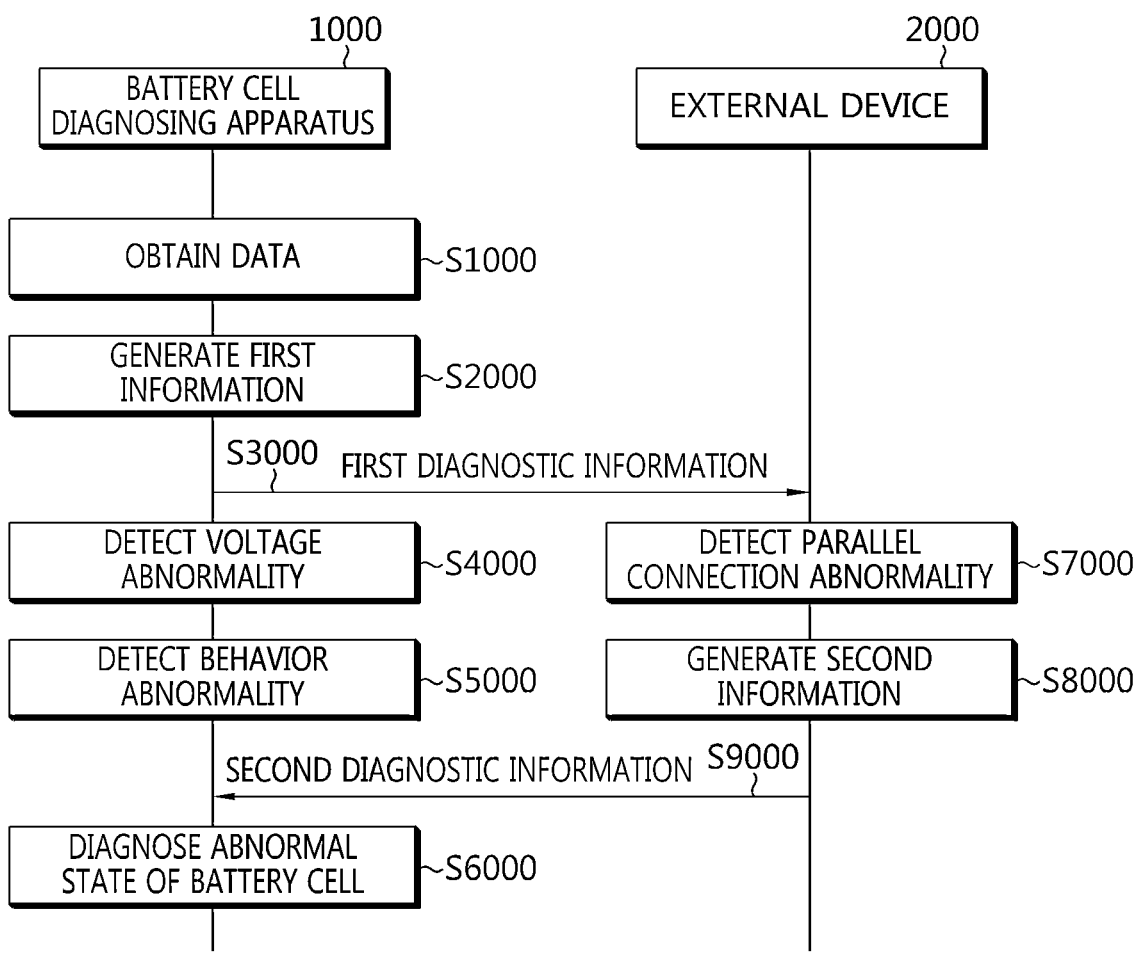
FIG. 33 is a flowchart in which the battery cell diagnosing apparatus according to an embodiment of the present disclosure diagnoses an abnormal state of a battery cell using an external device.

FIG. 33 is a flowchart in which the battery cell diagnosing apparatus 1000 according to an embodiment of the present disclosure diagnoses an abnormal state of a battery cell using the external device 2000. The features identical to the former embodiment will be not described in detail.

In the step S7000 of FIG. 33, the external device 2000 may detect whether there is a parallel connection abnormality. This will be described in detail with reference to FIG. 34.

Figure 34:
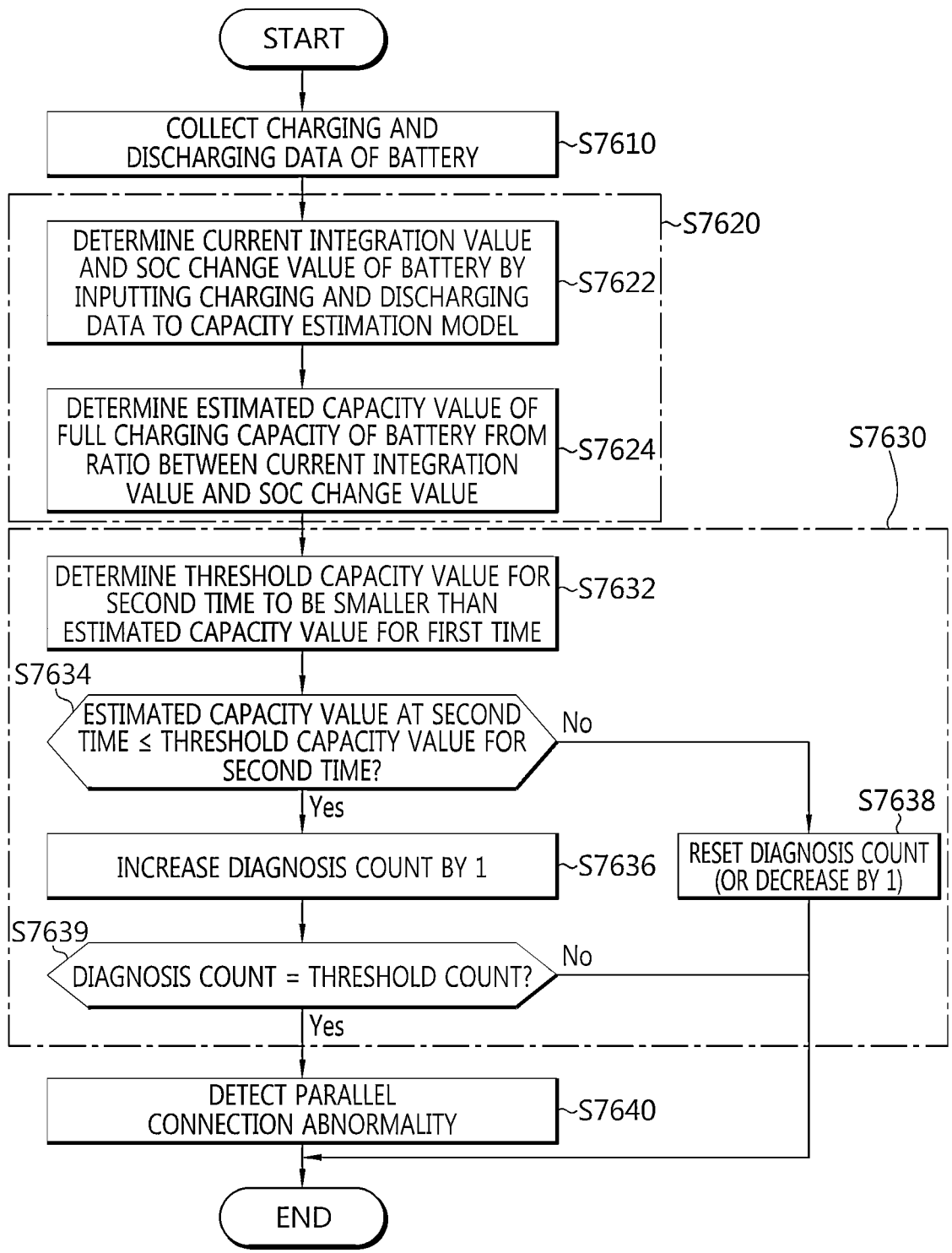
FIG. 34 is a flowchart exemplarily showing a battery diagnosing method according to an embodiment of the present disclosure.

FIG. 34 is a flowchart exemplarily showing a battery diagnosing method according to an embodiment of the present disclosure. The method of FIG. 34 may be repeatedly executed at a first time interval.

Referring to FIG. 34, in the step S7610, the external device 2000 may collect charging and discharging data of the battery B included in the first information.

In the step S7620, the external device 2000 may determine an estimated capacity value representing the full charging capacity of the battery B. The step S7620 may include steps S7622 and S7624. In the step S7622, the external device 2000 may determine a current integration value and SOC change value of the battery B by inputting the charging and discharging data to the capacity estimation model. In the step S7624, the external device 2000 may determine an estimated capacity value representing the full charging capacity of the battery B from the ratio between the current integration value and the SOC change value of the battery B. The external device 2000 may store time series of the estimated capacity values.

In the step S7630, the external device 2000 may detect an abnormality in the parallel connection B200 by monitoring the change over time of the estimated capacity value. The step S7630 may include steps S7632, S7634, S7636, S7638, and S7639. In the step S7632, the external device 2000 may determine a threshold capacity value for the second time to be smaller than the estimated capacity value for the first time. For example, the second time may be a timing at which the current estimated capacity value is calculated, and the first time may be a timing at which the estimated capacity value 10 times ago is calculated. In the step S7634, the external device 2000 may compare the estimated capacity value at the second time with the threshold capacity value for the second time. If the estimated capacity value at the second time is less than the threshold capacity value for the second time, it indicates that at least one of the first capacity abnormality and the second capacity abnormality has occurred in the parallel connection B200. If the value of the step S7634 is "yes", the process proceeds to the step S7636. Otherwise, the process may proceed to the step S7638. In the step S7636, the external device 2000 may increase the diagnosis count by 1. In the step S7638, the external device 2000 may reset the diagnosis count. In the step S7639, the external device 2000 may determine whether the diagnosis count reaches a threshold count. If the value of the step S7639 is "Yes", it indicates that at least one unit cell UC of the parallel connection B200 is detected as having a second capacity abnormality, which is a complete disconnection failure.

In the step S7640, the external device 2000 may detect a parallel connection abnormality. The external device 2000 may determine the number of unit cells in which a parallel connection abnormality is detected. The external device 2000 may determine the number of unit cells having complete disconnection failure among the plurality of unit cells UC1 to UCM, from two estimated capacity values at the past two times (e.g., te, tf) with a time interval of the second time interval or less, at which the maximum reduction of the estimated capacity value appears.

The external device 2000 may determine the number of unit cells having a complete disconnection failure among the plurality of unit cells UC1 to UCM. The number of abnormal unit cells may be determined to be equal to a maximum integer not greater than $\Delta Ahmax/(Ahp/M)$. Ahp is an estimated capacity value at an earlier time (te) of two times (e.g., te, tf). $\Delta Ahmax$ is a maximum reduction amount of the full charging capacity over two times (e.g., te, tf) prior to the timing when an abnormality of the parallel connection 200 is detected, and is a result obtained by subtracting the estimated capacity value at the later time (tf) from the estimated capacity value at the previous time (te). For example, when Ahp=122 Ah, $\Delta Ahmax$=27 Ah, and M=10, since $2 \leq 27$ Ah/(122 Ah/10)<3, the number of abnormal unit cells may be determined to be 2.

Figure 35:
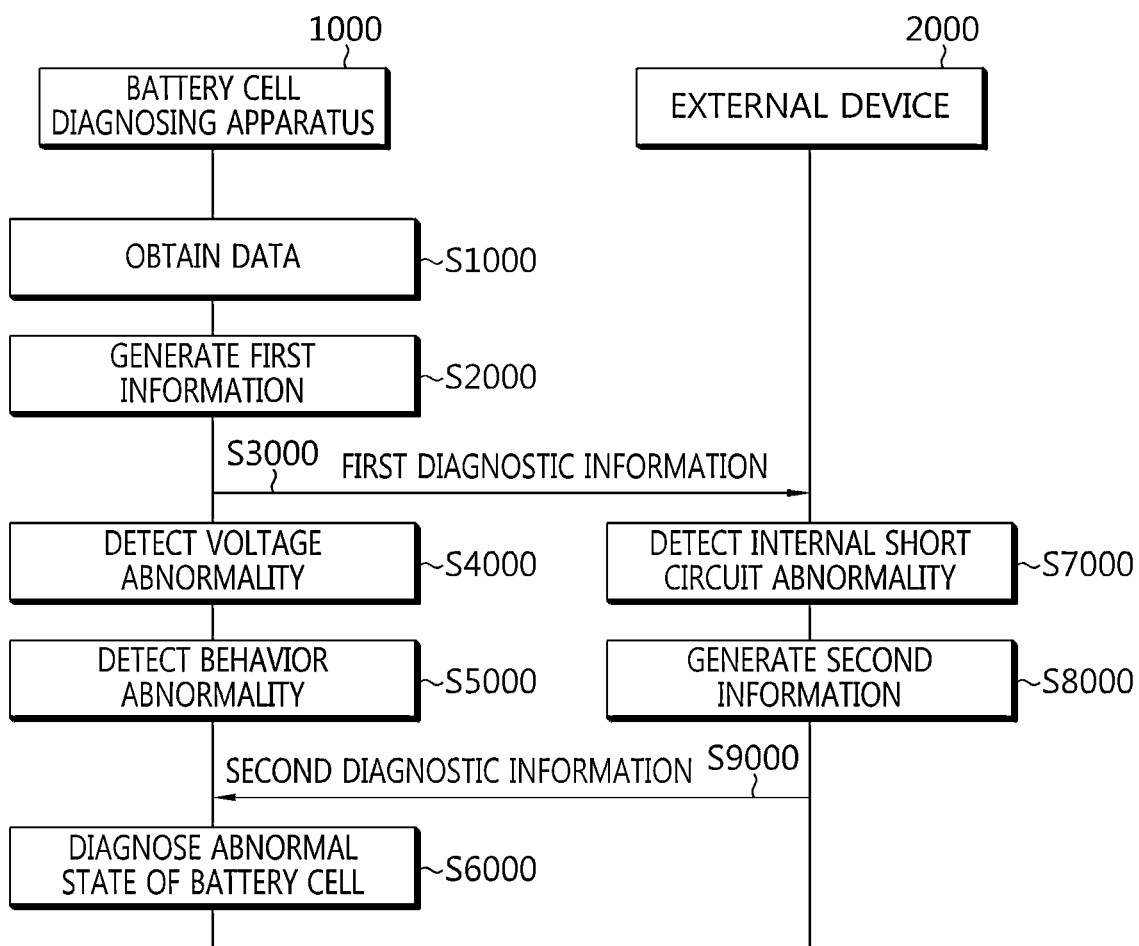
FIG. 35 is a flowchart in which the battery cell diagnosing apparatus according to an embodiment of the present disclosure diagnoses an abnormal state of a battery cell using an external device.

FIG. 35 is a flowchart in which the battery cell diagnosing apparatus 1000 according to an embodiment of the present disclosure diagnoses an abnormal state of a battery cell using the external device 2000. The features identical to the former embodiment will be not described in detail.

In the step S7000 of FIG. 35, the external device 2000 may detect whether there is an internal short circuit abnormality. This will be described in detail with reference to FIGS. 36 and 37.

Figure 36:
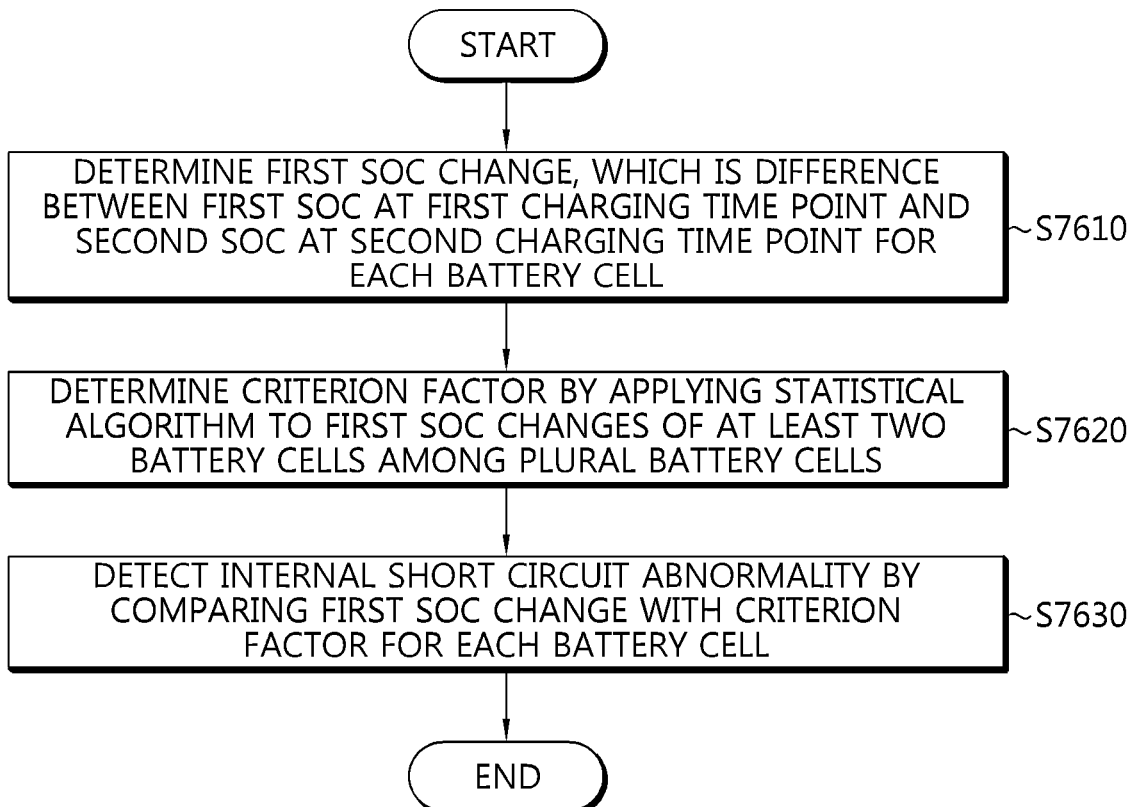
FIG. 36 is a flowchart exemplarily showing a battery management method according to an embodiment of the present disclosure.

FIGS. 36 and 37 are flowcharts specifically showing a process of detecting an internal short circuit abnormality while the external device 2000 repeatedly performs a charging and discharging cycle using the first information according to an embodiment of the present disclosure.

According to the flowcharts shown in FIGS. 36 and 37, the external device 2000 may detect an internal short circuit abnormality according to an embodiment of the present disclosure and generate second information including the detected result.

FIG. 36 is a flowchart exemplarily showing a battery management method according to an embodiment of the present disclosure. The method of FIG. 36 is for detecting an internal short circuit abnormality of the battery cell BC based on the SOC trends of all of the plurality of battery cells $BC_1$ to $BC_N$ monitored in a recent charging period. For convenience of explanation, it is assumed that the recent charging period is from the time point t4 to the time point t5.

Referring to FIG. 36, in the step S7610, the external device 2000 may determine a first SOC change, which is a difference between a first SOC at a first charging time point and a second SOC at a second charging time point, by applying the SOC estimation algorithm to each state parameter of each of the plurality of battery cells $BC_1$ to $BC_N$ during charging of the battery pack 10, obtained using the first information, for each battery cell BC. The first charging time point and the second charging time point are not particularly limited as long as they are two different time points within the recent charging period.

For example, the first charging time point may be a start time point t4 of the recent charging period, and the second charging time point may be an end time point t5 of the recent charging period. Since the method of FIG. 36 relates to charging, the first SOC change represents an increase in SOC from the first charging time point to the second charging time point. For example, referring to FIG. 18, the first SOC change of the abnormal battery cell is the difference between the first SOC VC54 and the second SOC VC55.

In the step S7620, the external device 2000 determines a criterion factor by applying a statistical algorithm to the first SOC changes of at least two battery cells among the plurality of battery cells $BC_1$ to $BC_N$. The criterion factor may be equal to an average or a median value of the first SOC changes of at least two battery cells among the plurality of battery cells $BC_1$ to $BC_N$. For example, referring to FIG. 18, when the curve VC4 is an average of the first SOC changes, the criterion factor is a difference between the SOC VC44 and the SOC VC45.

In the step S7630, the external device 2000 detects an internal short circuit abnormality by comparing the first SOC change with a criterion factor for each battery cell BC. In detecting the internal short circuit abnormality, one or a combination of two or more of the following detection conditions may be utilized.

[Condition #1: The first SOC change must be less than the criterion factor by a threshold value TH1 or more]

[Condition #2: The ratio of the first SOC change to the criterion factor must be equal to or less than a critical value TH2, where TH2 is 0 to 1]

[Condition #3: The ratio of the first SOC change to the criterion factor must be less than the previous ratio by a threshold value TH3 or more]

In Condition #3, the previous ratio is a ratio of the first SOC change to the criterion factor in the charging period preceding the recent charging period (t0 to t1 in FIG. 17).

The threshold values TH1, TH2, TH3 may be predetermined fixed values. Alternatively, the external device 2000 may determine at least one of the threshold values TH1, TH2, TH3 based on the integrated value of the charging current measured over the period from the first charging time point to the second charging time point.

Whenever the charging mode of the battery pack 10 resumes, at least one of the threshold values TH1, TH2, TH3 may be newly updated. For example, the external device 2000 may obtain a target value of SOC change (e.g., 60%) by dividing the integration value of the charging current (e.g., 3 Ah [ampere-hour]) by the design capacity of the battery cell BC (e.g., 5 Ah), and determine at least one of the threshold values TH1, TH2, TH3 by multiplying the ratio of the criterion factor to the target value by a predetermined scaling constant (which is a positive value). The scaling constant used to determine any one of the threshold values TH1, TH2, TH3 may be different from a scaling constant used to determine another one of the threshold values TH1, TH2, TH3. The target value may be determined during at least one of the steps S7610, S7620, and S7630. At least one of the threshold values TH1, TH2, TH3 may be determined during at least one of the steps S7620 and S7630.

When all of the plurality of battery cells $BC_1$ to $BC_N$ are normal, the target value and the criterion factor may be substantially equal to each other. Meanwhile, as the number of battery cells having an internal short circuit abnormality among the plurality of battery cells $BC_1$ to $BC_N$ increases, the criterion factor greatly decreases from the target value. Accordingly, by determining at least one of the threshold values TH1, TH2, TH3 according to the above method, the accuracy of detecting an internal short circuit abnormality may be improved.

Meanwhile, after the target value is determined before the step S7620, in the step S7620, only first SOC changes less than or equal to the target value among all first SOC changes of the plurality of battery cells $BC_1$ to $BC_N$ may be used to determine the criterion factor. In this case, in determining the criterion factor, among all first SOC changes of the plurality of battery cells $BC_1$ to $BC_N$, first SOC changes exceeding the target value are excluded, so the battery cell BC having a relatively serious internal short circuit abnormality may be detected preferentially from the plurality of battery cells $BC_1$ to $BC_N$.

FIG. 37 is another flowchart exemplarily showing a battery management method according to an embodiment of the present disclosure. The method of FIG. 37 is for detecting an internal short circuit abnormality of the battery cell BC based on the SOC trends of all of the plurality of battery cells $BC_1$ to $BC_N$ monitored in a recent discharging period and a recent charging period, respectively. For convenience of explanation, it is assumed that the recent charging period is from time point t4 to time point t5, and the recent discharging period is from time point t6 to time point t7.

Referring to FIG. 37, in the step S7710, the external device 2000 may determine a first SOC change, which is a difference between a first SOC at a first charging time point and a second SOC at a second charging time point, by applying the SOC estimation algorithm to state parameters of each of the plurality of battery cells $BC_1$ to $BC_N$, obtained during charging of the battery pack 10 using the first information, for each battery cell BC. The first charging time point and the second charging time point are not particularly limited as long as they are two different time points within the recent charging period. For example, the first charging time point may be a start time point t4 of the recent charging period, and the second charging time point may be an end time point t5 of the recent charging period.

In the step S7720, the external device 2000 may determine a second SOC change, which is a difference between a third SOC at the first discharging time point and a fourth SOC at the second discharging time point, by applying the SOC estimation algorithm to the state parameters of each of the plurality of battery cells $BC_1$ to $BC_N$, obtained during the discharging of the battery pack 10, for each battery cell BC. The first discharging time point and the second discharging time point are not particularly limited as long as they are two different time points within the latest discharging period. For example, the first discharging time point may be a start time point t6 of the recent charging period, and the second discharging time point may be an end time point t7 of the recent charging period.

Referring to FIG. 18, in an abnormal battery cell, the first SOC change is a difference between the first SOC VC54 and the second SOC VC55, and the second SOC change is a difference between the third SOC VC56 and the fourth SOC VC57.

In FIG. 37, the step S7710 precedes the step S7720, but this should be understood as an example. For example, if the recent charging period precedes the recent discharging period, the step S7720 may precede the step S7710. As another example, after both the recent charging period and the recent discharging period end, the step S7710 and the step S7720 may be performed simultaneously.

In the step S7730, the external device 2000 may determine an abnormality factor by dividing the first SOC change by the second SOC change for each battery cell BC. That is, the abnormality factor may be determined according to the formula of "abnormality factor=(first SOC change)÷(second SOC change)".

For example, referring to FIG. 18, the abnormality factor of the abnormal battery cell may be determined according to the formula "{SOC (VC55)−SOC (VC54)}÷{SOC (VC56)−SOC (VC57)}. The abnormal factor may also be referred to as coulombic efficiency.

In the step S7740, the external device 2000 may determine a criterion factor by applying a statistical algorithm to the abnormality factors of at least two battery cells among the plurality of battery cells $BC_1$ to $BC_N$.

The criterion factor may be equal to an average or a median value of the abnormality factors of at least two battery cells among the plurality of battery cells $BC_1$ to $BC_N$. For example, referring to FIG. 18, when the curve VC4 is an average SOC of the plurality of battery cells $BC_1$ to $BC_N$, the criterion factor may be determined according to the formula "{SOC (VC45)−SOC (VC44)}+{SOC (VC46)−SOC (VC47)}".

In the step S7750, the external device 2000 may detect an internal short circuit abnormality of the battery cell BC by comparing the abnormality factor with a criterion factor for each battery cell BC. In detecting the internal short circuit abnormality, one or a combination of two or more of the following detection conditions may be utilized.

[Condition #1: The abnormality factor must be smaller than the criterion factor by a threshold value TH11 or more]

[Condition #2: The relative coulombic efficiency must be equal to or less than a threshold value TH12, where TH12 is 0 to 1]

[Condition #3: The ratio of the abnormality factor to the criterion factor must be smaller than the previous ratio by a threshold value TH13 or more]

In Condition #2, the relative coulombic efficiency may be a ratio of the abnormality factor to the criterion factor, namely "abnormality factor÷criterion factor".

In Condition #3, the previous ratio is a ratio of the abnormality factor to the criterion factor based on the first SOCs in the charging period (t4 to t5 in FIG. 17) preceding the recent discharging period (t6 to t7) and the second SOCs in the discharging period (t2 to t3 in FIG. 17).

The threshold values TH11, TH12, TH13 may be predetermined values. As an example, the threshold values TH11, TH12, TH13 may be the same as the predetermined threshold values TH1, TH2, TH3 described above with reference to FIG. 36.

The external device 2000 may determine at least one of the threshold values TH11, TH12, TH13 based on the integration value of the charging current measured over the period from the first charging time point to the second charging time point and the integration value of the discharging current measured over the period from the first discharging time point to the second discharging time point.

Whenever the charging mode or discharging mode of the battery pack 10 is resumed, at least one of the threshold values TH11, TH12, TH13 may be newly updated. For example, the external device 2000 may obtain a target value by dividing the integration value of the charging current by the integration value of the discharging current. The external device 2000 may determine at least one of the threshold values TH11, TH12, TH13 by multiplying the ratio of the criterion factor to the target value by a predetermined scaling constant (which is a positive value). The scaling constant used to determine any one of the threshold values TH11, TH12, TH13 may be different from the scaling constant used to determine another one of the threshold values TH11, TH12, TH13. The target value may be determined during at least one of the steps S7710, S7720, S7730, and S7740. At least one of the threshold values TH1, TH2, TH3 may be determined during at least one of the steps S7730 and S7740.

When all of the plurality of battery cells $BC_1$ to $BC_N$ are normal, the target value and the criterion factor may be substantially equal to each other. Meanwhile, as the number of battery cells having an internal short circuit abnormality among the plurality of battery cells $BC_1$ to $BC_N$ increases, the criterion factor greatly decreases from the target value. Accordingly, by determining at least one of the threshold values TH11, TH12, TH13 according to the above method, the accuracy of detecting an internal short circuit abnormality may be improved.

Meanwhile, after the target value is determined before the step S7740, in the step S7740, only abnormality factors less than or equal to the target value among all abnormality factors of the plurality of battery cells $BC_1$ to $BC_N$ may be used to determine the criterion factor. In this case, in determining the criterion factor, since abnormality factors exceeding the target value are excluded from all the abnormality factors of the plurality of battery cells $BC_1$ to $BC_N$, battery cells BC having a relatively serious internal short circuit abnormality may be detected preferentially from the plurality of battery cells $BC_1$ to $BC_N$.

In each embodiment, when an internal short circuit abnormality is detected in a predetermined number or more of battery cells among the plurality of battery cells $BC_1$ to $BC_N$, the external device 2000 may generate second information representing that an internal short circuit abnormality is detected.

In each embodiment, the external device 2000 may reduce an allowable range of the charging and discharging current when an internal short circuit abnormality is detected in a predetermined number or more of battery cells among the plurality of battery cells $BC_1$ to $BC_N$. For example, the upper limit (positive value) of the allowable range may decrease or the lower limit (negative value) of the allowable range may increase in proportion to the number of abnormal battery cell(s).

For example, the external device 2000 according to an embodiment of the present disclosure may be included in a diagnosing system for diagnosing abnormality of a battery cell. The diagnosing system may be operated in an electric vehicle repair shop, a battery manufacturer or a battery maintenance company. For example, the diagnosing system may be used to diagnose abnormalities of battery cells loaded in electric vehicles or energy storage systems, or may be used to diagnose abnormalities in batteries of a newly developed model produced by a battery manufacturer. In particular, in the latter case, before commercializing the battery of the newly developed model, it is possible to check the state of the battery by using the external device 2000.

As another example, the external device 2000 may be included in a control element of a system equipped with a battery.

In one example, the external device 2000 may be included in a control system of an electric vehicle. In this case, the external device 2000 may collect data on the charging capacity and discharging capacity of the battery cell in the process of charging and discharging the battery mounted in the electric vehicle, diagnose the state of the battery cell using the collected data, and output the diagnosis results to the integrated control display of the electric vehicle.

In another example, the external device 2000 may be included in the control system of the energy storage system. In this case, the external device 2000 may collect data on the charging capacity and discharging capacity of the battery cell during charging and discharging of the energy storage system, diagnose the state of the battery cell using the collected data, and output the diagnosis result through a display of an integrated management computer accessible by the operator.

The user of the electric vehicle or the operator of the energy storage system may take appropriate safety measures when a diagnosis result regarding lithium precipitation abnormality is output through the display. In one example, the user of the electric vehicle may visit a repair shop and receive an inspection. In another example, the operator of the energy storage system may replace the corresponding battery with a new battery.

In the present disclosure, the external device 2000 may optionally include a processor, an application-specific integrated circuit (ASIC), another chipset, a logic circuit, a register, a communication modem, a data processing device, etc. known in the art to execute various control logics described above. Also, when the control logic is implemented in software, the external device 2000 may be implemented as a set of program modules. In this case, the program module may be stored in a memory and executed by a processor. The memory may be provided inside or outside the processor, and may be connected to the processor by various well-known computer components. In addition, the memory may be included in the storage unit 2100 of the present disclosure. In addition, the memory refers to a device in which information is stored regardless of the type of device, and does not refer to a specific memory device.

At least one or more of the various control logics of the external device 2000 may be combined, and the combined control logics may be written in a computer-readable code scheme and recorded in a computer-readable recording medium. The type of the recording medium is not particularly limited as long as it can be accessed by the processor included in the computer. As an example, the recording medium includes at least one selected from the group consisting of ROM, RAM, registers, CD-ROM, magnetic tape, hard disk, floppy disk, and an optical data recording device. In addition, the code scheme may be distributed, stored and executed on networked computers. In addition, functional programs, codes and code segments for implementing the combined control logics may be easily deduced by programmers in the art to which the present disclosure pertains.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

EXPLANATION OF REFERENCE SIGNS

1: battery cell diagnosing system
1000: battery cell diagnosing apparatus
2000: external device
100: current measuring unit
200: voltage sensing unit
300: data obtaining unit
400: first control unit
500: display unit
600: second control unit
10: battery pack

What is claimed is:

1. A battery cell diagnosing apparatus, comprising:
a current measuring unit configured to measure a current of a battery cell;
a voltage sensing unit configured to sense a cell voltage of the battery cell; and
a first control unit configured to:
transmit first information of the battery cell including data obtained from at least one of the current measuring unit or the voltage sensing unit to an external device,
receive second information from the external device, wherein the second information includes first diagnostic information of the battery cell obtained based on the first information, and
derive second diagnostic information of the battery cell according to a diagnosis of an abnormal state of the battery cell, wherein the second diagnostic information is different from the first diagnostic information,
wherein the first control unit is configured to:
detect at least one of a voltage abnormality of the battery cell or a behavior abnormality of the battery cell based on the first information, and
diagnose an abnormal state of the battery cell based on at least one of the voltage abnormality, the behavior abnormality, or the second information.

2. The battery cell diagnosing apparatus according to claim 1,
wherein the first diagnostic information of the battery cell includes at least one information among lithium precipitation diagnosis of the battery cell, abnormality of a parallel connection of the battery cell, and an internal short circuit of the battery cell.

3. The battery cell diagnosing apparatus according to claim 1,
wherein the first control unit is configured to display, on a display unit, information about an abnormality of the battery cell indicated by the first diagnostic information of the battery cell included in the second information.

4. The battery cell diagnosing apparatus according to claim 1,
wherein the first control unit is configured to generate third information representing whether the battery cell is in the abnormal state based on at least one of the voltage abnormality, the behavior abnormality, and the second information.

5. The battery cell diagnosing apparatus according to claim 4,
wherein the first control unit is configured to display the third information on a display unit.

6. The battery cell diagnosing apparatus according to claim 4,
wherein the first control unit is configured to transmit the third information to a second control unit of a device equipped with the battery cell.

7. The battery cell diagnosing apparatus according to claim 1,
wherein the first control unit is configured to:
generate time series data representing a history of the cell voltage included in the first information over time,
determine a first average cell voltage and a second average cell voltage of each battery cell based on the time series data, the first average cell voltage being a first moving average, the second average cell voltage being a second moving average, wherein the second moving average accounts for a longer duration of the time series data than the first moving average, and
detect a voltage abnormality of the battery cell based on a difference between the first average cell voltage and the second average cell voltage.

8. The battery cell diagnosing apparatus according to claim 7,
wherein the battery cell diagnosing apparatus is configured to diagnose a plurality of battery cells, and
wherein the first control unit is configured to:
for each of the plurality of battery cells, determine a long-term and short-term average difference corresponding to the difference between the first average cell voltage and the second average cell voltage, determine an average value of the long-term and short-term average differences of the plurality of battery cells, for each of the plurality of battery cells, determine a cell diagnosis deviation corresponding to a deviation of the average value of the long-term and short-term average differences and the long-term and short-term average difference, and detect a battery cell that satisfies a condition in which the cell diagnosis deviation exceeds a diagnosis threshold as a voltage abnormal cell.

9. The battery cell diagnosing apparatus according to claim 7,
wherein the battery cell diagnosing apparatus is configured to diagnose a plurality of battery cells, and
wherein the first control unit is configured to:
for each of the plurality of battery cells, determine a long-term and short-term average difference corresponding to the difference between the first average cell voltage and the second average cell voltage,
determine an average value of the long-term and short-term average differences of the plurality of battery cells,
for each of the plurality of battery cells, determine a cell diagnosis deviation corresponding to a deviation of the average value of the long-term and short-term average differences and the long-term and short-term average difference,
determine a statistically variable threshold that depends on a standard deviation of the cell diagnosis deviations of the plurality of battery cells,
filter the time series data based on the statistically variable threshold to generate filtered time series data; and
detect a voltage abnormality of the battery cell based on the time or number of data of the filtered time series data exceeding a diagnosis threshold.

10. The battery cell diagnosing apparatus according to claim 7,
wherein the battery cell diagnosing apparatus is configured to diagnose a plurality of battery cells, and
wherein the first control unit is configured to:
for each of the plurality of battery cells, determine a long-term and short-term average difference corresponding to the difference between the first average cell voltage and the second average cell voltage,
determine a normalization value corresponding to an average value of the long-term and short-term average differences of the plurality of battery cells,
for each of the plurality of battery cells, normalize the long-term and short-term average difference according to the normalization value,
determine a statistically variable threshold that depends on a standard deviation of the normalized cell diagnosis deviations of the plurality of battery cells,
for each of the plurality of battery cells, filter the normalized long-term and short-term average difference of each battery cell based on the statistically variable threshold to generate filtered time series data; and
detect a voltage abnormality of the battery cell based on the time or number of data of the filtered time series data exceeding a diagnosis threshold.

11. The battery cell diagnosing apparatus according to claim 1,
wherein the first control unit is configured to:
determine a plurality of sub voltage curves by applying a moving window of a first time length to a time series of the cell voltage included in the first information,
determine a long-term average voltage value of each sub voltage curve using a first average filter of the first time length,
determine a short-term average voltage value of each sub voltage curve using a second average filter of a second time length shorter than the first time length,
determine a voltage deviation corresponding to a difference between the long-term average voltage value and the short-term average voltage value of each sub voltage curve, and
compare each of the plurality of voltage deviations determined for the plurality of sub voltage curves with at least one of a first threshold deviation and a second threshold deviation in order to detect the behavior abnormality of the battery cell.

12. The battery cell diagnosing apparatus according to claim 11,
wherein the first control unit is configured to detect the behavior abnormality corresponding to two voltage deviations that respectively satisfy a first condition, a second condition and a third condition among the plurality of voltage deviations,
wherein the first condition is satisfied when a first voltage deviation of the two voltage deviations is equal to or greater than the first threshold deviation,
wherein the second condition is satisfied when a second voltage deviation of the two voltage deviations is equal to or less than the second threshold deviation, and
wherein the third condition is satisfied when a time interval between the two voltage deviations is equal to or less than a threshold time.

13. The battery cell diagnosing apparatus according to claim 1,
wherein the second information represents whether an accumulated capacity difference change amount is greater than or equal to a threshold value,
the accumulated capacity difference change amount is the sum of capacity difference change amounts,
each of the capacity difference change amounts is a difference between a capacity difference of a $k^{th}$ charging and discharging cycle of the battery cell and a capacity difference of a k−1th charging and discharging cycle of the battery cell,
the k is a natural number greater than or equal to 2,
the capacity difference of each charging and discharging cycle corresponds to a difference between a charging capacity of the battery cell during a charging process of the charging and discharging cycle and a discharging capacity of the battery cell during a discharging process of the charging and discharging cycle, and
each of the charging capacity and the discharging capacity is derivable from data obtained from the current measuring unit and included in the first information.

14. The battery cell diagnosing apparatus according to claim 1,
wherein the second information represents a capacity difference change amount between successive charging and discharging cycles of the battery cell, and
a capacity difference for each charging and discharging cycle of the battery cell is a difference between (i) a charging capacity of the battery cell during a charging process of the charging and discharging cycle of the battery cell and (ii) a discharging capacity of the battery cell during a discharging process of the charging and discharging cycle of the battery cell.

15. The battery cell diagnosing apparatus according to claim 1,
wherein the second information represents whether a parallel connection of a plurality of unit cells included in the battery cell is abnormal based on a result of monitoring a change over time of an estimated capacity value by the external device,
the estimated capacity value represents a full charging capacity of the battery cell based on charging and discharging data, and
the charging and discharging data includes a voltage time series representing a change over time of the voltage of the battery cell and a current time series representing a change over time of the charging and discharging current of the battery cell.

16. The battery cell diagnosing apparatus according to claim 1,
wherein the second information represents whether the battery cell has an internal short circuit based on a first SOC change and a criterion factor of the battery cell,
the criterion factor is determined by applying a statistical algorithm to the first SOC change of at least two battery cells among a plurality of battery cells,
the first SOC change is a difference between a first SOC at a first charging time point of each battery cell and a second SOC at a second charging time point,
the first SOC is estimated by applying a SOC estimation algorithm to a state parameter of the battery cell at the first charging time point,
the second SOC is estimated by applying the SOC estimation algorithm to the state parameter of the battery cell at the second charging time point, and
the state parameter is obtained based on the first information.

17. A battery cell diagnosing system, comprising the battery cell diagnosing apparatus according to claim 1, and the external device,
wherein the external device is configured to derive the second information based on at least a part of the first information.

18. A battery cell diagnosing method, comprising:
by a control unit, obtaining data including at least one of a current of a battery cell, or a cell voltage of the battery cell;
by the control unit, transmitting first information of the battery cell including the obtained data to an external device;
by the control unit, receiving second information from the external device, wherein the second information includes first diagnostic information of the battery cell obtained based on the first information and
by the control unit, deriving second diagnostic information of the battery cell according to a diagnosis of an abnormal state of the battery cell, wherein the second diagnostic information is different from the first diagnostic information,
by the control unit, detecting at least one of a voltage abnormality of the battery cell or a behavior abnormality of the battery cell based on the first information,
by the control unit, detecting at least one of a voltage abnormality of the battery cell or a behavior abnormality of the battery cell based on the first information, and
by the control unit, diagnosing an abnormal state of the battery cell based on at least one of the voltage abnormality, the behavior abnormality, or the second information.

19. A battery cell diagnosing apparatus, comprising:
a current measuring unit configured to measure a current of a battery cell;
a voltage sensing unit configured to sense a cell voltage of the battery cell; and
a first control unit configured to:
transmit first information of the battery cell including data obtained from at least one of the current measuring unit or the voltage sensing unit to an external device,
receive second information from the external device, wherein the second information includes first diagnostic information of the battery cell obtained based on the first information,
derive second diagnostic information of the battery cell based on the first information, wherein the second diagnostic information is different from the first diagnostic information, and
wherein the first control unit is configured to:
detect at least one of a voltage abnormality of the battery cell or a behavior abnormality of the battery cell based on the first information, and
diagnose an abnormal state of the battery cell based on the second information and at least one of the voltage abnormality or the behavior abnormality.

* * * * *